United States Patent [19]
Hidaka

[11] Patent Number: 5,610,871
[45] Date of Patent: Mar. 11, 1997

[54] SEMICONDUCTOR MEMORY DEVICE HAVING A HIERARCHICAL BIT LINE STRUCTURE WITH REDUCED INTERFERENCE NOISE

[75] Inventor: Hideto Hidaka, Hyogo, Japan

[73] Assignee: Mitsubishi Denki Kabushiki Kaisha, Tokyo, Japan

[21] Appl. No.: 341,145

[22] Filed: Nov. 16, 1994

[30] Foreign Application Priority Data

Nov. 30, 1993 [JP] Japan ................................. 5-299967
Jun. 21, 1994 [JP] Japan ................................. 6-138932

[51] Int. Cl.$^6$ ................................................... G11C 8/00
[52] U.S. Cl. ........................ 365/230.03; 365/189.01; 365/202; 365/203; 365/207; 365/230.05
[58] Field of Search ........................... 365/189.01, 202, 365/203, 207, 230.03, 230.05

[56] References Cited

U.S. PATENT DOCUMENTS

| | | | |
|---|---|---|---|
| 4,658,377 | 4/1987 | McElroy . | |
| 4,819,207 | 4/1989 | Sakui et al. | 365/222 |
| 4,943,944 | 7/1990 | Sakui et al. | 365/189.05 |
| 5,245,570 | 9/1993 | Fazio et al. | 365/230.03 |
| 5,367,488 | 11/1994 | An | 365/230.03 |

OTHER PUBLICATIONS

"Experimental 4–Mbit Peripheral CMOS Dynamic RAM Using a Trench–Type Transistor Cell", Shichijo et al., Nikkei Electronics, Jul. 14, 1986, pp. 189–208.
"Bidirectional Matched Global IT Line Scheme for High Density DRAMs", J. H. Ahn et al, 1993 Symposium on VLSI CIrcuit, Digest of Technical Papers, May 1993, pp. 91–92.

Primary Examiner—David C. Nelms
Assistant Examiner—F. Niranjan
Attorney, Agent, or Firm—Lowe, Price, LeBlanc & Becker

[57] ABSTRACT

Bit lines includes sub-bit lines arranged corresponding to respective memory cell column groups, and also includes main bit lines MBLa and MBLb. When selecting a word line, a separation transistor is turned off, so that the main bit line is divided into two divided main bit lines, and a memory group including the selected word line and a memory cell block which is disposed at a symmetrical position with respect to the separation transistor are selected. After the separation transistor is turned off, sense amplifiers perform sensing operation. Influence against the sensing operation, which may be caused by noises due to a bit line capacitance, is prevented, and the hierarchical bit lines are accurately equalized and precharged.

32 Claims, 61 Drawing Sheets

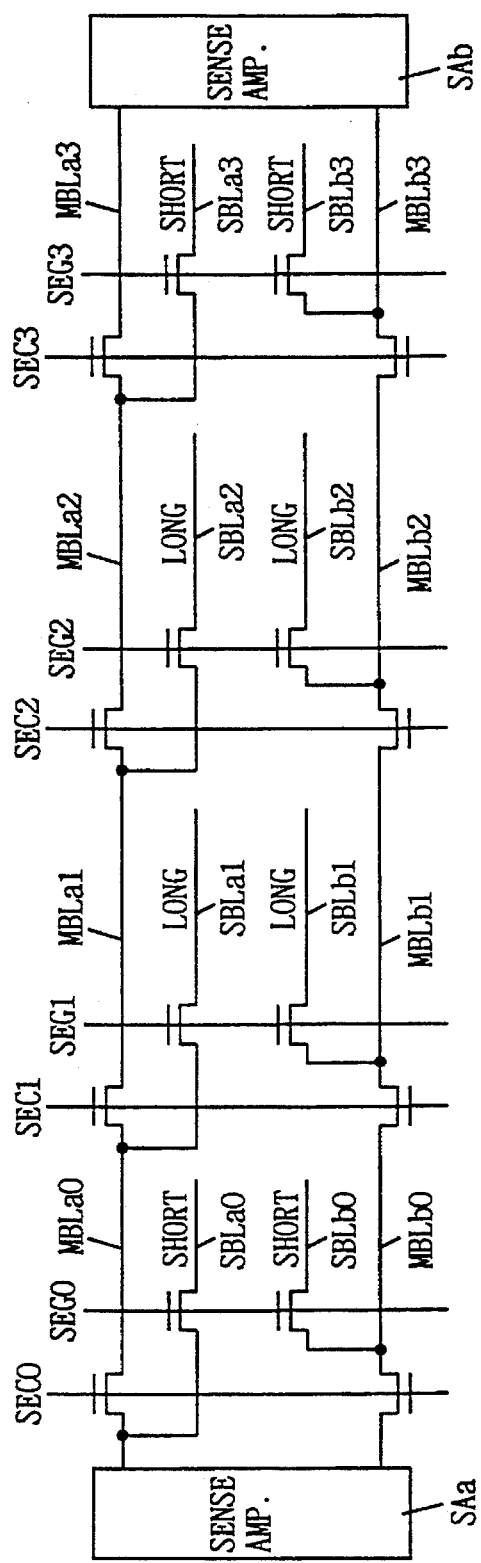
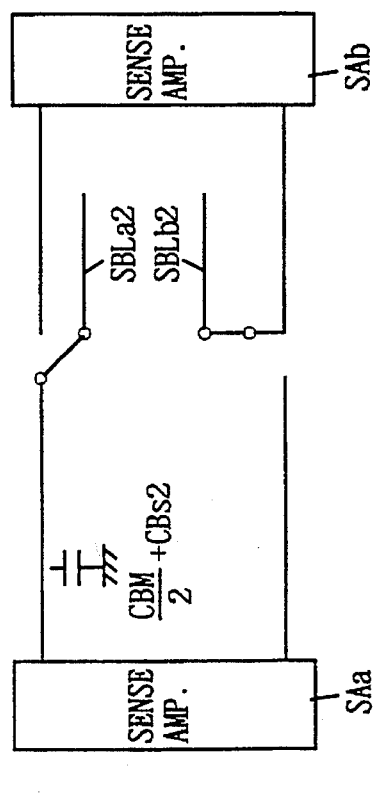
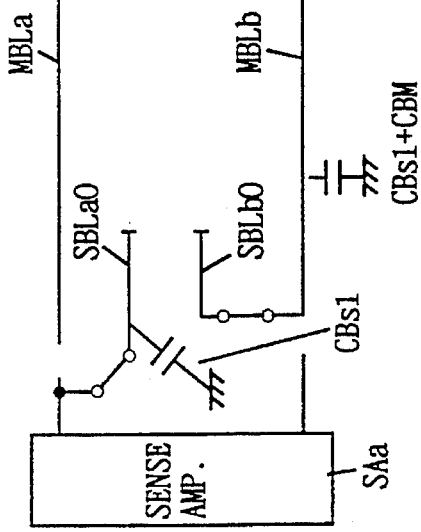

F I G. 39
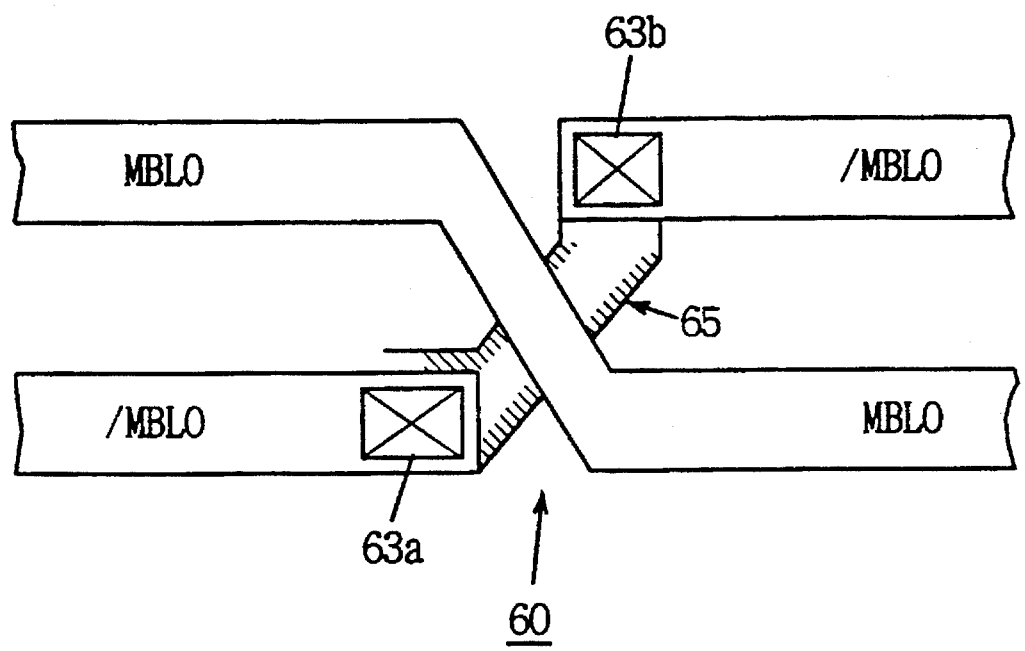

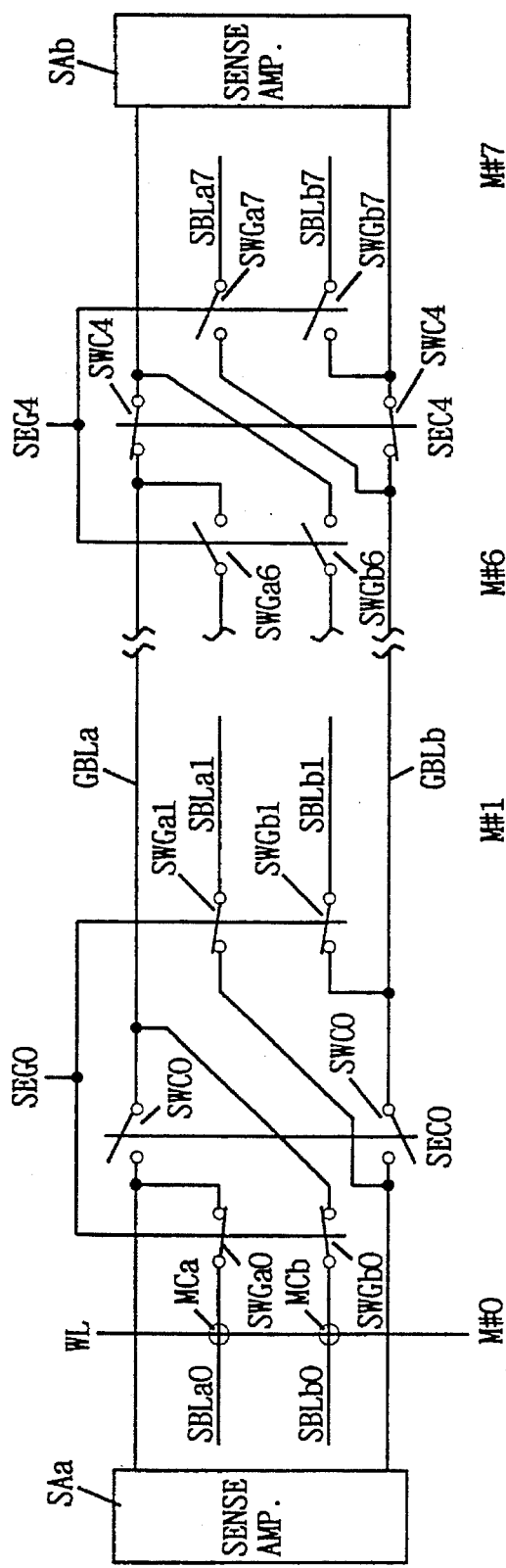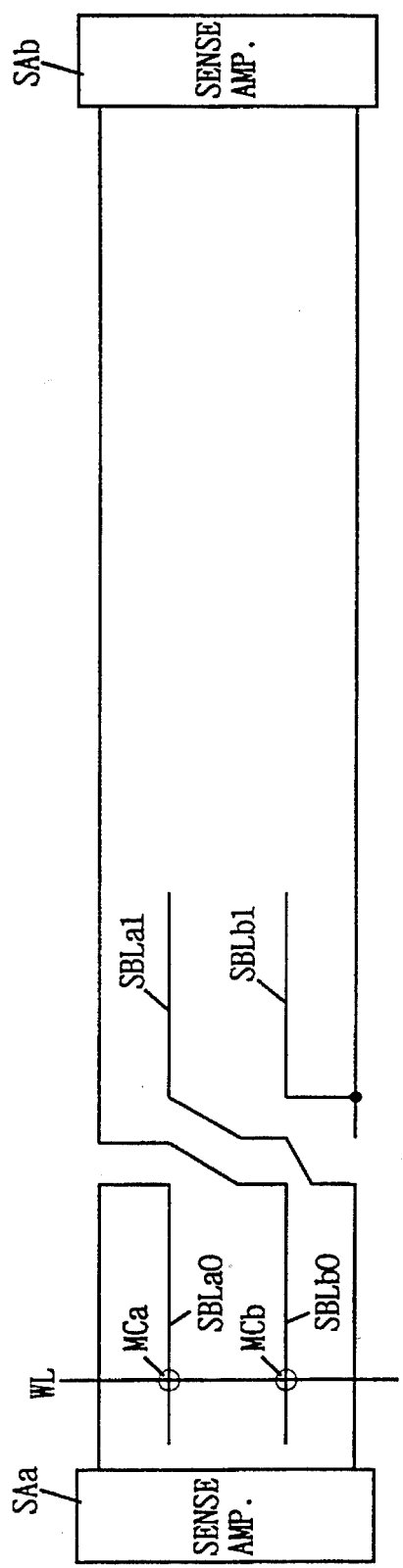
FIG. 69A PRIOR ART
FIG. 69B PRIOR ART

SEMICONDUCTOR MEMORY DEVICE HAVING A HIERARCHICAL BIT LINE STRUCTURE WITH REDUCED INTERFERENCE NOISE

BACKGROUND OF THE INVENTION

1. Field of the Invention

The present invention relates to a semiconductor memory device, and particularly to a semiconductor memory device having a hierarchical bit line structure in which a bit line is formed of a plurality of interconnection layers including sub-bit lines and a main bit line.

2. Description of the Background Art

FIG. 61 shows arrangement of a memory cell array in a semiconductor memory device having a hierarchical bit line structure in the prior art. The structure of the semiconductor memory device shown in FIG. 61 is disclosed, for example, in "Experimental 4-Mbit Peripheral CMOS Dynamic RAM Using a Trench-Type Transistor Cell", Shichijo et al., Nikkei Electronics, Jul. 14, 1986.

Referring to FIG. 61, a memory cell array is divided into eight memory blocks M0–M7. X-decoders RD0–RD3 are disposed at a central area of the memory cell array. Each of X-decoders RD0–RD3 is commonly used by two memory blocks at laterally opposite sides of the same in the figure. For example, X-decoder RD0 is commonly used by memory blocks M0 and M4.

Sense amplifiers and Y-decoder blocks SY0–SY9 are disposed corresponding to memory blocks M0–M7. Y-decoders together with corresponding sense amplifiers (SA) in the blocks SY0, SY4, SY5 and SY9 are used by memory blocks M0, M3, M4 and M7, respectively. Each of the other Y-decoders/sense amplifiers (SA) blocks SY1–SY3 and SY6–SY8 are used by the memory blocks located at its opposite sides.

In operation, X-decoders RD0 and RD2 of even numbers or X-decoders RD1 and RD3 of odd numbers are activated. The activated X-decoders each select one word line in the corresponding two memory blocks. By setting the alternate memory blocks to the selected state, sensing operation can be performed by the sense amplifiers disposed at opposite sides of the selected memory blocks. After data of the selected memory cells are sensed by the sense amplifiers, one sense amplifier (SA) and Y-decoder block is activated, and a selected column is connected to an internal data line (I/O line), so that the data is written into or read from the selected memory cell.

FIG. 62 shows a specific structure of one memory block in the semiconductor memory device shown in FIG. 61. FIG. 62 shows two columns of memory cells and components related thereto.

In FIG. 62, each column of memory cells MC is divided into a plurality of (eight in FIG. 62) memory cell blocks B#0–B#7. In each column of the memory cells, memory cell blocks B#0–B#7 are provided with sub-bit lines SBLa0–SBLa7 and SBLb0–SBLb7, respectively. Word lines WL cross the sub-bit lines. In FIG. 62, 64 word lines WL0–WL63 are disposed in each of memory cell blocks B#0–B#7. Memory cells MC are disposed corresponding to the crossings of word lines and sub-bit lines. When a word line WL (WL generally represents WL0–WL63) is selected, memory cell MCa connected to sub-bit line SBLa (SBLa generally represents SBLa0–SBLa7) and memory cell MCb connected to sub-bit line SBLb (SBLb generally represents SBLb0–SBLb7) are brought simultaneously to the selected state. This arrangement of memory cells is similar to so-called "open bit line arrangement".

A main bit line MBLa or MBLb is disposed corresponding to each column of memory cells. Section select switches SWC0a–SWC7a and SWC0b–SWC7b, which correspond to memory cell blocks B#0–B#7, respectively, are provided on main bit lines MBLa and MBLb. Section select switches SWC0a and SWC0b–SWC7a and SWC7b are turned off in response to section select signals SEC0–SEC7, respectively. Segment select switches SWG0a and SWG0b–SWG7a and SWG7b, which are turned on in response to segment select signals SEG0–SEG7, respectively, each are provided at one end of a corresponding pair of sub-bit lines SBLa0 and SBLb0–SBL7a and SBL7b. When turned on, segment select switch SWGia (i=0–7) connects the corresponding sub-bit line SBLai to main bit line MBLa at one side of corresponding section select switch SWCia. When turned on, segment select switch SWGib connects the corresponding sub-bit line SBLbi to main bit line MBLb at the other side of corresponding section select switch SWCib.

Sense amplifiers SAa and SAb are disposed at opposite sides of main bit lines MBLa and MBLb. A dummy memory cell DMCa is provided at main bit line MBLa, and a dummy memory cell DMCb is provided at main bit line MBLb. Dummy memory cells DMCa and DMCb transfer their stored electric charges onto the corresponding main bit lines when dummy word lines DWL1 and DWL0 are selected, respectively. A quantity of electric charges stored in each of dummy memory cells DMCa and DMCb is equal to ½ of the sum of the quantity of stored charges of memory cell MC storing high-level data and the quantity of stored charges of memory cell MC storing low-level data. Operation of the structure shown in FIG. 62 will now be described below with reference to FIG. 63 which is an operation waveform diagram thereof.

In the standby state, segment select signals SEG0–SEG7 are inactive and hence low. Sub-bit lines SBLa0 and SBLb0–SBLa7 and SBLb7 are isolated or separated from main bit lines MBLa and MBLb. Section select signals SEC are high, and all of section select switches SWC0a and SWC0b–SWC7a and SWC7b are turned on. Main bit lines MBLa and MBLb are precharged to an intermediate potential such as Vcc/2.

Upon start of a memory cycle, an X-address signal (row address signal) is first applied. In accordance with the applied X-address, the memory cell block (selected memory cell block) to which the word line to be selected belongs is determined. Segment select signal SEG corresponding to the selected memory cell block rises to the high level, so that segment select switch SWG of the selected memory cell block is turned on.

After the segment select signal SEG rises to the high level and the sub-bit lines in the selected memory cell block are connected to main bit lines MBLa and MBLb, section select signal SEC falls to the low level. Thereby, main bit lines MBLa and MBLb each are divided into two portions. Segment select switches SWGia and SWGib are connected to one side of section select switch SWCia and the opposite side of section select switch SWCib, respectively. Therefore, sub-bit line SBLa is connected to sense amplifier SAa, and sub-bit line SBLb is connected to sense amplifier SAb. After the rising of segment select signal SEG to the high level, section select signal SEC is lowered to the low level so as to maintain symmetricity of parasitic capacitances related to sense amplifiers SAa and SAb. The section select signals provided corresponding to the nonselected memory cell blocks maintain the on-state because the section select signals SEC are high. For simplicity reasons, it is assumed in the following description that memory cell block B#0 is selected.

Section select signals SEC1–SEC7 corresponding to nonselected memory cell blocks B#1–B#7 are raised above the power supply voltage level. The reason for this boosting is to transmit signals on main bit lines MBLa and MBLb at a high speed.

Then, the word line is selected in accordance with the X-address signal, and the potential of the selected word line (e.g., WL0) rises to the high level. Data stored in memory cell MCa is transmitted onto sub-bit line SBLa0, and is transmitted via segment select switch SWG0$a$ and main bit line MBLa to sense amplifier SAa. Likewise, data stored in the memory cell MCb connected to sub-bit line SBLb0 is transmitted via segment select switch SWG0$b$ and main bit line MBLb to sense amplifier SAb. Also, dummy word lines DWL0 and DWL1 are simultaneously selected to have their potentials go to the high level. Then, sense amplifiers SAa and SAb are activated to perform the sensing operation, so that the potentials of main bit lines MBLa and MBLb change in accordance with the data stored in selected memory cells MCa and MCb. Thereafter, writing or reading of data is performed.

Then, the potential of segment select signal SEG0 corresponding to selected memory cell block B#0 is raised, and the potential of selected word line WL0 is raised. Thereby, data is rewritten or restored in memory cells MCa and MCb. After the restoring, the potential of the selected word line WL0 falls to the low level, and then, segment select signal SEG corresponding to the selected memory cell block B#0 is set to the power supply voltage level. The section select signals SEC1–SEC7 corresponding to the nonselected memory cell blocks maintain the raised level. In this state, sense amplifiers SAa and SAb are deactivated, main bit lines MBLa and MBLb are equalized, and selected sub-bit lines SBLa and SBLb are precharged to the intermediate potential.

Thereafter, all section select signals SEC0–SEC7 are maintained at the high level, i.e., power supply voltage Vcc level, and section select switches SWC0$a$ and SWC0$b$–SWC7$a$ and SWC7$b$ are turned on. Main bit lines MBLa and MBLb are recovered from the divided state and are equalized to attain the intermediate potential. Thereafter, segment select signal SEG0 which has been selected is lowered to the low level, and segment select switches SWG0$a$ and SWG0$b$ are turned off, so that sub-bit lines SBLa0 and SBLb0 are isolated from main bit lines MBLa and MBLb.

As described above, the arrangement of memory cells with respect to the sub-bit lines is "open bit line arrangement", and the arrangement of memory cells with respect to the main bit lines is "folded bit line arrangement", whereby high density and high integration of memory cells as well as stable sensing operation are achieved.

FIG. 64 specifically shows a structure of the sense amplifier portion shown in FIG. 62. In FIG. 64, the main bit line is divided into two portions, and the divided main bit lines have different lengths depending on the position of the selected memory cell. Also, the sub-bit lines are connected to the main bit lines for transmitting data of the selected memory cell. For the above reasons, they are represented merely as bit lines BL and /BL.

In FIG. 64, sense amplifier SA includes n-channel MOS transistors Q7 and Q9 having gates and drains cross-coupled, and p-channel MOS transistors Q8 and Q10 having gates and drains cross-coupled. p-channel MOS transistors Q12 and Q13 which are in parallel to each other are interposed between power supply node Vcc and transistors Q8 and Q10. Transistors Q12 and Q13 are turned on in response to sense amplifier activation signals $\phi$p1 and $\phi$p2, respectively. The current driving ability of transistor Q12 is smaller than that of transistor Q13. n-channel MOS transistors Q14 and Q15 which are in parallel to each other are interposed between the ground potential node GND and transistors Q7 and Q9. Transistors Q14 and Q15 are turned on in response to sense amplifier activation signals $\phi$n1 and $\phi$n2, respectively. The current driving ability of transistor Q14 is larger than that of transistor Q15.

Bit lines BL and /BL are provided with an n-channel MOS transistor Q11 which is turned on in response to an equalizing signal E for equalizing potentials of bit lines BL and /BL, and are also provided with n-channel MOS transistors Q1 and Q2 which are turned on in response to equalizing signal E for transmitting a predetermined potential Vb1 (e.g., equal to Vcc/2) to bit lines BL and BL, respectively.

Between bit lines BL and /BL and sense nodes SNa and SNb of sense amplifier SA, there are disposed n-channel MOS transistors Q4 and Q3 which are turned off in response to a bit line transmission signal T for separating or isolating bit lines BL and /BL from sense nodes SNa and SNb, respectively. Between sense nodes SNa and SNb and internal data lines DB and /DB, there are disposed n-channel MOS transistors Q6 and Q5, respectively, which are turned on in response to a column select signal Y sent from the Y-decoder. The operation of the sense amplifier portion shown in FIG. 64 will be described below with reference to FIG. 65 showing its operation waveforms.

In the standby state, equalizing signal E is high, transistors Q1, Q2 and Q11 are on, and bit lines BL and BL are precharged and equalized to the intermediate potential Vb1. Bit line transmission signal T is high, transistors Q3 and Q4 are on, and thus sense nodes SNa and SNb have been precharged to intermediate potential Vb1.

Upon start of the memory cycle, equalizing signal E attains the low level, and transistors Q1, Q2 and Q11 are turned off. In this state, selection of the section, selection of the segment and selection of the word line are sequentially performed. When data of the memory cell connected to the selected word line is transmitted onto bit lines BL and /BL, sense amplifier activation signal $\phi$n1 first rises to the high level, so that transistor Q14 is turned on. The potentials of sense nodes SNa and SNb are differentially amplified. The potential of one of sense nodes SNa and SNb, which is lower than that of the other, further falls. After sense amplifier activation signal $\phi$n1 rises to the high level and the differential amplification is performed, bit line transmission signal T falls to the low level, and transistors Q3 and Q4 are turned off, so that bit lines BL and /BL are isolated from sense amplifier SA. A capacitance load to be driven by sense amplifier SA decreases, and the speed of sensing operation increases.

Then, sense amplifier activation signals $\phi$n2 and $\phi$p1 attain the high level and low level, respectively, and transistors Q12 and Q15 are turned on, so that charging/discharging of sense nodes SNa and SNb is performed and the potentials of sense nodes SNa and SNb are latched. Then, column select signal Y rises to the high level, and transistors Q5 and Q6 are turned on, so that signals of sense nodes SNa and SNb are transmitted to internal data lines DB and /DB, respectively.

After data is written or read, sense amplifier activation signal φp2 attains the low level, and transistor Q13 is turned on. Transistor Q13 has a current supplying ability larger than that of transistor Q12. Sense amplifier activation signal φp2 is set to the low level or active state during restoring. Thereby, a signal at the power supply potential Vcc level is reliably written into the selected memory cell. In the restoring operation, bit line transmission signal T has already risen to the high level, and the transistors Q3 and Q4 are on. Thereafter, sense amplifier activation signals φp1, φp2, φn1 and φn2 are deactivated, and then transistors Q1, Q2 and Q11 are turned on, so that equalizing/precharging of bit lines BL and /BL is performed. Then as already described, all section select signals SEC are set to the high level, and then all segment select signals SEG are set to the low level.

In the operation of sense amplifier SA, bit lines BL and /BL are isolated from sense amplifier SA, whereby the speed of sensing operation of sense amplifier SA increases due to decreased load capacitance.

In the hierarchical bit line structure described above, the stray capacitance (capacitance to ground) per unit length of sub-bit line directly connected to the memory cells is larger than the stray capacitance (capacitance to ground) per unit length of the main bit line, and a ratio therebetween is usually in a range from 5:1 to 10:1. The sub-bit line directly connected to the memory cells is connected to a diffusion layer of a memory cell transistor at a contact to the memory cell transistor. Therefore, the sub-bit line has a large parasitic capacitance because a junction capacitance between the diffusion layer and a substrate is large. Meanwhile, the main bit line is connected only to the sub-bit line, and is not directly connected to the memory cells, so that the main bit line has a small parasitic capacitance. In the hierarchical bit line structure, therefore, the entire length of the bit lines can be increased without increasing the parasitic capacitance per bit line. The sense amplifiers are provided only for the main bit lines, and it is not necessary to provide the sense amplifiers for the respective sub-bit lines, so that it is possible to reduce an area occupied by the bit line peripheral circuits such as sense amplifiers and precharge circuits, and thus the chip size can be reduced.

The hierarchical bit line structure described above also has such an advantage that a soft error rate can be reduced. The number of memory cells directly connected to one sub-bit line is small, and, e.g., 64 cells per sub-bit line. The sub-bit line is connected to the diffusion layers of the memory cell transistors at the contact to the memory cell transistors. If the diffusion layer collects carriers generated in the substrate due to incidence of α-rays, soft error in the bit line mode will be generated. In such collection of carriers is not generated in the main bit line, because the main bit line is not connected directly to a memory cell. In the hierarchical bit line structure, if a memory cell column is divided into four sub-bit lines, the number of memory cells which are directly connected to one bit line (formed of main bit line and sub-bit line) upon selection of the memory cell block is 64 and thus ¼ of that in the nonhierarchical structure in which 256 memory cells are connected to one bit line. In the hierarchical bit line structure, therefore, the memory cells directly connected to one bit line can be small in number, so that the quantity of collected carriers is reduced and the possible soft error generating region is restricted in the memory cell block, resulting in reduction of the soft error rate.

In the operation of selecting the memory cell, a potential change ΔV appearing on the hierarchical bit line including both the main bit line and the sub-bit line can be expressed by the following formula:

$$\Delta V = (Vcc/2)(1/(1+Cb/Cs)) \quad (1)$$

$$\sim (Vcc/2)(Cs/Cb) \quad (1')$$

where Vcc represents the power supply level, Cb represents the stray capacitance of the hierarchical bit line, and Cs represents the capacitance of the capacitor in a memory cell.

The sense amplifier senses and amplifiers the potential change ΔV. This amplifying operation of the sense amplifier is equivalent to charging/discharging of the parasitic capacitances at the sense nodes of the sense amplifier, and is performed by charging one of the sense nodes and discharging the other sense node. In this operation, if the parasitic capacitances of sense nodes are not balanced, the charging and discharging of sense nodes are performed at different speeds, so that the accurate sensing operation cannot be performed.

During the sensing operation in the conventional hierarchical bit line structure shown in FIG. 64, bit line transmission signal T is low, and bit lines BL and /BL are isolated from sense amplifier SA. Also in this case, however, bit line transmission signal T is lowered to the low level after sense amplifier activation signal φn1 becomes high and transistor Q14 is turned on in sense amplifier SA to reduce the potential of one of sense nodes SNa and SNb, increasing the potential difference between sense nodes SNa and SNb. Therefore, if the load capacitances of sense nodes SNa and SNb are not balanced at this first stage in the sensing operation of the sense amplifier SA, accurate increase of the potential difference may be difficult, or a long time is required for increasing the potential difference, so that the sensing operation cannot be performed at a high speed.

The prior art employ a structure shown in FIG. 66 for overcoming the problem related to imbalance of the bit line capacitances to the sense amplifier.

FIG. 66 shows a connection mode of bit lines in the sensing operation of the prior art shown in FIGS. 61 to 64. In FIG. 66, a memory array block Mb is selected, and memory array blocks Ma and Mc are nonselected. In memory array block Mb, a sub-bit line SBLab is connected to a sense amplifier SAL, and a sub-bit line SBLbb is connected to a sense amplifier SAR.

In nonselected memory array blocks Mb and Mc, the operation selecting a memory cell block is similarly performed, so that sub-bit line SBLa is connected to sense amplifier SAL, and a divided main bit line MBLaa is similarly connected to sense amplifier SAL. A sub-bit line is not connected to divided main bit line MBLaa. A main bit line MBLac and a sub-bit line SBLac are connected to sense amplifier SAR, and a divided main bit line MBLbc is also connected thereto. In this manner, one segment in the nonselected memory array block is selected to equalize the bit line capacitances for sense amplifiers SAL and SAR.

In the above structure, however, it is necessary to turn on/off the segment switches and section switches also in the nonselected memory blocks, resulting in increase of the power consumption.

According to the structure utilizing the nonselected memory array blocks, as can be seen from the array arrangement in FIG. 61 it is impossible to maintain the balance between the bit line capacitances with respect to sense amplifiers SA contained in blocks SY0 and SY5 or blocks SY4 and SY9 when memory array blocks at the opposite ends, i.e., blocks M0 and M4 or blocks M3 and M7 are selected. In order to equalize the bit line capacitances in connection with all the sense amplifiers, a "dummy array"

must be provided, which unnecessarily increases an area of the memory array.

In the structure shown in FIG. 66, since sub-bit lines of different memory array blocks are connected to the same sense amplifier, the feature of the "folded bit line arrangement", i.e., cancellation of noises of the same phase cannot be achieved, so that it is impossible to perform the accurate sensing operation.

If the bit line capacitances are not balanced, it is impossible to precharge accurately the hierarchical bit lines to the intermediate potential of Vcc/2, even if a equalizing/precharging transistor is provided, as described below.

As shown in FIG. 67, it is assumed that bit lines BL and /BL have parasitic capacitances of CBa and CBb, respectively. It is also assumed that bit line BL is charged to power supply potential Vcc, and bit line /BL is discharged to the ground potential level by the sensing operation. When equalizing signal E attains the high level, bit lines BL and /BL are electrically short-circuited. In this case, an equalized potential Vp of bit lines BL and /BL is expressed by the following formula:

$$Vp=Vcc.CBa/(CBa+CBb)$$

In the case of CBa<CBb, precharge potential Vp is lower than intermediate potential of Vcc/2. Precharging to the intermediate potential of Vb1 (=Vcc/2) can be performed by precharge transistors Q1 and Q2 shown in FIG. 64. However, it is necessary to supply a current from an intermediate potential generating circuit, resulting in increase of the power consumption. To the contrary, in the case of CBa>CBb, precharge potential Vp is higher than intermediate potential of Vcc/2. In this case, turn-on of precharge transistors Q1 and Q2 merely stops supply of electric charges to bit lines BL and /BL, and hierarchical bit lines BL and /BL maintain precharge potential Vp higher than the intermediate potential. Therefore, an accurate reference voltage cannot be generated in the next operation of reading data from the memory cell, and data of the memory cell cannot be accurately sensed and amplified.

If the Y-decoder block is provided for each memory array block, as is done in the array arrangement shown in FIG. 61, the number of Y-decoder blocks and thus the area occupied by the array increase as the storage capacity and hence the number of array blocks increase.

FIG. 68 shows another structure of the conventional semiconductor memory device. The structure of the semiconductor memory device shown in FIG. 68 is disclosed, for example, in "Bidirectional Matched Global Bit Line Scheme for High Density DRAMs", J. H. Ahn et al., 1993 Symposium on VLSI Circuit, Digest of Technical Papers, May 1993, pp. 91–92.

In FIG. 68, a memory array is divided into eight memory array blocks M#0–M#7. There are provided global bit lines which are common to memory array blocks M#0–M#7, and local bit lines are provided in each memory array block. Sense amplifier groups SAGU and SAGB are disposed at opposite sides of the memory array and are adjacent to outer sides of memory array blocks M#0 and M#7, respectively. There are also disposed Y-decoders YDU and YDB adjacent to sense amplifier groups SAGU and SAGB.

There are provided switch circuits (SW#0–SW#3), each of which is disposed between two memory array blocks forming one unit. Each of switch circuits SW#0–SW#3 includes separation switches provided at the global bit lines and switching elements for connecting the global bit lines to the local bit lines included in the corresponding memory array block, as will be described later.

FIG. 69A schematically shows a structure of a pair of global bit lines in the device shown in FIG. 68. Global bit lines GBLa and GBLb are provided with section select switches SWC0–SWC4 which are turned off in response to section select signals SEC (SEC0–SEC4), respectively. Sub-bit lines SBLa (SBLa0–SBLa7) and SBLb (SBLb0–SBLb7) are provided with segment select switches SWGa (SWGa0–SWGa7) and SWGb (SWGb0–SWGb7), respectively, which are turned on in response to segment select signals SEG (SEG0–SEG4). Segment select switches SWGa and SWGb are adapted to connect the paired sub-bit lines SBLa and SBLb to portions of the corresponding global bit line GBLa or GBLb located at opposite sides of the corresponding section select switch SEC.

For example, in memory array block M#0, sub-bit line SBLa0 is connected to one terminal of section select switch SWC0 via segment select switch SWGa0, and sub-bit line SBLb0 is connected to the other terminal of section select switch SWC0 via segment select switch SWGb0. According to this structure, when a memory array block M#0, or M#2, . . . at an even position is selected, data of the selected memory cell is transmitted to global bit line GBLa. When a memory array block M#1, or M#3, . . . at an odd position is selected, data of the selected memory cell is transmitted to global bit line GBLb. Now, the operation will be described briefly.

It is assumed that word line WL included in memory array block M#0 is selected. In this case, section select signal SEC0 attains the low level, and section select switch SWC0 is turned off. Other section select signals SEC1–SEC4 maintain the high level, and section select switches SWC1–SWC4 are on.

Then, segment select signal SEG0 attains the high level, and segment select switches SWGa and SWGb are turned on. In memory array block M#1, segment select switches SWGa1 and SWGb1 are turned on at this time.

Sub-bit line SBLa0 is connected to sense amplifier SAa, and sub-bit line SBLb0 is connected to sense amplifier SAb. Sub-bit line SBLa1 is connected to sense amplifier SAa, and sub-bit line SBLb1 is connected to sense amplifier SAb.

FIG. 69B is an electrically equivalent circuit diagram showing a connection mode of the sub-bit lines and sense amplifiers. As shown in FIG. 69B, sub-bit line SBLa1 functions as a reference bit line with respect to sub-bit line SBLa0, and sub-bit line SBLb1 functions as a reference bit line with respect to sub-bit line SBLb0. Sense amplifier SAa senses and amplifies data of memory cell MCa transmitted to sub-bit line SBLa0, and sense amplifier SAb senses and amplifies data of memory cell MCb transmitted to selected sub-bit line SBLb0. In the structure shown in FIGS. 69A and 69B, the bit line capacitances are balanced as for sense amplifiers SAa and SAb. Similarly to the prior art already described, this structure presents such a problem that the lengths of hierarchical bit lines and thus the load capacitances of sense amplifiers change depending on the position of the selected word line. The change of bit line capacitances will now be described briefly.

FIGS. 70A and 70B schematically show connection modes of the sense amplifiers and sub-bit lines. When word line WL is selected as shown in FIG. 70A, sub-bit line SBLa is connected to sense amplifier SAa, and sub-bit line SBLb is connected to sense amplifier SAb. In this state, the bit line capacitance CB1 is obtained with respect to the sense node of sense amplifier SAa, and the bit line capacitance CB2 is obtained with respect to the sense node of sense amplifier SAb. When bit line capacitance CB1 or CB2 changes, potential change ΔV appearing at the sense node of sense amplifier changes as represented by the aforementioned formula (1). The change of capacitances CB1 and CB2 is not caused by the parasitic capacitances of sub-bit lines SBLa and SBLb, but is caused by the fact that the lengths of main bit lines change depending on the position of the selected word line.

As shown in FIG. 70B, the bit line capacitance with respect to sense amplifier SAa takes the minimum value CBmn when the memory array block which is nearest to the sense amplifier SAa is selected. In this case, bit line capacitance CB2 with respect to the other sense amplifier SAb takes the maximum value CBmx because the main bit line (global bit line) has the maximum length. A larger potential difference at the sense nodes of sense amplifier is desired for the accurate sensing operation. A larger bit line capacitance causes delay in signal transmission. Therefore, the timing of starting the sensing operation of sense amplifiers SAa and SAb depends on the maximum bit line capacitance CBmx, so that the sensing operation cannot be started at an early timing, resulting in a problem that the access time increases.

FIG. 71 shows a structure of the switch circuit shown in FIG. 69. In FIG. 71, global bit lines GBLa and GBLb each are divided into two portions, and one of the paired divided global bit lines functions as the reference bit line, so that the global bit lines are indicated by reference characters GBL and /GBL. FIG. 71 shows the structure of switch circuit disposed between memory array blocks M#0 and M#1.

In FIG. 71, the switch circuit includes section select switches SWC0 disposed in series between global bit lines BGLA and GBLB and between /GBLA and /GBLB. Section select switches SWC0 are turned off in response to section select signal SEC (i.e., an inverted signal /SEG0 of segment select signal SEG0).

The switching circuit further includes segment select switches SWGa0 and SWGb0 which are turned on to connect sub-bit lines SBLa0 and SBLb0 to global bit lines GBLA and GBLB in response to segment select signal SEG0, respectively, and segment select switches SWGa1 and SWGb1 which are turned on to connect sub-bit lines SBLa1 and SBLb1 to global bit lines /GBLA and /GBLB in response to segment select signal SEG0, respectively.

Sub-bit lines SBLa0 and SBLb0 as well as SBLa1 and SBLb1 are provided with precharging/equalizing transistors QE0 and QE1 as well as QE2 and QE3 which are turned on to transmit the intermediate potential of Vcc/2 to the corresponding sub-bit lines in response to section select signal SEC (/SEG0).

As can be seen from the structure of switch circuit shown in FIG. 71, the switch circuit has an extremely complicated layout, and it is difficult to dispose the switch circuit with a sufficient margin if the bit line pitch is small, which remarkably impedes the high integration, because a contact region required for connecting the switching element to the global bit line or sub-bit line is wider than the diffusion region of the switching transistor and thus occupies a large area).

FIG. 72 shows arrangement of global bit lines disclosed in the aforementioned reference of 1993 Symposium on VLSI Circuit. As shown in FIG. 72, global bit line crossing regions are provided at switch circuit formation regions, and are located alternately in the column and row directions with respect to the global bit line pairs. This reference merely discloses that the crossing regions are provided at the switch circuit formation regions, and does not disclose a specific structure for providing switching elements thereat. The crossing portions are provided at the global bit line pairs for the purpose of reducing the coupling noises caused by the coupling capacitance between adjacent global bit lines.

However, provision of the crossing portions at the global bit line pairs complicates the structure of switching circuits, resulting in a problem that the switch circuits occupy a large area if the crossing regions of global bit lines are located at the regions of switching circuits.

SUMMARY OF THE INVENTION

It is an object of the invention to provide a semiconductor memory device having a hierarchical bit line structure which can keep balance between bit line capacitances with respect to sense amplifiers.

Another object of the invention is to provide a semiconductor memory device having a hierarchical bit line structure, which has an improved noise margin in sensing operation.

Still another object of the invention is to provide a semiconductor memory device having a hierarchical bit line structure, which occupies a small area and has an improved sensing operation margin.

Yet another object of the invention is to provide a semiconductor memory device having a hierarchical bit line structure, which can reduce the maximum bit line capacitance with respect to a sense amplifier.

A further object of the invention is to provide a semiconductor memory device having a hierarchical bit line structure, which occupies a small area.

A semiconductor memory device according to one aspect of the invention includes a plurality of memory cells arranged in rows and columns, each of the columns being divided into a plurality of blocks and adjacent two columns forming a pair, and a plurality of main bit lines disposed corresponding to the columns, respectively, and arranged to form pairs corresponding to the memory cell column pairs. Each of the main bit line pairs includes first and second main bit lines.

The semiconductor memory device further includes a plurality of sub-bit lines disposed corresponding to the respective blocks in each of the memory cell columns and each connected to the memory cell in the corresponding column block. The sub-bit lines disposed at the adjacent columns in the same block form a pair, and each sub-bit line pair includes first and second sub-bit lines.

The semiconductor memory device further includes first gates each provided to divide the first main bit line into two portions, and block select gates provided corresponding to the respective sub-bit lines and being responsive to a block select signal to connect the sub-bit lines to the main bit lines. Each of the block select gates includes a gate being responsive to the block select signal to connect one of the sub-bit lines to the first main bit line and connect at least one of the sub-bit lines to the second main bit line.

The semiconductor memory device further includes a plurality of sense amplifiers provided corresponding to the respective main bit line pairs, disposed at positions opposed to the first gates of the corresponding main bit line pairs, and being operable to sense and amplify signals on the corresponding first and second main bit lines, and second gates for dividing each second main bit line into two portions such that respective memory cell data transmitted onto the first and second main bit lines are sensed and amplified by the corresponding sense amplifier pair during sensing operation of the sense amplifiers. The first gate divides the first main bit line into two portions during word line selecting operation.

According to the above aspect of the invention, the block select gate and the first gate divide the first main bit line into two portions. One of the divided portions of the first main bit line receives data of the selected memory cell. The second main bit line is connected to both the sense amplifiers. Therefore, the sense amplifiers can perform the sensing operation in substantially "folded bit line arrangement", and thus the sensing operation can be performed stably.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 22A–22C show a structure of a main portion of a semiconductor memory device of a third embodiment of the invention;

FIG. 39 shows planar arrangement of at a crossing portion in the semiconductor memory device shown in FIG. 37;

FIGS. 69A and 69B show a structure and an operation of a main portion of the semiconductor memory device shown in FIG. 68;

DESCRIPTION OF THE PREFERRED EMBODIMENTS

[First Embodiment]

Figure 1:
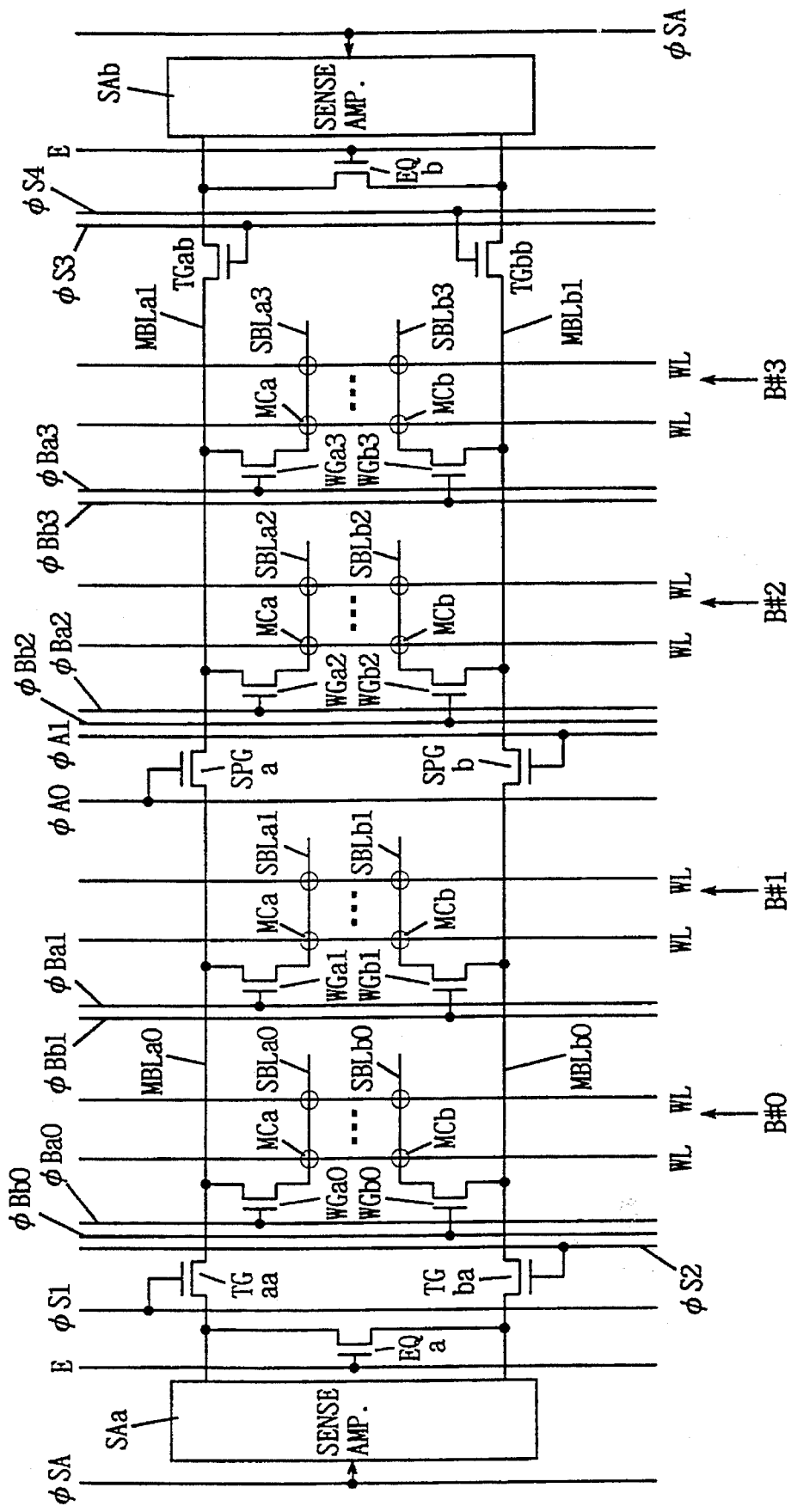
FIG. 1 shows a structure of a main portion of semiconductor memory device of a first embodiment of the invention.

FIG. 1 shows a structure of a main portion of a semiconductor memory device of a first embodiment of the invention. FIG. 1 shows a portion related to a pair of main bit lines. In FIG. 1, first main bit line MBLa (MBLa0 and MBLa1) is provided corresponding to memory cells MCa arranged in one column, and second main bit line MBLb (MBLb0 and MBLb1) is provided corresponding to memory cells MCb in one column. Memory cells MCa in one column are divided into a plurality of blocks (i.e., four blocks in FIG. 1) B#0–B#3, and memory cells MCa are also divided into blocks B#0 and B#3. Sub-bit lines SBLa (SBLa0–SBLa3) and SBLb (SBLb0–SBLb3) are provided corresponding to memory cells MCa and MCb in column blocks B#0–B#3, respectively. Word lines WL are disposed in a direction crossing sub-bit lines SBLa and SBLb. Memory cells MCa and MCb are provided corresponding to crossings of word line WL and sub-bit lines SBLa (SBLa0–SBLa3) and SBLb (SBLb0–SBLb3), respectively. Each of memory cells MCa and MCb has a structure of a dynamic memory cell of a type of one-transistor/one-capacitor, although the specific structure is not shown. When one word line WL is selected, two memory cells MCa and MCb are simultaneously selected.

Separation gates SPGa and SPGb are disposed at substantially middle portions of first main bit line MBLa and second main bit line MBLb, respectively. Separation gate SPGa is turned off in response to a separation control signal φA0, and separation gate SPGb is turned off in response to a separation control signal φA1.

Block select switches WGa (WGa0–WGa3) are provided corresponding to sub-bit lines SBLa (SBLa0–SBLa3), and block select switches WGb (WGb0–WGb3) are provided corresponding to sub-bit lines SBLb (SBLb0–SBLb3). Block select switches WGa (WGa0–WGa3) are turned on in response to block select signals φBa (φBa0–φBa3), respectively. Block select switches WGb (WGb0–WGb3) are turned on in response to block select signals φBb (φBb0–φBb3), respectively. The use of two kinds of block select signals φBa and φBb ensures a ratio of 1:2 between the bit line capacitances with respect to sense amplifiers, as will be described later.

Sense amplifiers SAa and SAb are disposed at opposite sides of first and second main bit lines MBLa and MBLb. Sense amplifiers SAa and SAb are activated to perform sensing operation in response to sense amplifier activation signal φSA. Connection gates TGaa and TGba are disposed between sense amplifier SAa and divided main bit lines MBLa0 and MBLb0, respectively. Connection gates TGab and TGbb are disposed between sense amplifier SAb and divided main bit lines MBLa1 and MBLb1, respectively. Connection gate TGaa is turned on in response to connection control signal φS1, connection gate TGab is turned on in response to connection control signal φS2, connection gate TGab is turned on in response to connection control signal φS3, and connection gate TGbb is turned on in response to connection control signal φS4. At positions symmetrical to each other and adjacent to sense amplifiers SAa and SAb, there are disposed equalizing transistors EQa and EQb for equalizing sense nodes of sense amplifiers SAa and SAb to an intermediate potential in response to an equalizing signal E. Now, operation of the structure shown in FIG. 1 will be described below with reference to a waveform diagram of FIG. 2.

In the standby state, equalizing signal E and separation control signals φA0 and φA1 are at the high level, and main bit lines MBLa and MBLb are equalized/precharged to the intermediate potential of Vcc/2. It is assumed in the following description that a word line in memory cell block B#0 is selected.

Upon start of a memory cycle (e.g., fall of an external row address strobe signal to the low level), equalizing signal E attains the low level, and equalizing transistors EQa and EQb are turned off, so that both main bit lines MBLa and MBLb attain the floating state at the intermediate potential.

Then, separation control signal φA0 falls to the low level, and separation switch SPGa is turned off. Thereby, first main bit line MBLa is divided into one divided main bit line MBLa0 and other divided main bit line MBLa1. After or parallel to the above operation, memory block select signals φBa0 and φBb0 rise to the high level, so that sub-bit line SBLa0 is connected to one divided main bit line MBLa0 via block select switch WGa0, and sub-bit line SBLb0 is connected to second main bit line MBLb via block select switch WGb0. Separation switch SPGb provided at second main bit line MBLb is on. At this time, block select signal φBb3 rises to the high level, so that sub-bit line SBLb3 is connected to second main bit line MBLb.

Then, the potential of word line WL in memory cell block B#0 rises to the high level, and data stored in memory cells MCa and MCb located at the crossings thereof are transmitted onto one divided main bit line MBLa0 and second main bit line MBLb via sub-bit lines SBLa0 and SBLb0, respectively. At this time, assuming that the potential change of |ΔV| appears on one divided main bit line MBLa0, the potential change of |ΔV/2| appears on second main bit line MBLb, because a stray capacitance CBa of divided main bit line MBLa0 and sub-bit line SBLa0 is ½ of a stray capacitance CB2 of second main bit line MBLb and sub-bit lines SBLb0 and SBLb3. The potential of other divided main bit line MBLa1 is at the level of the precharged/equalized potential (intermediate potential of Vcc/2).

When the signal voltages on one divided main bit line MBLa0 and second main bit line MBLb increase sufficiently, separation control signal φA1 falls to the low level, and second main bit line MBLb is divided into divided main bit lines MBLb0 and MBLb1. Thereby, the sense nodes of sense amplifier SAa have equal bit line capacitances, and also the sense nodes of sense amplifier SAb have equal bit line capacitances.

Figure 2:
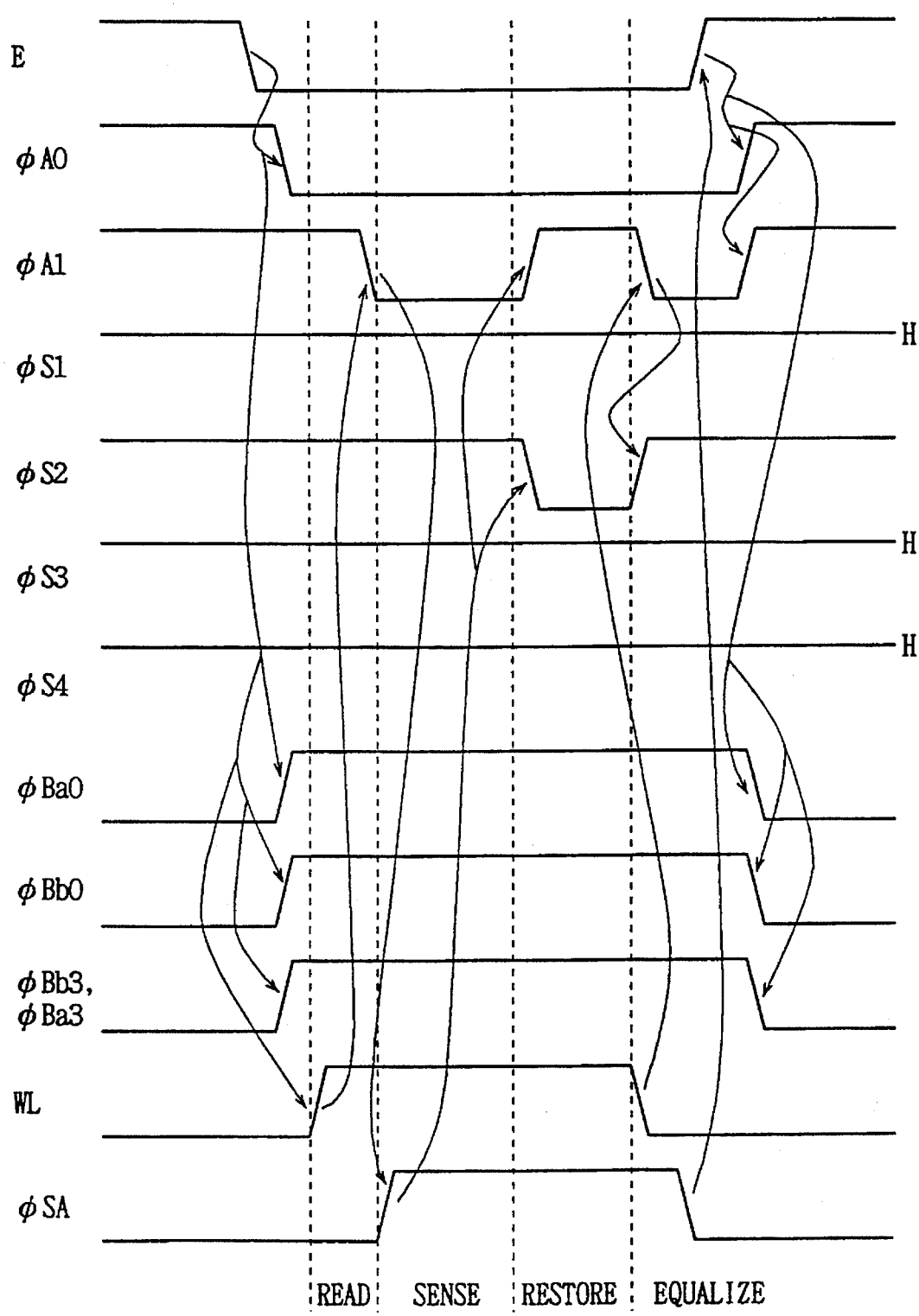
FIG. 2 is a signal waveform diagram showing operation of the semiconductor memory device shown in FIG. 1.

Thereafter, sense amplifier activation signal φSA is activated (this activation is represented as rising to the high level in the waveform diagram of FIG. 2), so that sense amplifiers SAa and SAb sense and amplify the potential difference on the corresponding divided main bit lines. Sense amplifier SAa senses and amplifies data stored in memory cell MCa, and sense amplifier SAb senses and amplifies data stored in memory cell MCb. Even if both memory cells MCa and MCb have stored signals at the high level, the signal potential of divided main bit line MBLa0 is larger than that of divided main bit line MBLb0. Therefore, sense amplifier SAa charges divided main bit line MBLa0 to the potential at the power supply potential Vcc level, and one divided main bit line MBLb0 is discharged to the ground potential level. Likewise, even if both memory cells MCa and MCb have stored signals at the low level, the potential of divided main bit line MBLa0 is lower than that of divided main bit line MBLb0, so that the sensing operation is performed accurately. In connection with sense amplifier SAb, the potential of divided main bit line MBLa1 is the reference potential (precharging/equalizing potential), so that the sensing operation is performed in accordance with the signal potential of divided main bit line MBLb1. Thereafter, writing and reading of memory cell data is performed.

Then, separation control signal φA1 rises to the high level, and divided main bit lines MBLb0 and MBLb1 are connected together via separation switch SPGb. Simultaneously, connection control signal φS2 falls to the low level, and second main bit line MBLb is separated or isolated from sense amplifier SAa, and restoring is effected on memory cells MCa and MCb connected to sub-bit lines SBLa0 and SBLb0, respectively. In this restoring operation, the potential of selected word line WL and connection control signal φA1 as well as connection control signals φS1, φS3 and φS4 may be boosted.

Upon completion of the restoring, the potential of selected word line WL falls to the low level.

Thereafter, separation control signal φA1 is first lowered to the low level to isolate divided main bit lines MBLb0 and MBLb1 from each other. Then, connection control signal φS2 is raised to the high level to connect divided main bit line MBLb0 to sense amplifier SAa. Thereby, the potentials of divided main bit lines MBLa0 and MBLb0 attain the high level and the low level, or attain the low level and the high level, respectively. Both divided main bit lines MBLa1 and MBLb1 are held by sense amplifier SAb at the potentials of high and low levels or at the potentials of low and high levels, respectively.

Thereafter, sense amplifier activation signal φSA is deactivated (i.e., is brought to the low level in FIG. 2) to deactivate sense amplifiers SAa and SAb. Then, equalizing signal E is raised to the high level to turn on equalizing transistors EQa and EQb. Thereby, divided main bit lines MBLa0 and MBLb0 are electrically short-circuited, and thus are equalized accurately to the intermediate potential of Vcc/2 because the stray capacitances of them are equal to each other. Likewise, divided main bit lines MBLa1 and MBLb1 are equalized to the intermediate potential of Vcc/2. Thereafter, separation control signals φA0 and φA1 are raised to the high level, and then block select signals φBa0, φBb0, φBa3 and φBb3 all are lowered to the low level. In this manner, one memory cycle is completed.

According to FIG. 2, both block select signals φBa and φBb fall to the low level after both separation control signals φA1 and φA0 attain the high level. Alternatively, both separation control signals φA0 and φA1 may attain the high level after both block select signals φBa and φBb attain the low level.

Now, the aforementioned operation will be described more specifically with reference to the drawings.

Figure 3:
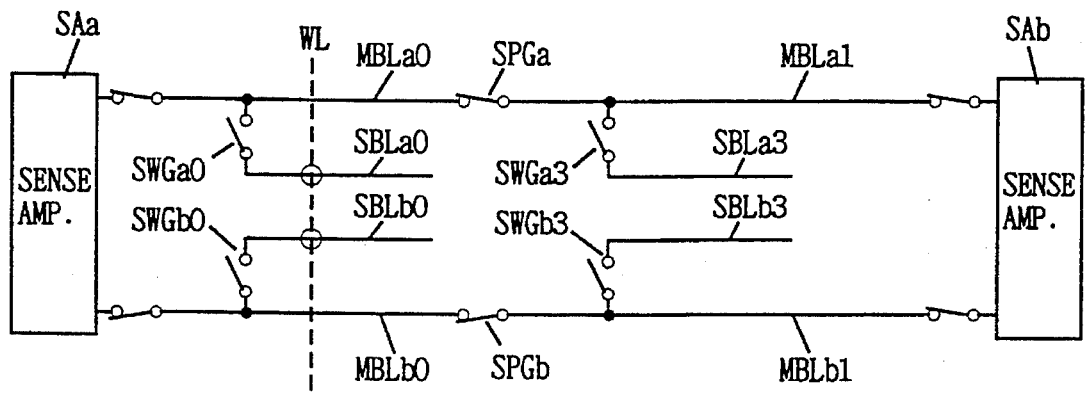
FIG. 3 schematically shows operation of the semiconductor memory device shown in FIG. 1.

FIG. 3 shows a connection mode of the main bit lines and sub-bit lines in the standby state. In this state, separation switches SPGa and SPGg are on, and block select switches SWGa0, SWGb0, SWGa3 and SWGb3 all are off.

Figure 4A:
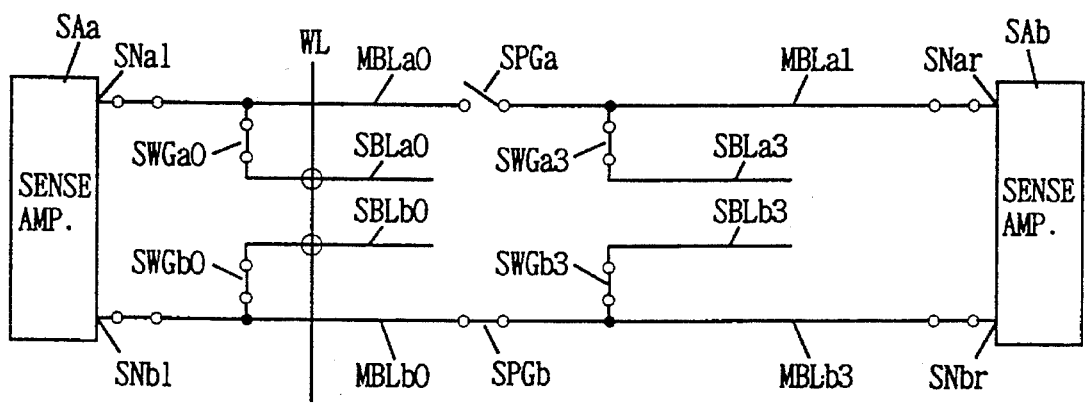
FIGS. 4A, 4B and 4C show operations in reading memory cell data in the semiconductor memory device shown in FIG. 1.
Figure 4B:
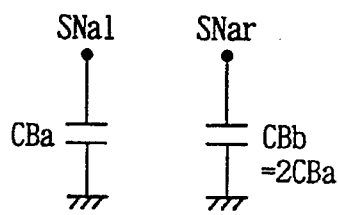
Figure 4C:
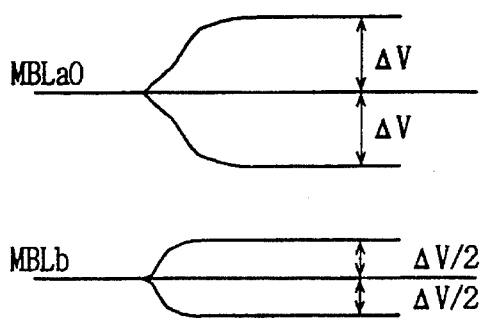

Upon start of the memory cycle, as shown in FIG. 4A, separation switch SPGa is first turned off to divide first main bit line MBLa into divided main bit lines MBLa0 and MBLa1. Then, block select switches SWGa0, SWGb0, SWGa3 and SWGb3 are turned on. Thereafter, the potential of word line WL rises to the high level. The bit line capacitances related sense nodes SNa1 and SNb1 of sense amplifier SAa are CBa and CBb (=2·CBa) as shown in FIG. 4B. Assuming that the potential difference of ΔV appears on divided main bit line MBLa0, it is apparent from the previously described formula (1') that the potential difference of ΔV/2 appears on main bit line MBLb. The potential difference between sense nodes SNa1 and SNb1 of sense amplifier SAa is $\Delta V/2$ in the worst case. The potential difference between sense nodes SNar and SNbr of sense amplifier SAb is $\Delta V/2$.

Figure 5A:
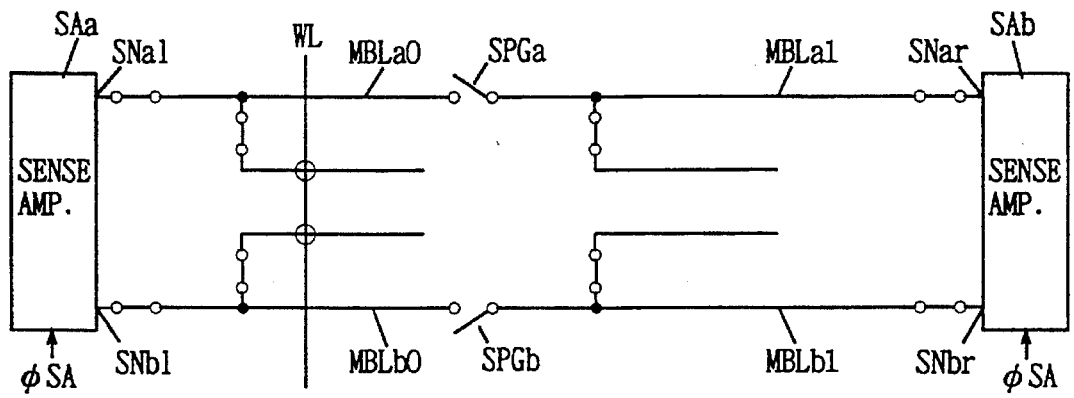
FIGS. 5A and 5B show sensing operation of the semiconductor memory device shown in FIG. 1.
Figure 5B:
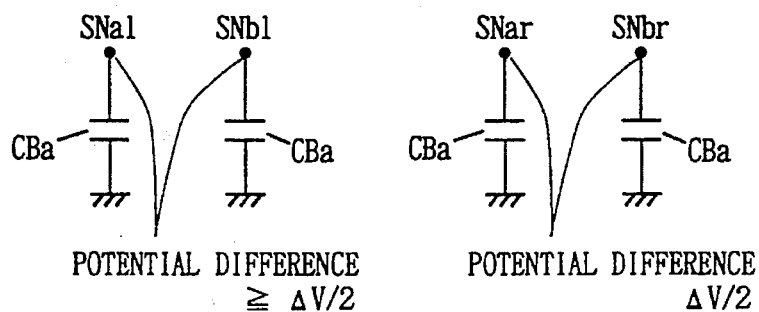

As shown in FIG. 5A, separation switch SPGb is then turned off. In this state, as shown in FIG. 5B, bit line capacitances related to sense nodes SNa1, SNb1, SNar and SNbr all are equal to CBa. Sense amplifiers SAa and SAb are then activated in response to sense amplifier activation signal $\phi SA$. As shown in FIG. 5B, the potential difference between the sense nodes of each of sense amplifier SAa and SAb is $\Delta V/2$ at the worst case. These potential differences are amplified. Thereafter, writing or reading of data is performed.

Figure 6:
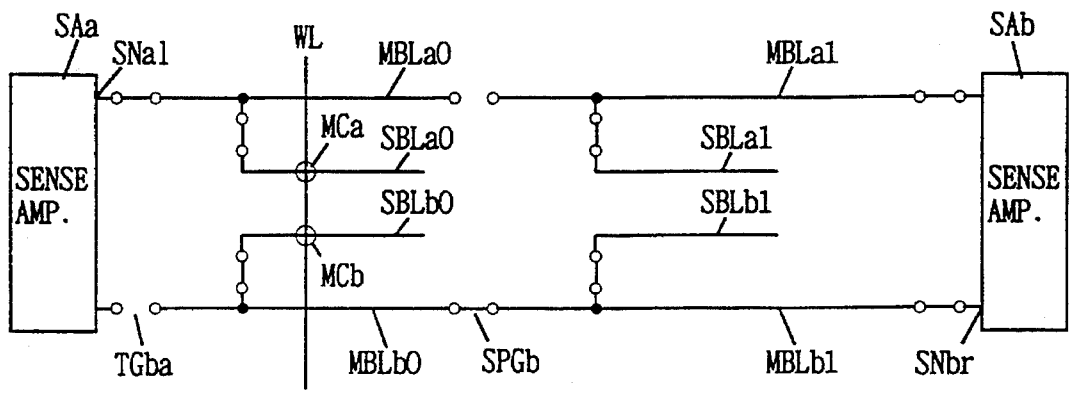
FIG. 6 shows operation during restoring of the semiconductor memory device shown in FIG. 1.

As shown in FIG. 6, separation switch SPGb is then turned on, and connection switch TGba is turned off. Divided main bit line MBLb0 is connected to sense node SNbr of sense amplifier SAb. Sense node SNbr of sense amplifier SAb holds a potential corresponding to data stored in memory cell MCb. Sense node SNa1 of sense amplifier SAa holds a signal potential corresponding to data stored in memory cell MCa. In this state, restoring is effected on memory cells MCa and MCb.

Figure 7:
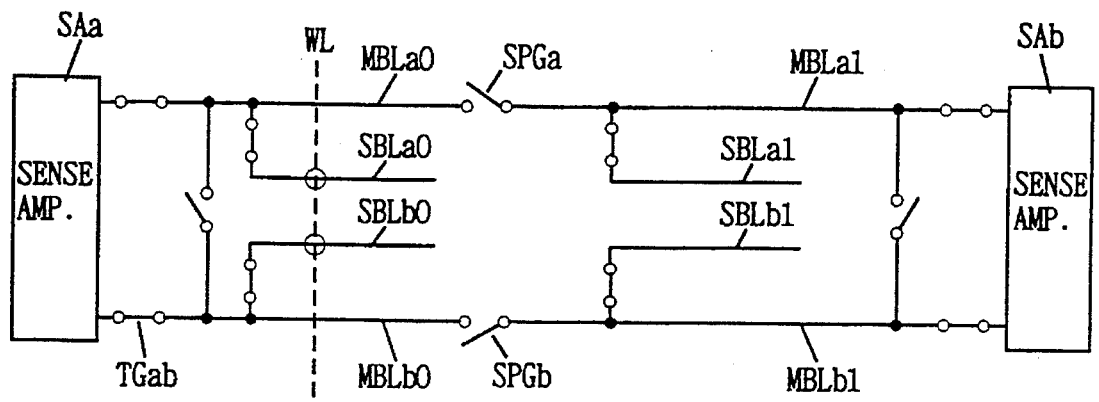
FIG. 7 shows operation before equalizing of the semiconductor memory device shown in FIG. 1.

Then, as shown in FIG. 7, separation switch SPGb is turned off, and connection switch TGba is turned on. Divided main bit line MBLb0 is connected to sense amplifier SAa again. At this time, word line WL is already set to the nonselected state. The potential of divided main bit line MBLb0 is driven by sense amplifier SAa to attain the potential level complementary to that of divided main bit line MBLa0. Divided main bit lines MBLa1 and MBLb1 are connected to sense amplifier SAb.

Figure 8:
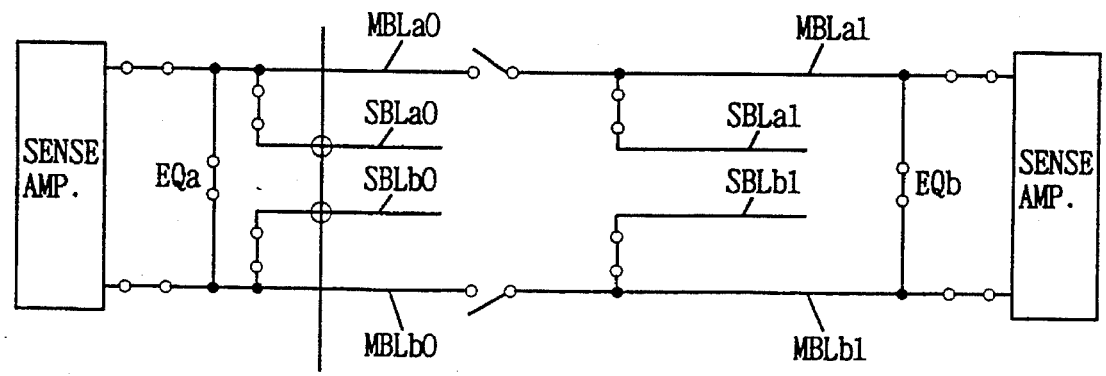
FIG. 8 shows equalizing operation of the semiconductor memory device shown in FIG. 1.

Then, as shown in FIG. 8, equalizing transistors EQa and EQb are turned on. Divided main bit lines MBLa and MBLb0 are electrically short-circuited, and have the equal stray capacitances, so that they are equalized to the intermediate potential of Vcc/2. Likewise, divided main bit lines MBLa1 and MBLb1 are electrically short-circuited, and are equalized to attain the equal potential. Since the stray capacitances of divided main bit lines MBLa1 and MBLb1 are equal to each other, main bit lines MBLa1 and MBLb1 are accurately equalized to attain the potential of Vcc/2.

Thereafter, sub-bit lines SBLa0 and SBLa1 are isolated from main bit lines MBLa0 and MBLa1, respectively, and sub-bit lines SBLb0 and SBLb1 are isolated from main bit lines MBLb0 and MBLb1, respectively. In the standby state, divided main bit lines MBLa0 and MBLa1 are interconnected, and divided main bit lines MBLb0 and MBLb1 are likewise interconnected.

In the sensing operation, the bit line capacitances of the sense nodes of sense amplifier are balanced, so that the sensing operation can be performed reliably. Also in the equalizing operation, the bit lines of the equal stray capacitances are short-circuited, so that the intermediate potential can be generated accurately.

Figure 9:
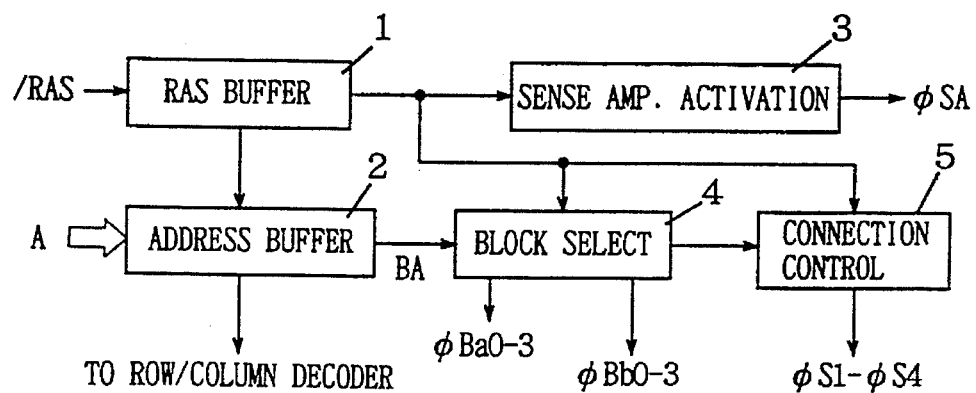
FIG. 9 schematically shows a structure of control signal generating circuitry of the semiconductor memory device shown in FIG. 1.

FIG. 9 shows a structure of control signal generating circuitry. In FIG. 9, the control signal generating circuitry includes an RAS buffer 1 which receives an external row address strobe signal /RAS and generates an internal row address strobe signal, and an address buffer 2 which is activated in response to the internal row address strobe signal from RAS buffer 1 and takes in externally applied address signal A to generate an internal address signal. The internal address signal generated by address buffer 2 is applied to row and column decoders. Predetermined address signal bits BA (block address) from address buffer 2 are applied to a block select circuit 4. Block select circuit 4 is activated in response to the internal row address strobe signal from RAS buffer 1, and decodes the block address BA to generate block select signals $\phi Ba0-\phi Ba3$ and $\phi Bb0-\phi Bb3$. For example, in connection with separation switches SPGa and SPGb shown in FIG. 1, it is assumed that the memory cell blocks at symmetrical positions are simultaneously selected. In this case, block select signals $\phi Ba0$ and $\phi Ba3$ are practically the same signal, and block select signals $\phi Bb0$ and $\phi Bb3$ are practically the same signal. Blocks B#0 and B#2 may be selected simultaneously.

The control signal generating circuitry includes a sense amplifier activating circuit 3 which generates a sense amplifier activation signal $\phi SA$ in response to the internal row address strobe signal from RAS buffer 1, and a connection control circuit 5 which generates connection control signals $\phi S1-\phi S3$ in response to the internal row address strobe signal from RAS buffer 1 and the block selection signal (or block address) from block select circuit 4.

Connection control circuit 5 normally maintains connection control signals $\phi S1$ and $\phi S3$ at the high level. In the restoring operation, the connection control signals $\phi S1$ and $\phi S3$ are raised to a higher level. One of connection control signals $\phi S1$ and $\phi S3$ is brought to the inactive state, i.e., low level depending on the position of the selected memory cell block during restoring. If memory cell block B#0 or B#1 is selected in the structure shown in FIG. 1, connection control signal $\phi S2$ is brought to the low level during restoring. When memory cell block B#2 or B#3 is selected, connection control signal $\phi S4$ is brought to the low level during restoring. Although not shown in FIG. 9, the structure may use a boosting instruction signal generating circuit which generates a boosting instruction signal RX at a predetermined timing in response to the internal row address strobe signal from RAS buffer 1 or sense amplifier activation signal $\phi SA$, and connection control circuit 5 may generate the connection control signal in accordance with boosting instruction signal RX.

Separation switch SPGa provided at a central portion of first main bit line MBLa may be always on. In this case, the purpose of separation switch SPGa is to maintain regularity in pattern of the main bit lines and to obtain equal stray capacitances of the main bit lines.

[Modification 1]

Figure 10:
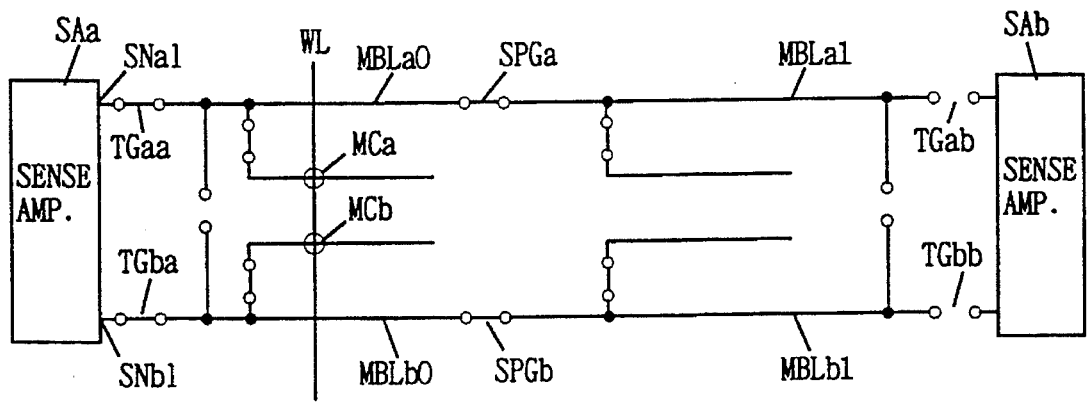
FIG. 10 shows modification of operation of the semiconductor memory device shown in FIG. 1.
Figure 11:
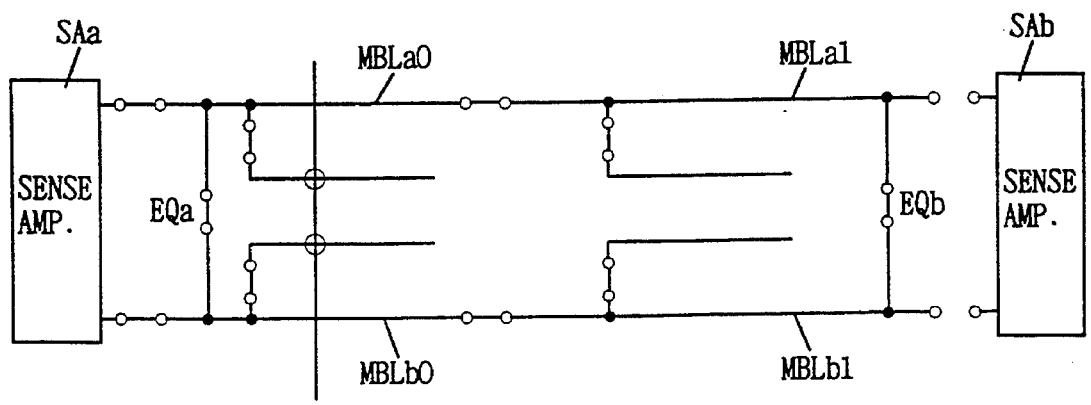
FIG. 11 schematically shows an operation state of the semiconductor memory device subsequent to the operation shown in FIG. 10.
Figure 12:
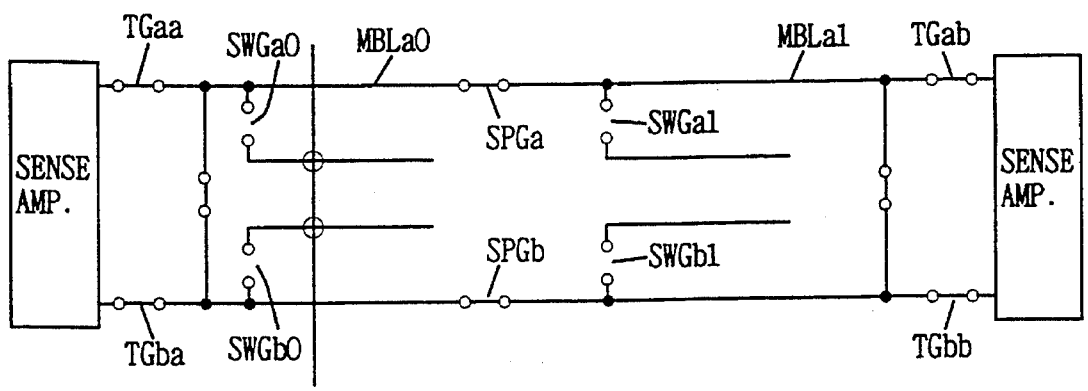
FIG. 12 shows an operation state of the semiconductor memory device subsequent to the operation shown in FIG. 11.

FIGS. 10 to 12 show another method of performing the equalizing operation. Now, this method of performing the equalizing operation will be described below.

FIG. 10 shows the operation after completion of the restoring. After completion of the restoring shown in FIG. 6 and subsequent driving to nonselected state of the word line, both separation switches SPGa and SPGb are turned on, and connection control switches TGab and TGbb are turned off. Main bit lines MBLa0 and MBLa1 are connected to sense node SNa1 of sense amplifier SAa, and main bit lines MBLb0 and MBLb1 are connected to sense node SNb1 of sense amplifier SAa. Main bit lines MBLa0, MBLa1, MBLb0 and MBLb1 are set to the potential level corresponding to the potential level held at sense nodes SNa1 and SNb1 of sense amplifier SAa. The potential of word line WL is already set to the inactive state of low level. Therefore, even if the potentials level of main bit lines MBLb0 and MBLb1 change, no influence is exerted on data stored in the selected memory cell MCb.

Then, as shown in FIG. 11, equalizing transistors EQa and EQb are turned on after deactivation of sense amplifiers SAa and SAb. Main bit lines MBLa0 and MBLb0 and main bit lines MBLb0 and MBLb1 are short-circuited. Since the stray capacitances of first and second main bit lines MBLa and MBLb are equal to each other, the potentials of divided main bit lines MBLa0, MBLa1, MBLb0 and MBLb1 are set to the intermediate level.

Then, as shown in FIG. 12, connection control switches TGab and TGbb are turned on, and block select switches SWGa0, SWGa1, SWGb0 and SWGb1 are turned off.

As described above, after the potentials of main bit lines MBLa and MBLb are set to the high/low levels using one of the two sense amplifiers, the sense amplifiers are deactivated, and then the equalizing transistors are turned on. Also in this case, the potentials of main bit lines MBLa and MBLb can be likewisely set to the potential level of the intermediate potential Vcc/2.

Such a structure may be employed that sense amplifiers SAa and SAb are isolated from main bit lines MBLa0, MBLa1, MBLb0 and MBLb1 during the sensing operation.

[Modification 2]

Figure 13:
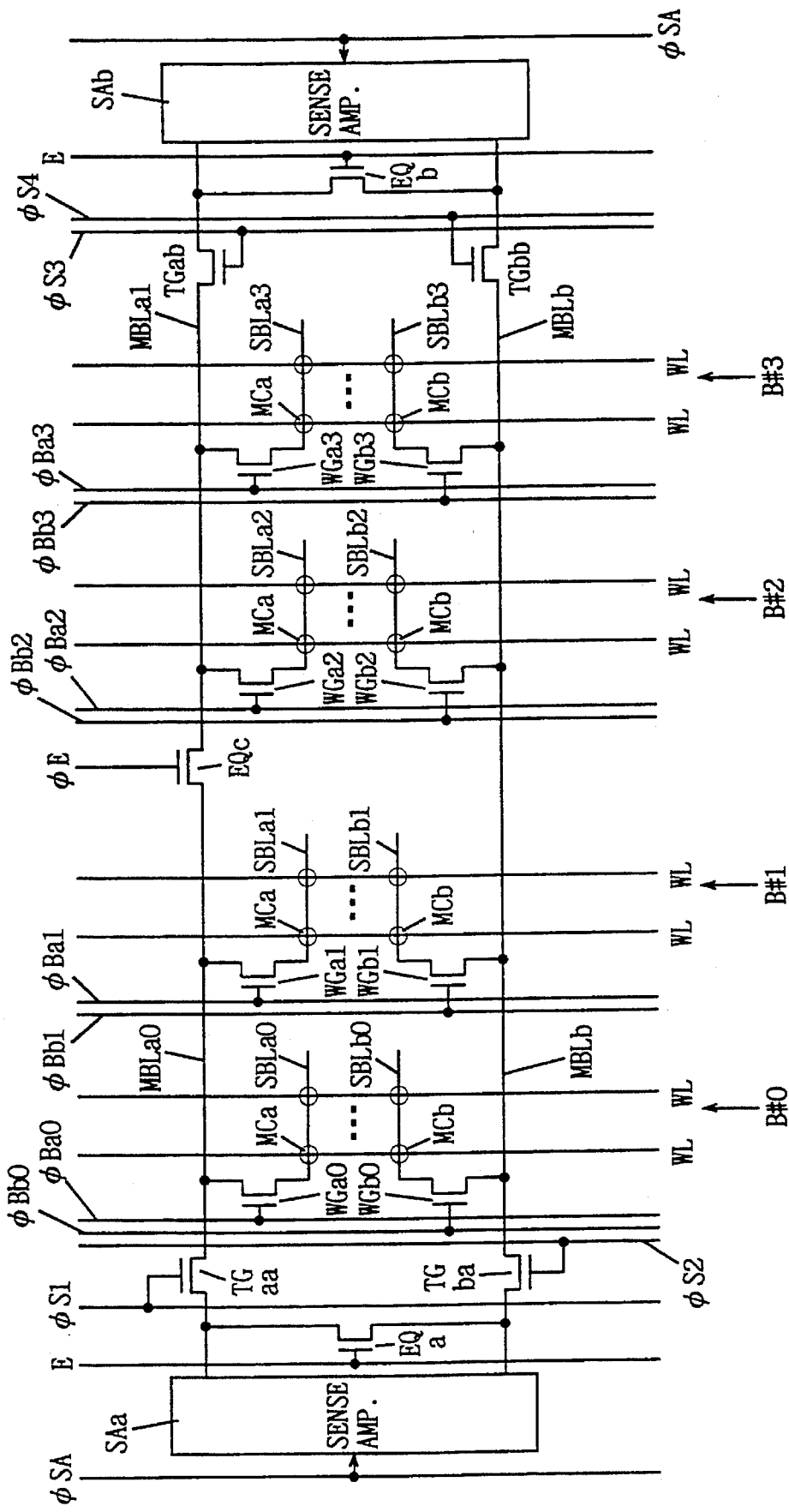
FIG. 13 shows a structure of a main portion of a modification of the semiconductor memory device of the first embodiment of the invention.

FIG. 13 shows a structure of a second modification of the first embodiment. In the structure shown in FIG. 13, an equalizing transistor EQc which is turned on in response to a control signal $\phi E$ is disposed between divided main bit lines MBLa0 and MBLa1. Main bit line MBLb is formed of one interconnection layer. Structures other than the above are the same as those shown in FIG. 1. The corresponding portions bear the same reference numbers or characters, and will not be described below. Now, operation of the structure shown in FIG. 13 will be described below with reference to an operation waveform diagram of FIG. 14.

Control signal $\phi E$ is low in the standby state, and divided main bit lines MBLa0 and MBLa1 are isolated from each other. Upon start of the memory cycle, equalizing signal E falls to the low level, and main bit line MBLb is isolated from divided main bit lines MBLa0 and MBLa1. Control signal $\phi E$ is still low.

Then, block select signals $\phi Ba0$, $\phi Bb0$, $\phi Bb3$ and $\phi Ba3$ are brought to the high level in accordance with the applied address signal. Sub-bit line SBLa0 is connected to divided main bit line MBLa0, and sub-bit line SBLa3 is connected to divided main bit line MBLa1. Sub-bit lines SBLb0 and SBLb3 are connected to main bit line MBLb. Here, it is assumed that memory cell block B#0 contains the selected memory cell.

Then, word line WL is selected, the potential of selected word line WL rises to the high level, and data stored in selected memory cells MCa and MCb are transmitted to divided main bit lines MBLa0 and MBLb0, respectively. Also in this case, since transistor EQc is off, a relationship of 2:1 is maintained between the magnitude of potential change appearing on divided main bit line MBLa0 and the magnitude of potential change appearing on main bit line MBLb.

When the potential difference between sense nodes of sense amplifiers SAa and SAb increases sufficiently, all connection control signals $\phi S1$–$\phi S4$ are set to the low level. Sense amplifiers SAa and SAb are isolated from divided main bit lines MBLa0 and MBLa1 and main bit line MBLb, respectively. Then, sense amplifier activation signal $\phi SA$ is activated (this is represented as rise to the high level in FIG. 14). Sense amplifier SAa senses and amplifies data stored in memory cell connected to sub-bit line SBLa0, and sense amplifier SAb senses and amplifies data stored in memory cell MCb connected to sub-bit line SBLb0.

Thereafter, writing/reading of data is performed. When writing data, latched signal potentials of sense amplifiers SAa and SAb change in accordance with data to be written. Then, restoring is performed. For this restoring, connection control signals $\phi S1$, $\phi S3$ and $\phi S4$ are set to the high level, and connection control signal $\phi S2$ is set to the low level. Thereby, the signal potential latched by sense amplifier SAa is written into memory cell MCa, and the signal potential latched by sense amplifier SAb is written into memory cell MCb. During this restoring, all connection control signals $\phi S1$, $\phi S3$ and $\phi S4$ may be raised to the voltage level not lower than the power supply voltage Vcc level.

After the restoring, connection control signals $\phi S3$ and $\phi S4$ fall to the low level, and divided main bit line MBLa1 and main bit line MBLb are isolated from sense amplifier SAb. Also at this time, connection control signal $\phi S2$ rises to the high level, connection control signal TGba is turned on, and main bit line MBLb is connected to sense amplifier SAa. Thereby, main bit line MBLb receives a signal at the level complementary to the signal potential appearing on divided main bit line MBLa. Also at this time, control signal $\phi E$ is high, and separation transistor is on. As a result, the signal potentials of divided main bit lines MBLa0 and MBLa1 and main bit line MBLb attain the potential level corresponding to the signal potential latched by sense amplifier SAa.

Figure 14:
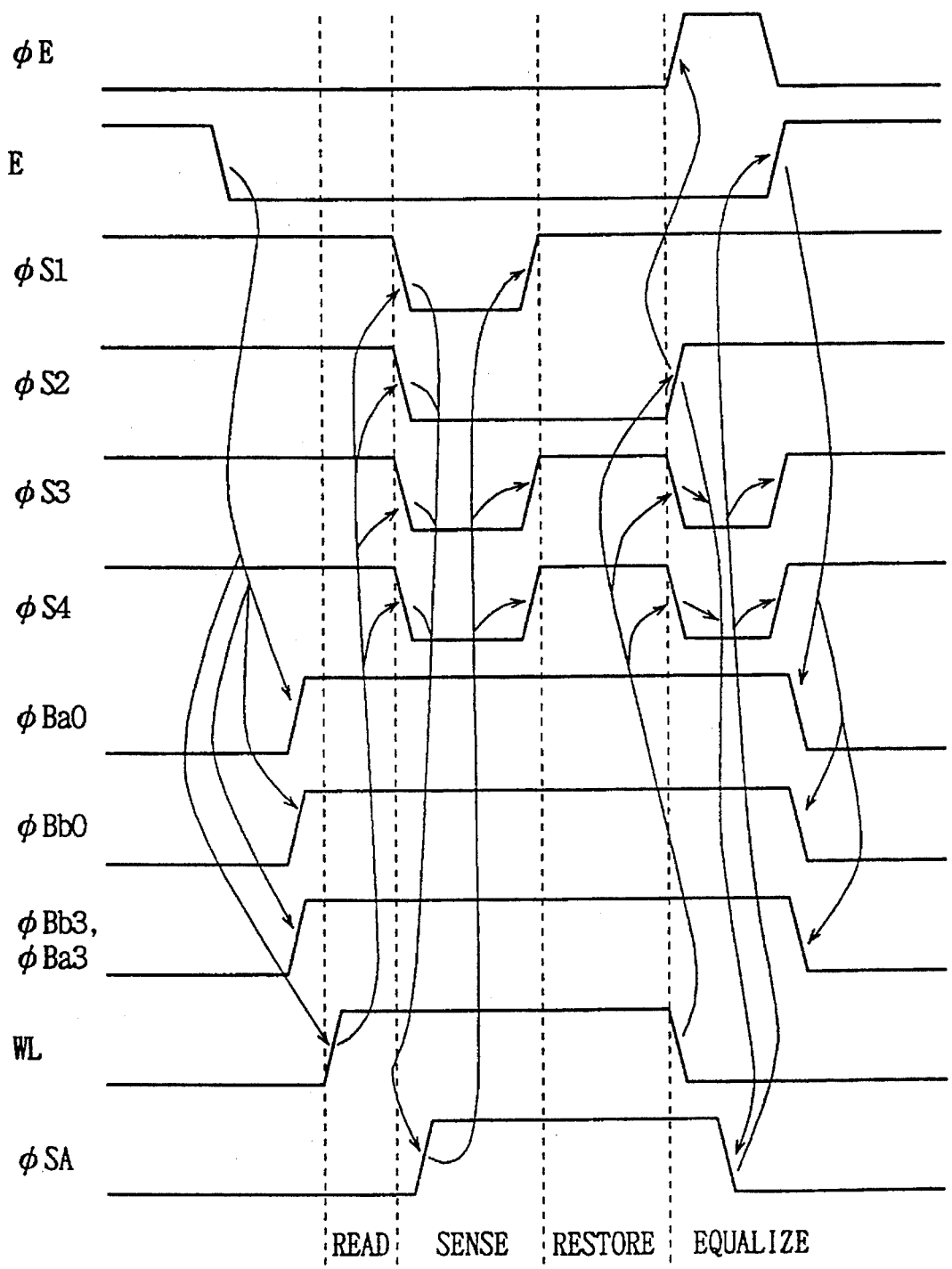
FIG. 14 is a signal waveform diagram showing operation of the semiconductor memory device shown in FIG. 13.

Thereafter, sense amplifiers SAa and SAb are deactivated (i.e., sense amplifier activation signal $\phi SA$ falls to the low level), and then equalizing signal E is set to the high level to turn on equalizing transistors EQa and EQb. In this operation, isolating transistor EQc may be on or off. In FIG. 14, separation transistor EQc is off. The stray capacitance of divided main bit lines MBLa0 and MBLa1 is equal to the stray capacitance of main bit line MBLb. Therefore, divided main bit lines MBLa0 and MBLa1 and main bit line MBLb can be surely equalized to the intermediate potential level.

In the structure shown in FIG. 13, sense amplifiers SAa and SAb are isolated from main bit lines when they are performing the sensing operation. Therefore, even if the bit line capacitances with respect to the sense nodes of sense amplifiers are not balanced, the sensing operation can be performed accurately without being affected by the imbalance.

[Modification 3]

Figure 15:
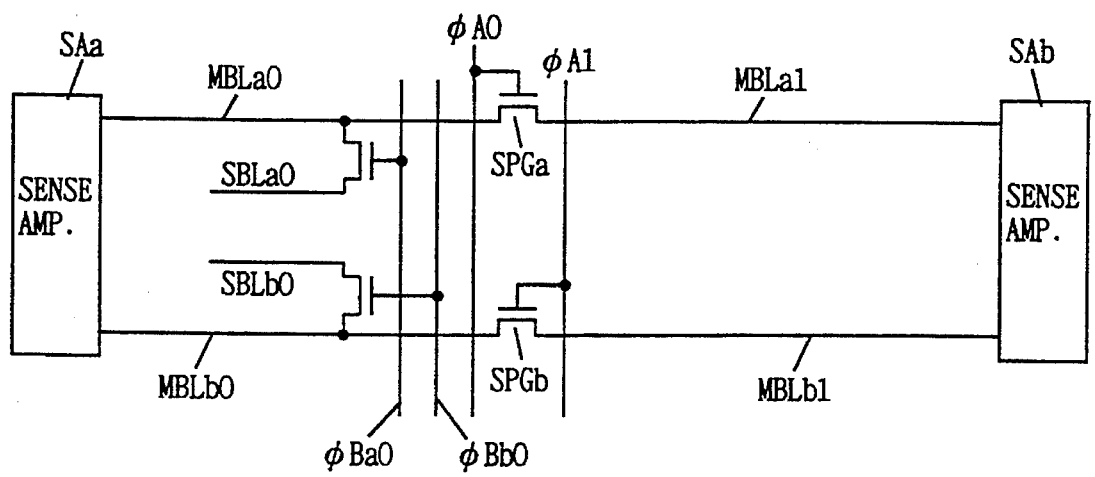
FIG. 15 shows operation of the semiconductor memory device shown in FIG. 13.

FIG. 15 shows a third modification of the first embodiment. In the structure shown in FIG. 15, only one sub-bit line is connected to the main bit line when selecting a memory cell. Thus, in the structure shown in FIG. 15, only one sub-bit line SBLb0 is connected to main bit lines MBLb0 and MBLb1 when sub-bit line SBLa0 is connected to divided main bit line MBLa0.

Figure 16A:
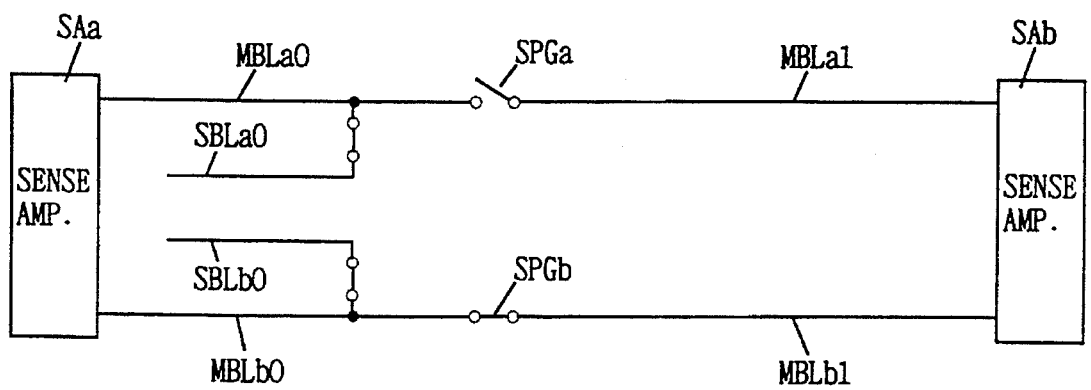
FIGS. 16A and 16B show sensing operation of the semiconductor memory device shown in FIG. 15.

As shown in FIG. 16A, separation switch SPGa is turned off and separation switch SPGb is turned on when selecting a word line. At this time, sub-bit line SBLa0 is connected to divided main bit line MBLa0, and sub-bit line SBLb0 is connected to divided main bit lines MBLb0 and MBLb1. Separation switches SPGa and SPGb are disposed at central portions of the main bit lines. In this case, a ratio $\Delta Vb/\Delta Va$ between read voltages $\Delta Va$ and $\Delta Vb$, which appear on divided main bit lines MBLa0 and MBLb (MBLb0 and MBLb1), respectively, is expressed by the following formula:

$$\Delta Vb/\Delta Va = (Csb + Cmb)/(Csb + 2 \cdot Cmb)$$

where Csb represents the parasitic capacitance of sub-bit line, and Cmb represents the stray capacitance of divided main bit line. In this case, therefore, if the selected memory cells on sub-bit lines SBLa0 and SBLb0 have stored data signals of the same logic, the potential difference with for sense amplifier SAa is slightly smaller than that in the embodiment described previously, but the potential difference for sense amplifier SAb is larger than that in the embodiment described before.

Figure 16B:
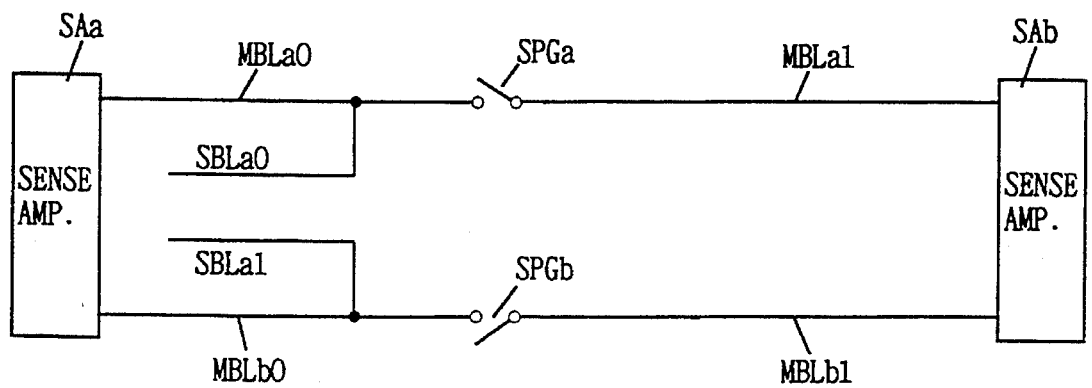

Also in this case, as shown in FIG. 16B, both separation switches SPGa and SPGb are turned off during the sensing operation by sense amplifiers SAa and SAb, so that the load capacitances of sense nodes of sense amplifiers SAa and SAb are kept balanced, and thus the sensing operation can be performed accurately.

[Modification 4]

Figure 17A:
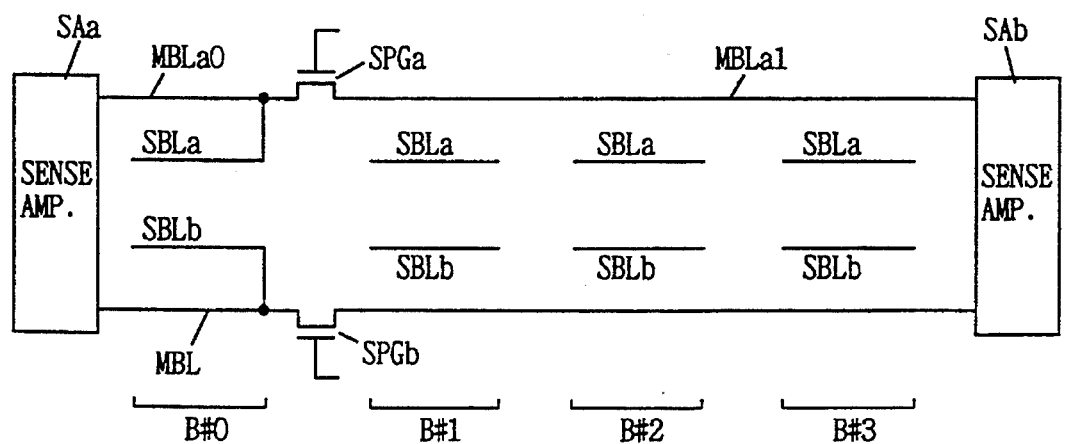
FIGS. 17A, 17B and 17C show structures and operation of another modification of the semiconductor memory device according of the first embodiment of the invention.

FIG. 17 shows a fourth modification of the first embodiment. In the structure shown in FIG. 17A, separation switches SPGa and SPGb are disposed between memory cell blocks B#0 and B#1. In the example shown in FIG. 17A, four memory cell blocks are provided, more memory cell blocks are provided.

Figure 17B:
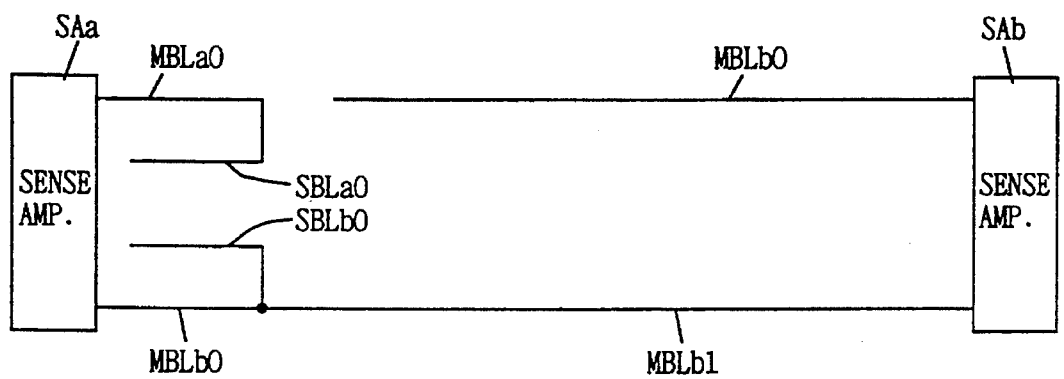

As shown in FIG. 17B, when memory block B#0 is selected, sub-bit line SBLa0 is connected to divided main bit line MBLa0, and sub-bit line SBLb0 is connected to main bit lines MBLb0 and MBLb1. In this case, a ratio $\Delta Vb/\Delta Va$ between potential difference $\Delta Va$ appearing on divided main bit line MBLa0 and potential difference $\Delta Vb$ appearing on main bit line MBLb0 is expressed by the following formula:

$$\Delta Vb/\Delta Va = (k+n)/(k+1) \approx 1 + (n/k)$$

In connection with the above, it is assumed that each of sub-bit lines SBLa and SBLb has the stray capacitance of Csb. In this case, stray capacitance Cmb of the main bit line (divided main bit line MBLa0) of the same length as the sub-bit line satisfies the following relationship:

$$Csb = k \cdot Cmb$$

It is also assumed that the number of memory cell blocks is n. k is in s range from 5 to 10. Therefore, the potential differences substantially satisfying the relationship of 1:2 appear, and thus the sensing operation can be performed sufficiently stably. In the sensing operation, divided main bit lines MBLb0 and MBLb1 are separated from each other by separation switch SPGb, so that the load capacitances of sense amplifiers SAa and SAb are balanced, and thus the sensing operation can be performed accurately.

Figure 17C:
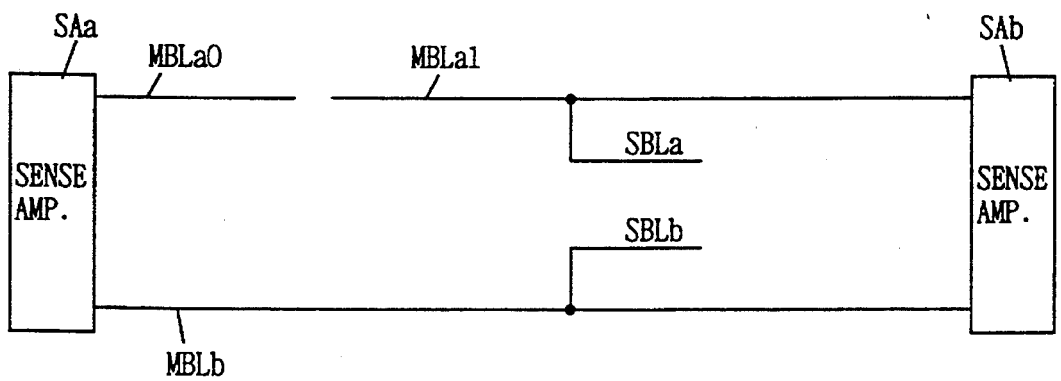

As shown in FIG. 17C, one of memory blocks B#1–B#3 is selected and sub-bit line SBLa is connected to divided main bit line MBLa1. In this case, potential difference $\Delta Va$ appearing on divided main bit line MBLa1 and potential difference $\Delta Vb$ appearing on main bit line MBLb satisfy the following relationship under the conditions described before:

$$\Delta Vb/\Delta Va = (k+n-1)/(k+n) < 1$$

Therefore, a read voltage difference is caused between the main bit lines. Also in this case, sense amplifiers SAa and SAb can surely perform the accurate sensing operation.

In FIG. 17A, separation transistor SPGb may be eliminated, in which case a similar effect can also be obtained (because the sense amplifiers are separated from the main bit lines during the sensing operation).

According to the first embodiment, as described above, the memory cell block is selected in one memory array block when performing the sensing operation. Therefore, in-phase noises can be surely canceled, and thus the sensing operation can be performed surely without influence by the noises.

Since balance between the load capacitances with respect to the sense amplifiers is kept, and thus the sensing operation can be performed stably.

Complicated switch circuitry is not required, so that the layout is significantly simplified, and a layout area is significantly reduced.

[Second Embodiment]

Figure 18:
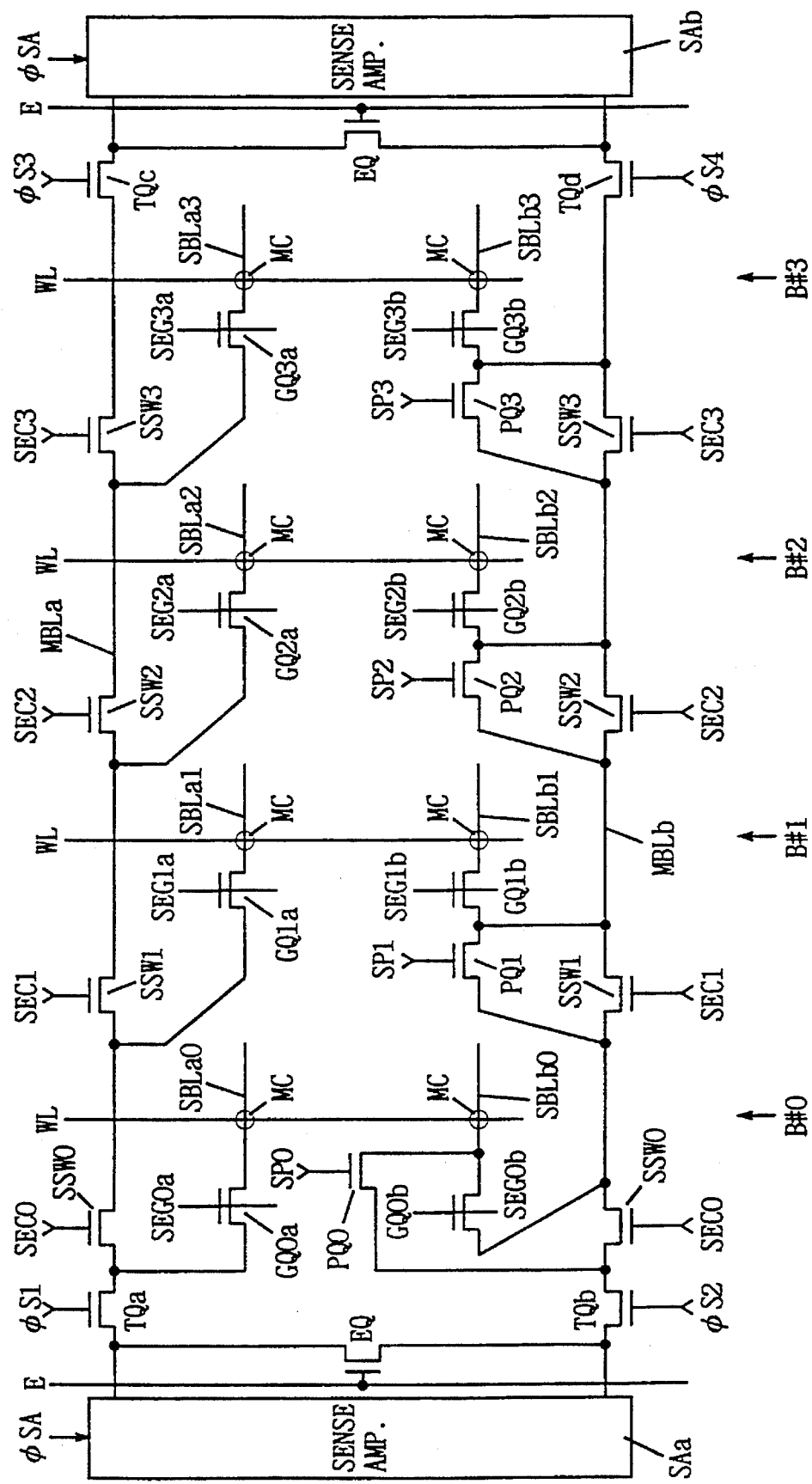
FIG. 18 shows a structure of a main portion of a semiconductor memory device of a second embodiment of the invention.

FIG. 18 shows a structure of a main portion of a semiconductor memory device of a second embodiment of the invention. FIG. 18 shows four memory cell blocks. Each memory cell block may correspond to one memory array block.

A structure shown in FIG. 18 relates to the memory cells arranged in two columns. In each column, there are provided four divided memory cell blocks B#0–B#4. The memory cell blocks may be more than four. Each of main bit lines MBLa and MBLb is provided with section select switches SSW0–SSW3 corresponding to memory cell blocks B#0–B#3, respectively. Section select switches SSW0–SSW3 receive section select signals SEC0–SEC3 at their gates, respectively. There are provided sub-bit lines SBLa0, SBLb0–SBLa3, SBLb3 corresponding to column blocks B#0–B#3 of memory cells, respectively. Memory cells MC are arranged at crossings of sub-bit lines SBLa0, SBLb0–SBLa3, SBLb3 and word lines WL.

There are provided segment select switches GQ0a–GQ3a which correspond to sub-bit lines SBLa0–SBLa3 and are responsive to segment select signals SEG0a–SEG3a, respectively. When selected, segment select switches GQ0a–GQ3a connect corresponding sub-bit lines SBLa0–SBLa3 respectively to sense amplifier SAa via main bit line MBLa.

There are provided segment select switches GQ0b–GQ3b which correspond to sub-bit lines SBLb0–SBLb3 and are turned on in response to segment select signals SEG0b–SEG3b, respectively. When selected, segment select switches GQ0b–GQ3b connect corresponding sub-bit lines SBLb0–SBLb3 to sense amplifier SAb via main bit line MBLb.

Corresponding to sub-bit lines SBLb0–SBLb3, there are further provided switching switches PQ0–PQ3 which are turned on in response to switch signals SP0–SP3, respectively. When turned on in response to switch signals SP0–SP3, switching switches PQ0–PQ3 connect corresponding sub-bit lines SBLb0–SBLb3 to sense amplifier SAa via main bit line MBLb.

Figure 19:
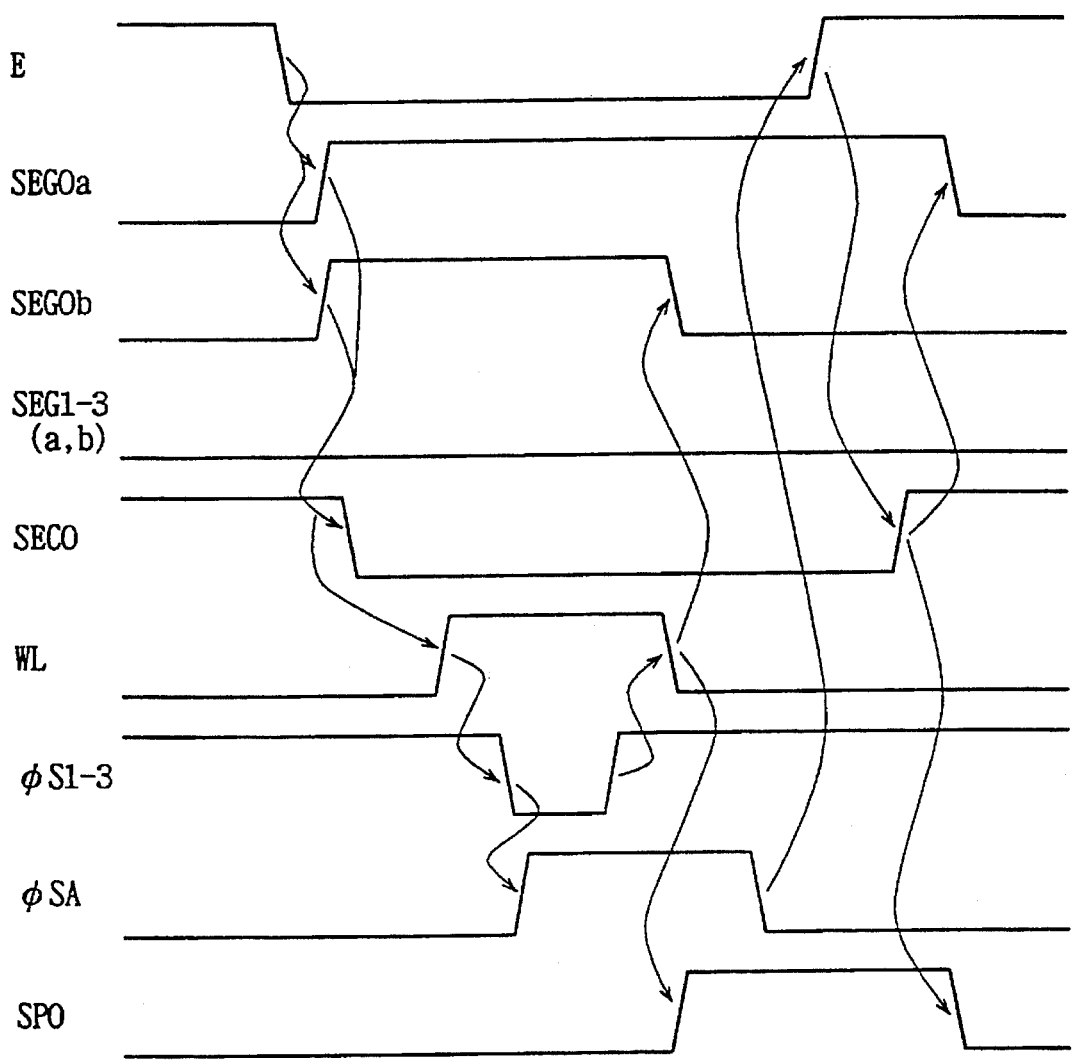
FIG. 19 is a signal waveform diagram showing operation of the semiconductor memory device shown in FIG. 18.

An equalizing transistor EQ which is turned on in response to equalizing signal E is disposed between main bit lines MBLa and MBLb. Now, operation of the structure shown in FIG. 18 will be described below with reference to an operation waveform diagram of FIG. 19.

It is assumed that memory cell MC in memory block B#0 is to be selected. Upon start of the memory access, equalizing signal E first falls to the low level, so that equalizing transistor EQ is turned off. Then, in accordance with an applied address signal, segment select signals SEG0a and SEG0b first rise to the high level. Thereby, sub-bit lines SBL0a and SBLb0 are connected to main bit lines MBLa and MBLb, respectively. Other segment select signals SEG1a–SEG3a and SEG1b–SEG3b each maintain the low level.

Then, section select signal SEC0 is set to the low level, and section select switch SSW0 is turned off. Other section select switches SSW1–SSW3 maintain the on state.

Then, the potential of selected word line WL rises to the high level, so that data of memory cell MC connected to sub-bit line SBLa0 is transmitted to sense amplifier SAa, and data of memory cell MC connected to sub-bit line SBLb is transmitted to sense amplifier SAb. After transmission of memory cell data to sense amplifiers SAa and SAb, connection control signals φS1–φS3 are set to the low level, and sense amplifiers SAa and SAb are isolated from main bit lines MBLa and MBLb. In this state, balance is maintained between capacitances at sense nodes of each of sense amplifiers SAa and SAb. Then, sense amplifier activation signal φSA is activated, and thus sense amplifiers SAa and SAb perform the sensing operation.

Then, writing or reading of data into or from memory cell is performed. Then, connection control signals φS1–φS3 attain the high level again, and the signal potential latched by sense amplifier SAa is restored into memory cell MC connected to sub-bit line SBLa0, and the signal potential latched by sense amplifier SAb is restored into memory cell MC connected to sub-bit line SBLb0. After completion of the restoring, the potential of word line WL falls to the low level, and the restoring is completed.

When the potential of selected word line WL falls to the low level after completion of the restoring operation, segment select signal SEG0b falls to the low level, and switching signal SP0 rises to the high level. Thereby, sub-bit line SBLb0 is isolated from sense amplifier SAb, and is connected to sense amplifier SAa. Sense amplifier SAa is still active, and sub-bit line SBLb0 is driven to the signal potential level complementary to that of sub-bit line SBLa0. In this state, balance is maintained between bit line capacitances of sense amplifier SAa, and balance is also maintained between bit line capacitances of sense amplifier SAb.

After deactivation of sense amplifier activation signal φSA, equalizing signal E is raised to the high level. At this time, section select signal SEC0 is still low. Thereby, the potentials of sub-bit lines SBLa0 and SBLb0 are equalized to the intermediate potential. Likewise, main bit lines MBLa and MBLb are equalized to the intermediate potential. Thereafter, section select signal SEC0 rises to the high level. Then, segment select signal SEG0a falls to the low level, and switching signal SP0 falls to the low level.

Owing to a series operations described above, even if balance is not maintained between the capacitances of the selected hierarchical bit line pairs, sense amplifiers SAa and SAb are not affected by the imbalance between the capacitances during the sensing operation, and thus the sensing operation can be performed stably.

In the equalizing operation, the equalizing is performed after balancing the capacitances of the hierarchical bit lines with respect to the sense amplifiers, so that the sub-bit lines and main bit lines can be surely equalized to the intermediate level.

Also according the structure shown in FIG. 18, data of the memory cells connected to the parallel sub-bit lines in one memory cell array are read to be sensed and amplified. Therefore, influence by noises such as substrate noise and cell plate noise can be surely canceled, and thus the sensing operation can be performed accurately.

Then, operation of the second embodiment will be briefly described below.

Figure 20A:
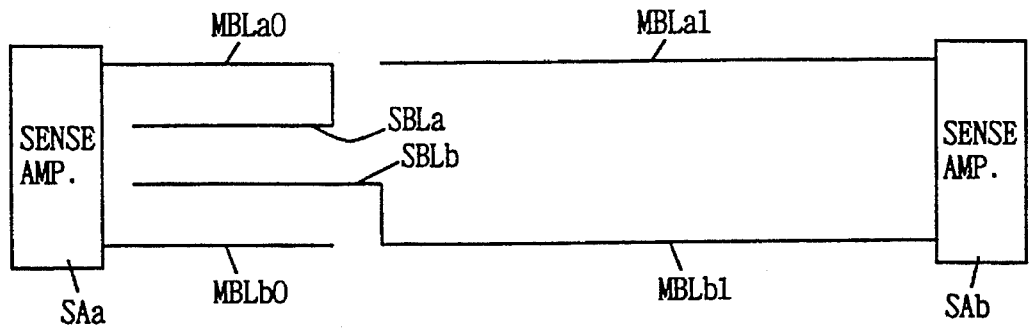
FIGS. 20A–20D schematically show operation of the semiconductor memory device of the second embodiment of the invention.

As shown in FIG. 20A, when the word line is selected, sub-bit line SBLa is connected to sense amplifier SAa via divided main bit line MBLa0, and sub-bit line SBLb is connected to sense amplifier SAb via divided main bit line MBLb1. In this state, balance between the bit line capacitances with respect to sense amplifier SAa is not kept. Likewise, balance between the bit line capacitances with respect to sense amplifier SAb is not kept.

Figure 20B:
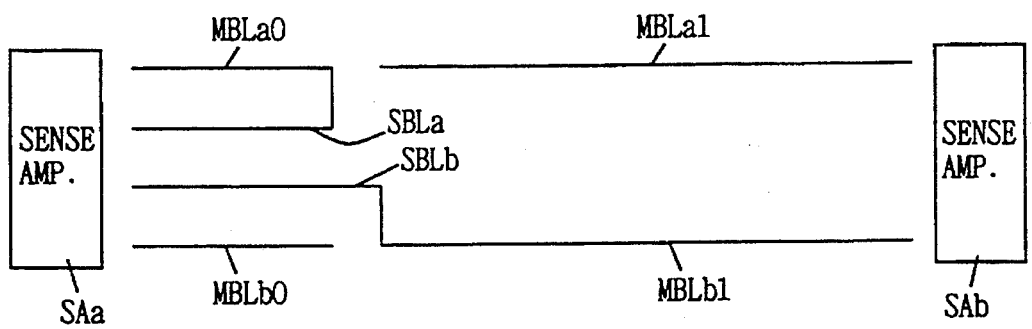

As shown in FIG. 20B, in the sensing operation, sense amplifiers SAa and SAb are isolated from divided main bit lines MBLa0, MBLb0, MBLa1 and MBLb1. In this state, sense amplifiers SAa and SAb perform the sensing operation.

Figure 20C:
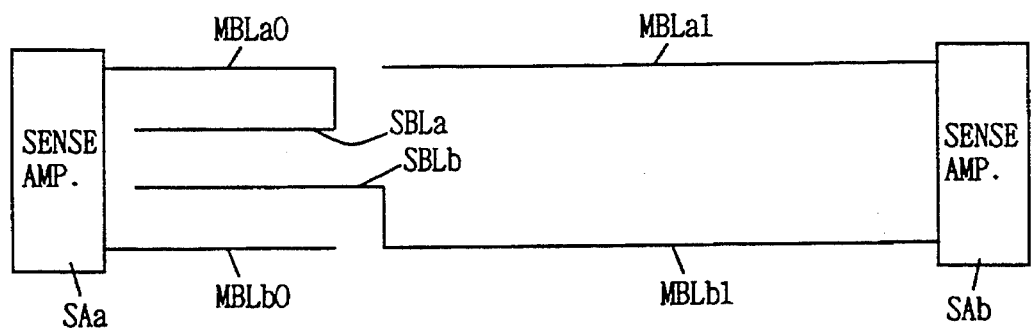

As shown in FIG. 20C, after completion of the sensing operation, sense amplifier SAa is connected to sub-bit line SBLa, and sub-bit line SBLb is connected to sense amplifier SAb, and the restoring is performed.

Figure 20D:
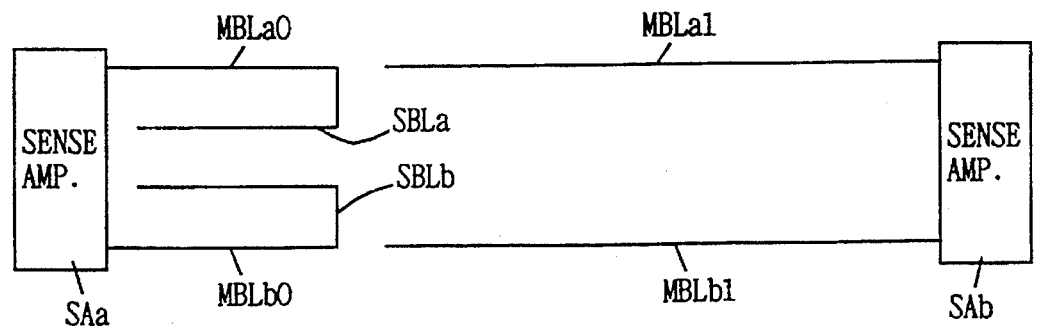

As shown in FIG. 20D, after completion of the restoring, sub-bit line SBLb is connected to divided main bit line MBLb0 while maintaining sense amplifiers SAa and SAb active. In this state, balance between the bit line capacitances with respect to sense amplifier SAa is kept, and balance between the bit line capacitances with respect to sense amplifier SAb is likewise kept.

Figure 21A:
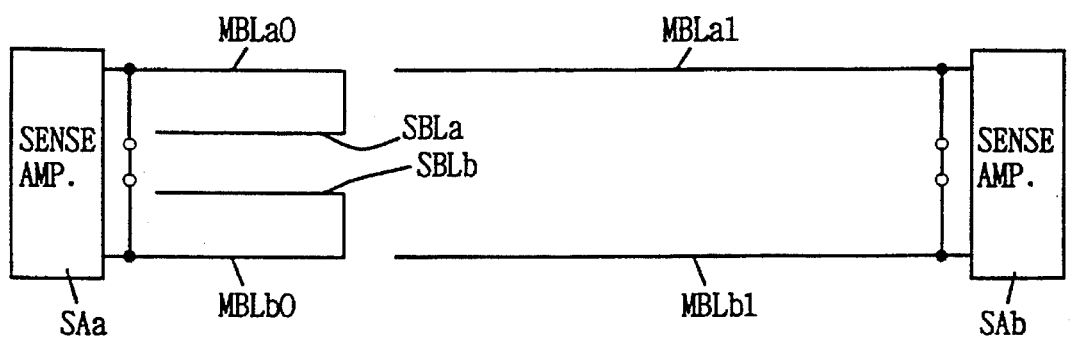
FIGS. 21A and 21B schematically show operation of the semiconductor memory device of the second embodiment of the invention.
Figure 21B:
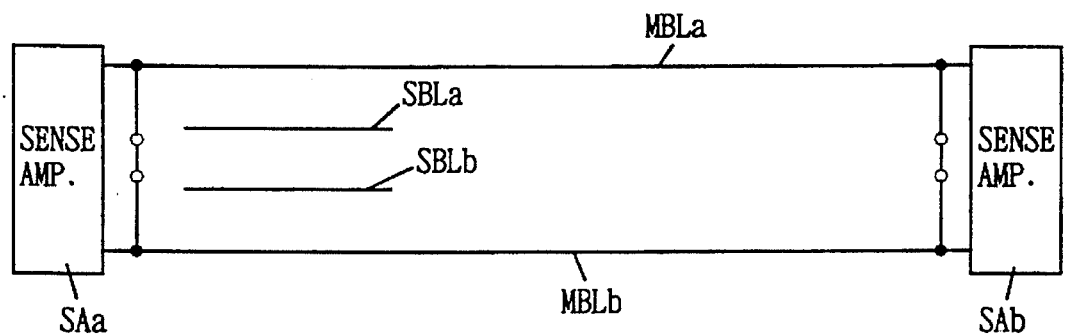

Then, as shown in FIG. 21A, sense amplifiers SAa and SAb are deactivated. In this state, the signal potentials of divided main bit line MBLb0 and sub-bit line SBLb are complementary to the signal potentials of divided main bit line MBLa0 and sub-bit line SBLa. In this state, equalizing is performed. Since balance between capacitances of the equalized portions is kept, each of the divided main bit lines and sub-bit lines can be accurately equalized to the intermediate potential. After completion of the equalizing, sub-bit lines SBLa and SBLb are isolated from main bit lines MBLa and MBLb. In this state, main bit lines MBLa and MBLb each function as a single signal line.

By utilizing the above manner of sensing operation, the sensing operation can be performed surely, and a noise margin can be improved remarkably, even if balance between the bit line capacitances is not kept. Also, the intermediate potential can be generated accurately.

[Third Embodiment]

FIGS. 22A, 22B and 22C show a structure of a main portion of a semiconductor memory device of a third embodiment of the invention. More specifically, FIG. 22A shows a structure relating to a pair of main bit lines. In FIG. 22A, the memory cell array is divided into four blocks. Sub-bit lines SBLa0 and SBLb0–SBLa3 and SBLb3 are provided corresponding to the memory cell blocks. The sub-bit lines SBLa0 and SBLb0 are shorter than sub-bit lines SBLa1 and SBLb1. Sub-bit lines SBLa2 and SBLb2 are longer than sub-bit lines SBLa3 and SBLb3. Thus, sub-bit lines which are remoter from sense amplifiers SAa and SAb have longer lengths.

Main bit line MBLa is divided into divided main bit lines MBLa0–MBLa3 by section select switches. Likewise, main bit lines MBLb is divided into divided main bit lines MBLb0–MBLb3 by section select switches. The divided main bit lines increase in length as the positions thereof move away from the sense amplifiers (i.e., correspond to the lengths of sub-bit lines). Sub-bit lines SBLa0–SBLa3 are connected to sense amplifier SAa in accordance with segment select signals SEG0–SEG3, respectively. Sub-bit lines SBLb0–SBLb3 are connected to sense amplifier SAb in accordance with segment select signals SEG0–SEG3, respectively.

As shown in FIG. 22B, it is assumed that the memory cell block nearest to sense amplifier SAa is selected. In this state, sub-bit line SBLa0 is connected to sense amplifier SAa, and sub-bit line SBLb0 is connected to sense amplifier SAb. It is assumed that sub-bit lines SBLa0 and SBLb0 each have a stray capacitance of CBs1. It is also assumed that main bit lines MBLa and MBLb have a total stray capacitance of CBM. The bit line capacitance with respect to sense amplifier SA is substantially only the stray capacitance of sub-bit line SBLa0 in the case shown in FIG. 22B, and thus is substantially equal to CBS1. Meanwhile, the bit line capacitance with respect to sense amplifier SAb is equal to the sum of stray capacitances of sub-bit line SBLb0 and main bit line MBLb. In this case, the stray capacitance is equal to CBS1+CBM.

As shown in FIG. 22C, it is assumed that sub-bit lines SBLa2 and SBLb2 are selected. In this case, sub-bit line SBLa2 is connected to sense amplifier SAa, and sub-bit line SBLb is connected to sense amplifier SAb. Since sub-bit lines SBLa2 and SBLb2 are connected to substantially central portions of the main bit lines, the bit line capacitance with respect to each of sense amplifiers SAa and SAb is equal to CBs2+(CBM/2). Here, CBs2 is the stray capacitance of each of sub-bit lines SBLa2 and SBLb2.

It is now assumed that the stray capacitance CBs1 is ½ of the stray capacitance of an ordinary sub-bit line (the ordinary sub-bit lines having the same length in all memory cell blocks). In this case, according to the structure shown in FIG. 22B, the bit line stray capacitance with respect to sense amplifier SAb can be smaller by CBsb/2 than that in the conventional arrangement. Thus, the maximum bit line capacitance with respect to sense amplifier SAb can be small, and the read voltage can be made large. Likewise, the bit line capacitance with respect to sense amplifier SAa can be made smaller than that of the conventional structure.

As shown in FIG. 22C, when sub-bit lines SBLa2 and SBLb2 at the central portion are connected to the main bit lines, the capacitances are substantially equal to those of the conventional arrangement. Thus, in the structure including the four divided memory cell blocks, the stray capacitance CBs2 is equal to 1.5.CBsb. CBsb is the stray capacitance of the sub-bit line in the conventional arrangement. In this case, the bit line stray capacitances with respect to sense amplifiers SAb and SAa each are CBs2+(CBM/2). In the central portion, as sub-bit lines SBLa and SBLb are long, the stray capacitance is larger by CBsb/2 than that in the conventional arrangement. The length of each of sub-bit lines SBLa2 and SBLb2 is 1.5 times as large as that in the conventional arrangement. As compared with the maximum bit line capacitance in the conventional arrangement, the following relationship is obtained:

$$CBsb+CBM-(1.5.CBsb+0.5.CBM)=(CBM-CBsb)/2$$

According to the formula used for the description in connection with FIG. 17, the capacitance CMB of the main bit line can be expressed as follows:

$$CBM=n.CBmb=n.CBsb/k$$

Therefore, the above formula can be changed into $(n-k).CBsb/2.k$.

Therefore, if n>k, the bit line capacitance at the central portion can be made smaller than that in the conventional arrangement. In the structure described above, it is assumed that the sub-bit line at the central portion is 1.5 times as long as that in the conventional structure. However, if the length of the sub-bit line at the central portion is further reduced, the maximum value of the bit line capacitance can be significantly smaller than that in the conventional arrangement.

As described above, the length of the sub-bit line increases as its position goes toward the center in the column direction, whereby the maximum value of the bit line capacitance with respect to the sense amplifier can be made small even if the bit line capacitance with respect to the sense amplifier changes, and the read voltage can be made large. Therefore, the sensing operation margin can be significantly and sufficiently increased.

The structure shown in FIGS. 22A, 22B and 22C can be applied to any structure including main bit lines which have different lengths depending on the position of the word lines to be selected.

The structure in which the sub-bit lines have different lengths depending to the positions of memory cell column blocks can be utilized together with the structures of the embodiments 1 to 3 already described.

[Embodiment 4]

Figure 23:
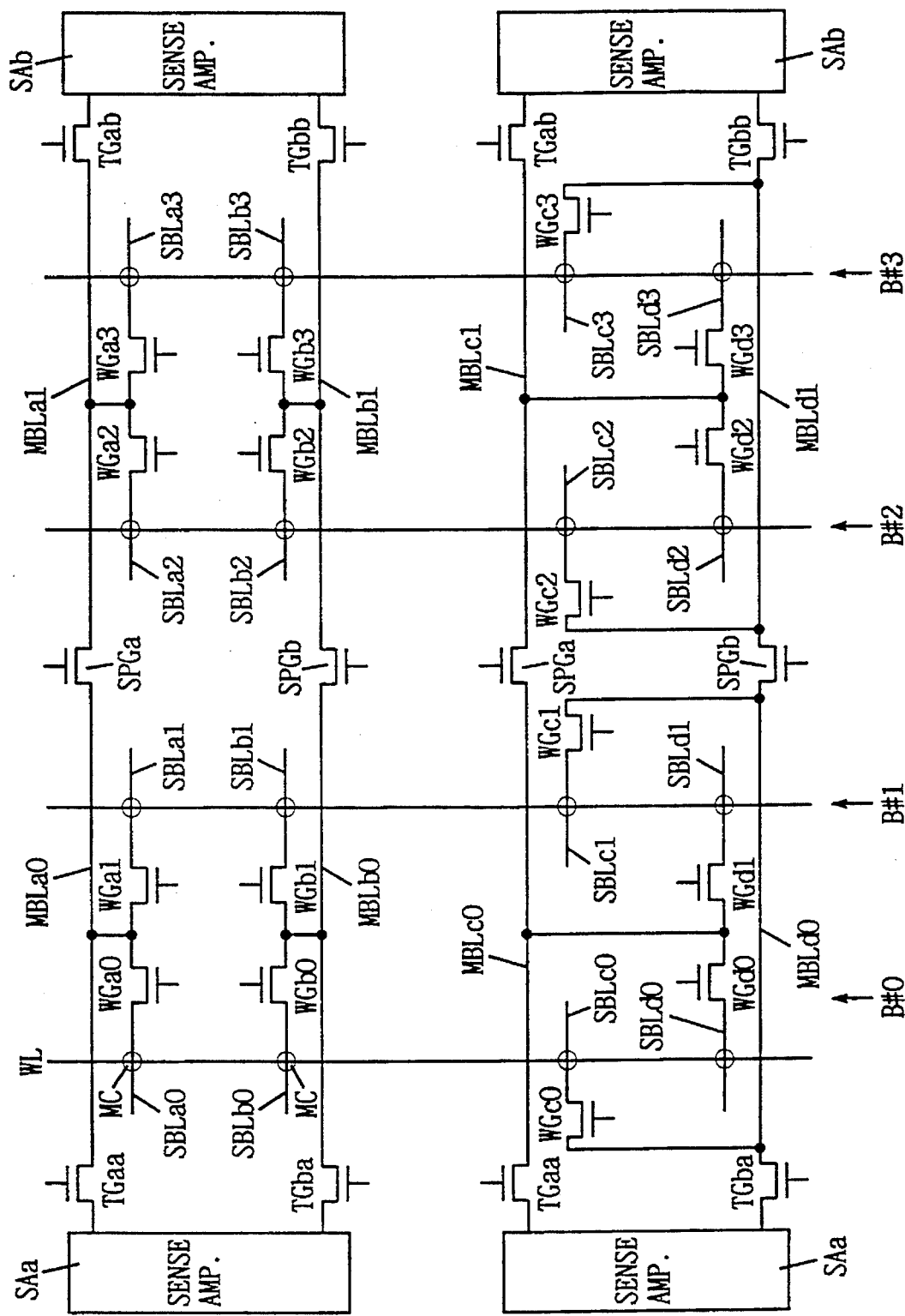
FIG. 23 shows a structure of a main portion of a semiconductor memory device of a fourth embodiment of the invention.

FIG. 23 shows a structure of a main portion of a semiconductor memory device of a fourth embodiment of the invention. FIG. 23 representatively shows a structure relating to memory cells arranged in four columns. The structure shown in FIG. 23 provides a modification to that shown in FIG. 1, and names or reference characters indicating control signals are not shown in the figure for simplicity reasons. Control signals similar to those shown in FIG. 1 are applied to the structure in FIG. 23.

In FIG. 23, main bit lines are arranged corresponding to the respective columns of memory cells. Separation transistor SPGa or SPGb is disposed at a central portion of main bit line MBL ("MBL" generally indicates one main bit line). This separation switch divides main bit line MBL into two portions. In FIG. 23, divided main bit lines MBLa0 and MBLa1–MBLd0 and MBLd1 are shown.

Each column of the memory cells is divided into four blocks B#0–B#3. In each column of memory cell blocks, there are provided sub-bit lines SBL ("SBL" generally indicates the respective sub-bit lines). Dynamic memory cells MC are arranged corresponding to the crossings of sub-bit lines SBL and word lines WL.

In the first column of memory cells, sub-bit lines SBLa0–SBLa3 are connected to divided main bit lines MBLa0 or MBLa1 via block select gates WGa0–WGa3, respectively.

For the memory cells in the second column, there are provided sub-bit lines SBLb0–SBLb3. Sub-bit lines SBLb0 and SBLb1 are connected to divided main bit line MBLb0 via block select gates WGb0 and WGb1, respectively. Sub-bit lines SBLb2 and SBLb3 are connected to divided main bit line MBLb1 via block select gates WGb2 and WGb3, respectively. The sub-bit lines adjoining to each other in the column direction are provided at their adjacent ends with the block select gates, so that the contact for connecting the block select gates to the divided main bit line can be commonly used, and thus a layout area can be made small.

For the memory cells in the third column, there are provided sub-bit lines SBLc0–SBLc3. Sub-bit lines SBLc0 and SBLc1 are connected to divided main bit line MBLd0 via block select gates WGc0 and WGc1, respectively. Sub-bit lines SBLc2 and SBLc3 are connected to divided main bit line MBLd1 via block select gates WGc2 and WGc3, respectively.

For the memory cells in the fourth column, there are provided sub-bit lines SBLd0–SBLd3. Sub-bit lines SBLd0 and SBLd1 are connected to divided main bit line MBLc0 via block select gates WGd0 and WGd1, respectively. Sub-bit lines SBLd2 and SBLd3 are connected to divided main bit line MBLc1. Block select gates WGci and WGdi (i=0–3) are disposed at ends of sub-bit lines SBLci and SBLdi which are remote from each other. By switching the connection of block select gates with mask interconnections, crossings are formed between the hierarchical bit lines without requiring an additional area.

Figure 24A:
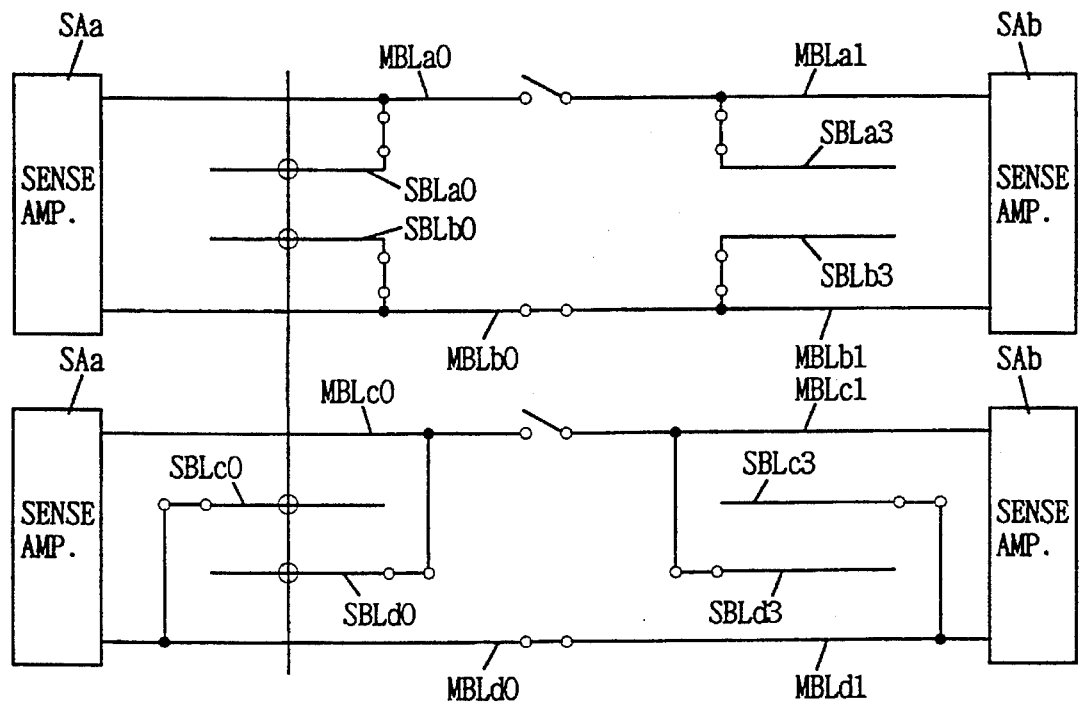
FIGS. 24A and 24B show operation of the semiconductor memory device shown in FIG. 23.

FIG. 24A shows a connection mode of sub-bit lines, divided main bit lines and sense amplifiers in the arrangement shown in FIG. 23 where the word line in memory cell block B#0 is selected. As shown in FIG. 24A, sub-bit line SBLa0 is connected to one of sense nodes of sense amplifier SAa shown on the left side via divided main bit line MBLa0. Sub-bit line SBLa3 is connected to one of sense nodes of sense amplifier SAb on the right side via divided main bit line MBLa1. Sub-bit lines SBLb0 and SBLb3 are connected to the other sense node of sense amplifier SAa via divided main bit line MBLb0, and are connected to the other sense node of sense amplifier SAb via divided main bit line MBL1.

Sub-bit lines SBLc0 and SBLc3 are connected to divided main bit lines MBLd0 and MBLd1, and hence are connected to the other nodes of sense amplifiers SAa and SAb shown in right and left sides, respectively. Sub-bit line SBLd0 is connected to the one sense node of sense amplifier SAa via divided main bit line MBLc0. Sub-bit line SBLd3 is connected to the other sense node of sense amplifier SAb via divided main bit line MBLc1.

In the figure, when memory cell block B#0 is selected, the block select signal for memory cell block B#3 rises to the high level. However, it is necessary only to select simultaneously two memory cell blocks at opposite sides of the separation gate, and such a structure may be employed that the block select signals for memory cell blocks B#0 and B#2 simultaneously rise to the high level.

Figure 24B:
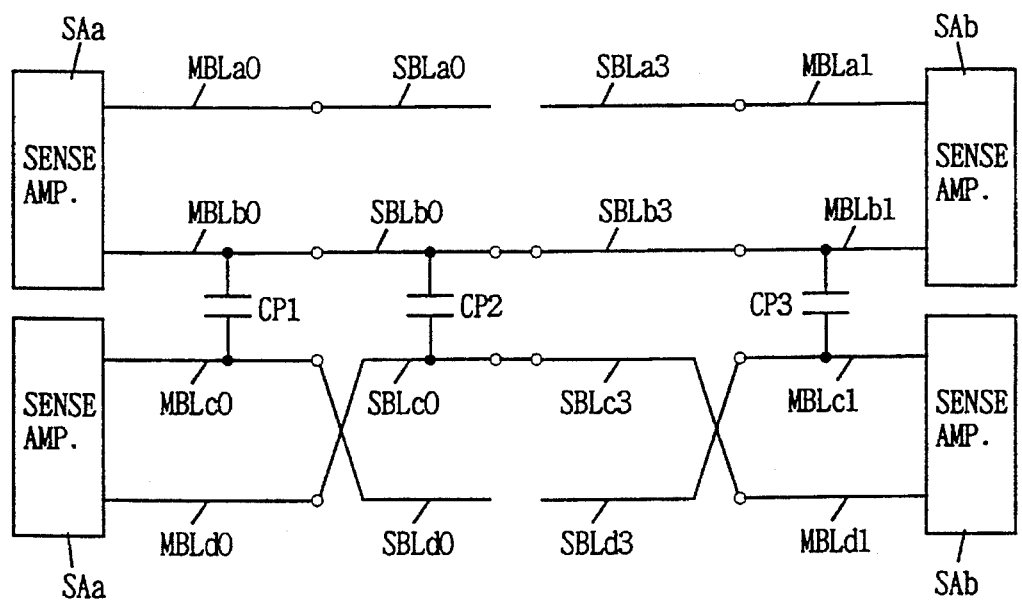

FIG. 24B shows an electrically equivalent circuit of the connection between the divided main bit lines and sub-bit lines shown in FIG. 24A. The main bit line and sub-bit line are generally formed of different interconnection layers. The main bit line is formed of an upper level interconnection layer, and the sub-bit line is formed of a lower level interconnection layer. The sub-bit line and the main bit line overlap with each other in a plan view, or are formed with the same pitch. Therefore, a coupling capacitance exists between adjacent hierarchical bit lines. In FIG. 24B, a coupling capacitance CP1 exists between divided main bit line MBLc0 and divided main bit line MBLb0. A coupling capacitance CP2 exists between sub-bit lines SBLb0 and SBLb3 and sub-bit lines SBLc0 and SBLc3, and a coupling capacitance CP3 exists between divided main bit lines MBLb1 and MBLc1. If the separation transistor is located at a position equally dividing the main bit line into two portions, capacitance CP1 is equal to capacitance CP3.

If a crossing is not provided, sub-bit line is connected to one main bit line, so that the coupling capacitance with respect to divided main bit line MBLc0 is CP1+(CP2/2). A similar coupling capacitance is obtained with respect to divided main bit line MBLc1. As is clearly shown in FIG. 24B, however, the coupling capacitances existing with respect to divided main bit lines MBLc0 and MBLc1 are CP1 and CP3, respectively, and contribution by the sub-bit lines can be suppressed as compared with the case where the crossing is not provided. Thereby, it is possible to suppress the influence on divided main bit lines MBLc0 and MBLc1 by the capacitive coupling noises which are caused by the adjacent hierarchical bit lines due to the capacitive coupling.

Similarly, the coupling capacitances with respect to divided main bit lines MBLd0 and MBLd1 are CP2. Therefore, it is also possible to suppress the influence on divided main bit lines MBLd0 and MBLd1 by the capacitive coupling noise which is caused by the adjacent hierarchical bit lines due to the capacitive coupling, and thus the stable sensing operation can be performed. At the same time, capacitive coupling noises of the same phase occur in divided main bit line MBLc0 and sub-bit line SBLc0 due to coupling capacitances CP1 and CP2. Sense amplifier SAa differentially amplifies the signal potentials of divided main bit lines MBLc0 and MBLd0, so that the capacitive coupling noises of the same phase cancel each other, and thus the sensing operation can be surely performed without influence by noises due to the capacitive coupling.

[Embodiment 5]

Figure 25:
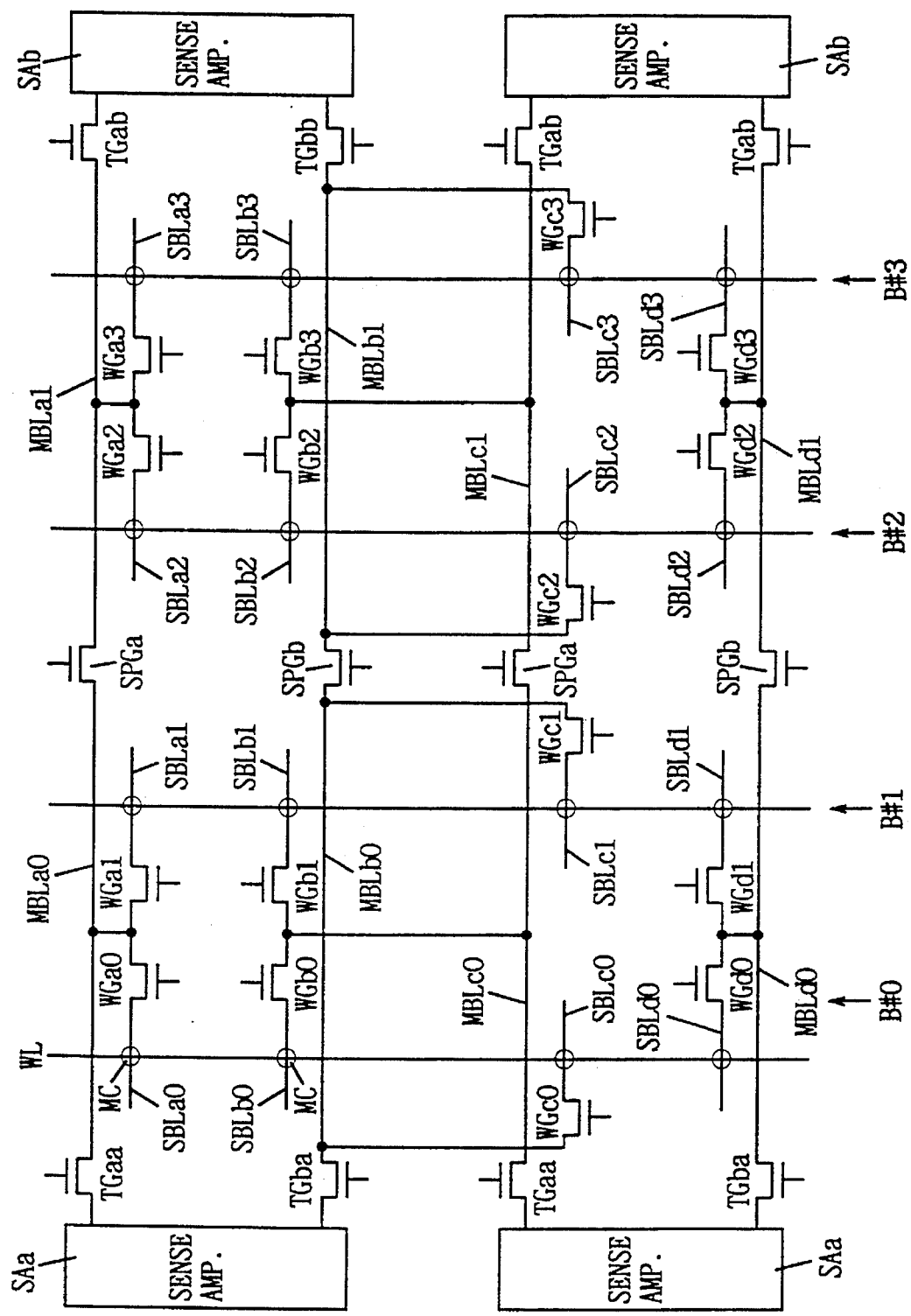
FIG. 25 shows a structure of a main portion of a semiconductor memory device of a fifth embodiment of the invention.

FIG. 25 shows a structure of a main portion of a semiconductor memory device according to a fifth embodiment of the invention. FIG. 25 shows a structure relating to memory cells arranged in four columns. The structure shown in FIG. 25 is modification of that shown in FIG. 1. The portions corresponding to those in FIG. 1 bear the same reference characters, and will not be described below. Also in FIG. 25, control signals applied to the respective gates are not shown for simplicity reasons.

Referring to FIG. 25, sub-bit lines SBLa0 and SBLa1 are connected to divided main bit line MBLa0 via block select gates WGa0 and WGa1, respectively. Sub-bit lines SBLa2 and SBLa3 are connected to divided main bit line MBLa1 via block select gates WGa2 and WGa3, respectively.

Sub-bit lines SBLb0 and SBLb1 are connected to divided main bit line MBLc0 via block select gates WGb0 and WGb1, respectively. Sub-bit lines SBLb2 and SBLb3 are connected to divided main bit line MBLc1 via block select gates WGb2 and WGb3, respectively.

Sub-bit lines SBLc0 and SBLc1 are connected to divided main bit line MBLb0 via block select gates WGc0 and WGc1, respectively. Sub-bit lines SBLc2 and SBLc3 are connected to divided main bit line MBLb1 via block select gates WGc2 and WGc3, respectively.

Sub-bit lines SBLd0 and SBLd1 are connected to divided main bit line MBLd0 via block select gates WGd0 and WGd1, respectively. Sub-bit lines SBLd2 and SBLd3 are connected to divided main bit line MBLd1 via block select gates WGd2 and WGd3, respectively.

In the arrangement shown in FIG. 25, the memory cells in four columns are used as one unit, and the sub-bit lines provided for the memory cells in one of the inner two columns are connected to the divided main bit line provided for the other of the inner two columns. By switching or selecting the connection at the block select gates, crossings can be easily provided at the hierarchical bit lines.

Figure 26A:
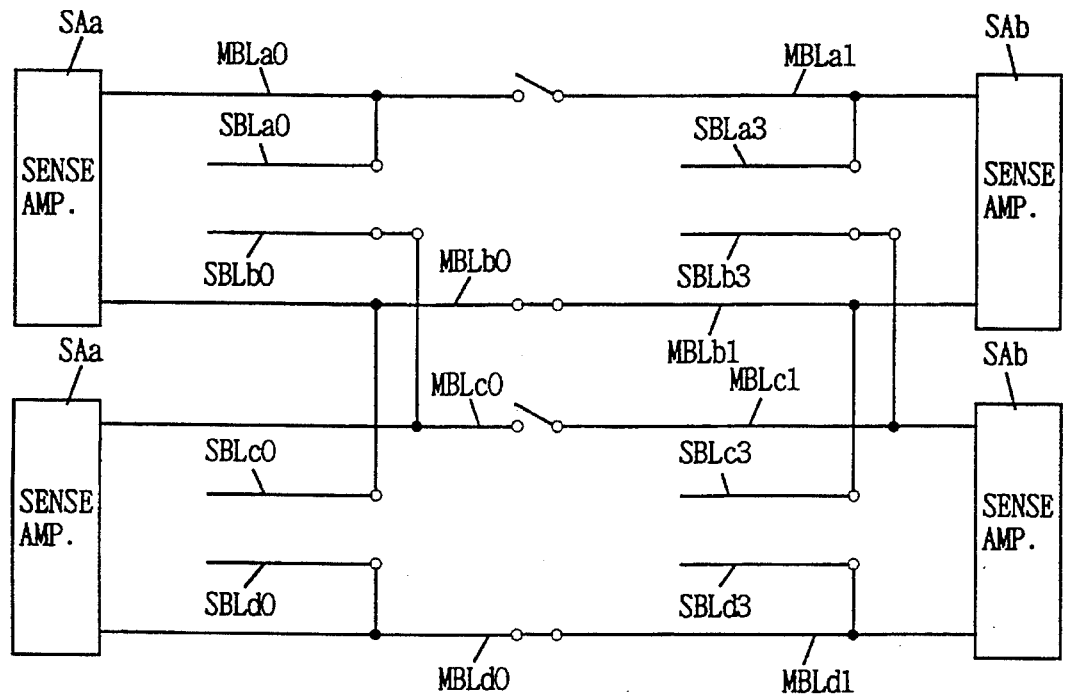
FIGS. 26A and 26B show operation of the semiconductor memory device shown in FIG. 25.

FIG. 26A shows a connection mode of the sub-bit lines and main bit lines at the time of selection of the memory cell in memory cell block B#0. In FIG. 26A, sub-bit lines SBLa0 and SBLa3 are connected to divided main bit lines MBLa0 and MBLa1, respectively. Divided main bit lines MBLa0 and MBLa1 are isolated from each other.

Sub-bit lines SBLb0 and SBLb3 are connected to divided main bit lines MBLc0 and MBLc1, respectively. Divided main bit lines MBLc0 and MBLc1 are isolated from each other. Sub-bit lines SBLc0 and SBLc3 are connected to main bit lines MBLb0 and MBLb1, respectively. Divided main bit lines MBLb0 and MBLb1 are electrically connected together. Sub-bit lines SBLd0 and SBLd3 are connected to divided main bit lines MBLd0 and MBLd1, respectively. Divided main bit lines MBLd0 and MBLd1 are electrically connected together. Data of the selected memory cells are transmitted onto sub-bit lines SBLa0, SBLb0, SBLc0 and SBLd0.

Figure 26B:
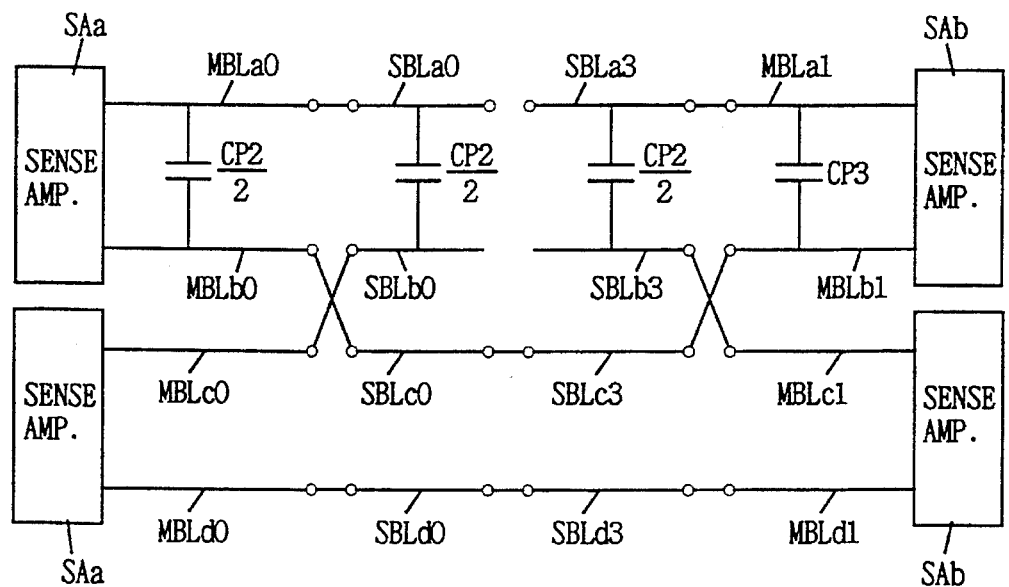

FIG. 26B shows an electrically equivalent circuit in connection with connection between sub-bit lines and main bit lines in FIG. 26A. As shown in FIG. 26B, a crossing exists at connections between divided main bit lines MBLb0 and MBLc0 and sub-bit lines SBLb0 and SBLc0. A crossing also exists at connections between sub-bit lines SBLb3 and SBLc3 and divided main bit lines MBLb1 and MBLc1.

Coupling capacitance CP1 exists between divided main bit line MBLb0 and divided main bit line MBLc0, coupling capacitance CP3 exists between divided main bit lines MBLb1 and MBLc1, and coupling capacitances of CP2/2 exist between sub-bit lines SBLb0 and SBLc0 and between sub-bit lines SBLb3 and SBLc3. In this structure, bit lines MBLb0, SBLc0, SBLc3 and MBLb1 as well as bit lines MBLc0, SBLb0, SBLb3 and MBLb1 have the coupling capacitances which are smaller by the coupling capacitance CP2 of the sub-bit line than that in the structure having no crossings at these bit lines. Therefore, it is possible to suppress surely the influence by the capacitive coupling noises caused by the coupling capacitance at the hierarchical bit line pair connected to paired sense amplifiers SAa and SAb, which ensures the stable sensing operation. Further, the capacitive coupling noises caused by the coupling capacitance between adjacent bit lines act to cancel each other at the bit line portions having the crossings, so that the capacitive coupling noises can be surely suppressed, and thus, the influence by the capacitive coupling noise between adjacent bit lines can be surely suppressed.

[Modification 1]

Figure 27:
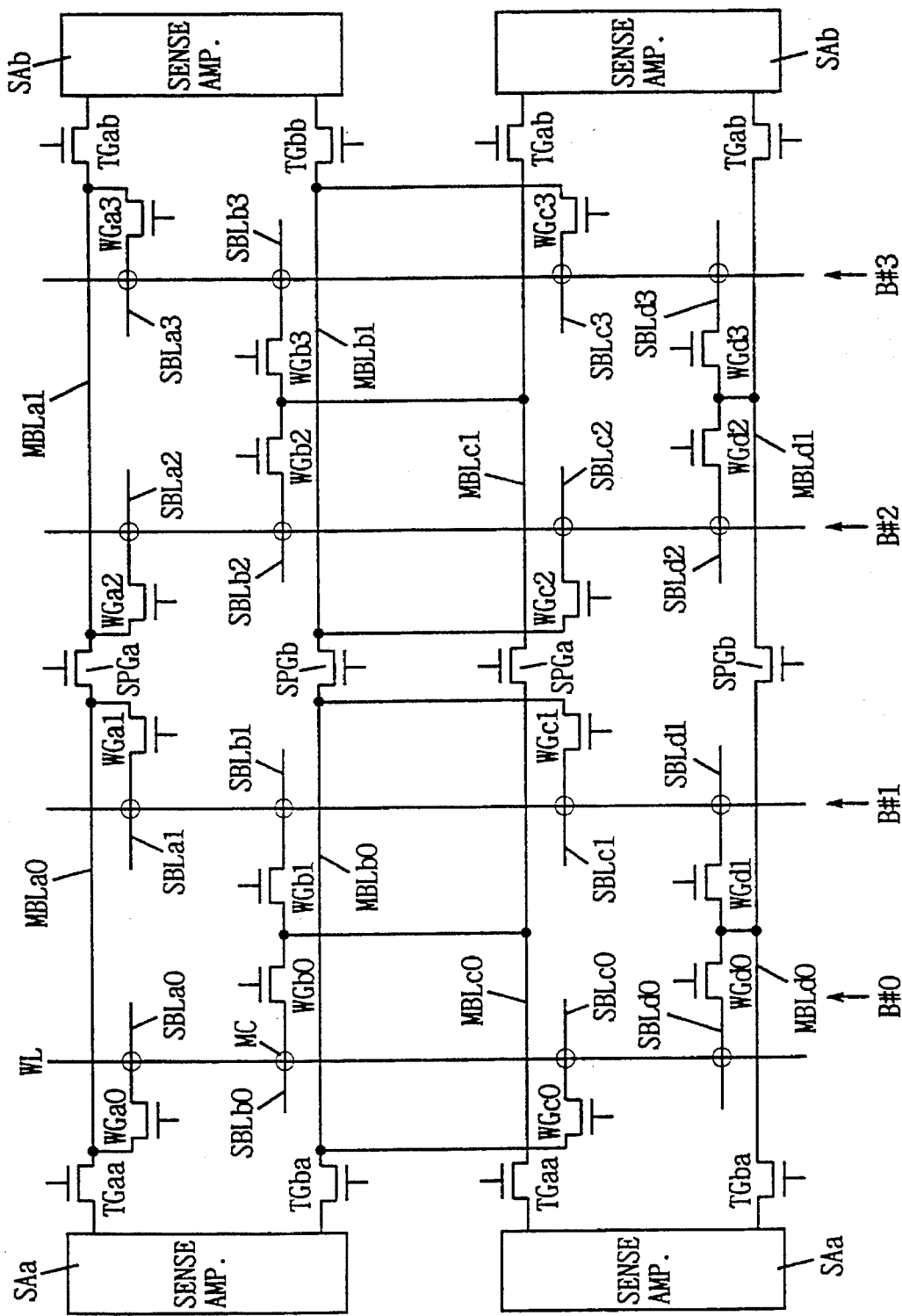
FIG. 27 shows a structure of a main portion of a modification of the semiconductor memory device of the fifth embodiment of the invention.

FIG. 27 shows a first modification of the fifth embodiment. The structure shown in FIG. 27 is formed by modifying the structure shown in FIG. 25. Similar modification can also be applied to the structure shown in FIG. 23.

In FIG. 27, sub-bit lines SBLa0 and SBLa1 are provided at ends remote from each other with block select gates WGa0 and WGa1, respectively. Likewise, sub-bit lines SBLa2 and SBLa3 are provided at ends remote from each other with block select gates WGa2 and WGa3, respectively. Sub-bit lines SBLb0 and SBLb1 are provided at their adjacent ends with block select gates WGb0 and WGb1, respectively. Sub-bit lines SBLb2 and SBLb3 are provided at their adjacent ends with block select gates WGb2 and WGb3, respectively. Sub-bit lines SBLc0–SBLc3 and SBLd0–SBLdd3 are provided with block select gates in a similar arrangement. When employing the arrangement shown in FIG. 27, the memory cells in two columns form one unit of the layout pattern, and the same layout patterns are repetitively arranged along the word line extending direction. Only forms of connection of the block select gates are different in these layout patterns.

In the paired memory cell columns, each block select gate is not aligned to another block select gate in the word line extending direction, so that a sufficiently large layout area can be used for each block select gate, and thus conditions of the pitch of block select gates are relaxed, facilitating design of the layout.

[Embodiment 6]

In the embodiments described above, both the true and complementary main bit lines are divided and the sense amplifiers at the opposite sides perform the sensing operation. However, the above structure for performing the sensing operation may be combined with the structure in which only one of the paired main bit lines is divided. This achieves the formation of crossings without increasing the area, ensuring the accurate sensing operation.

Figure 28:
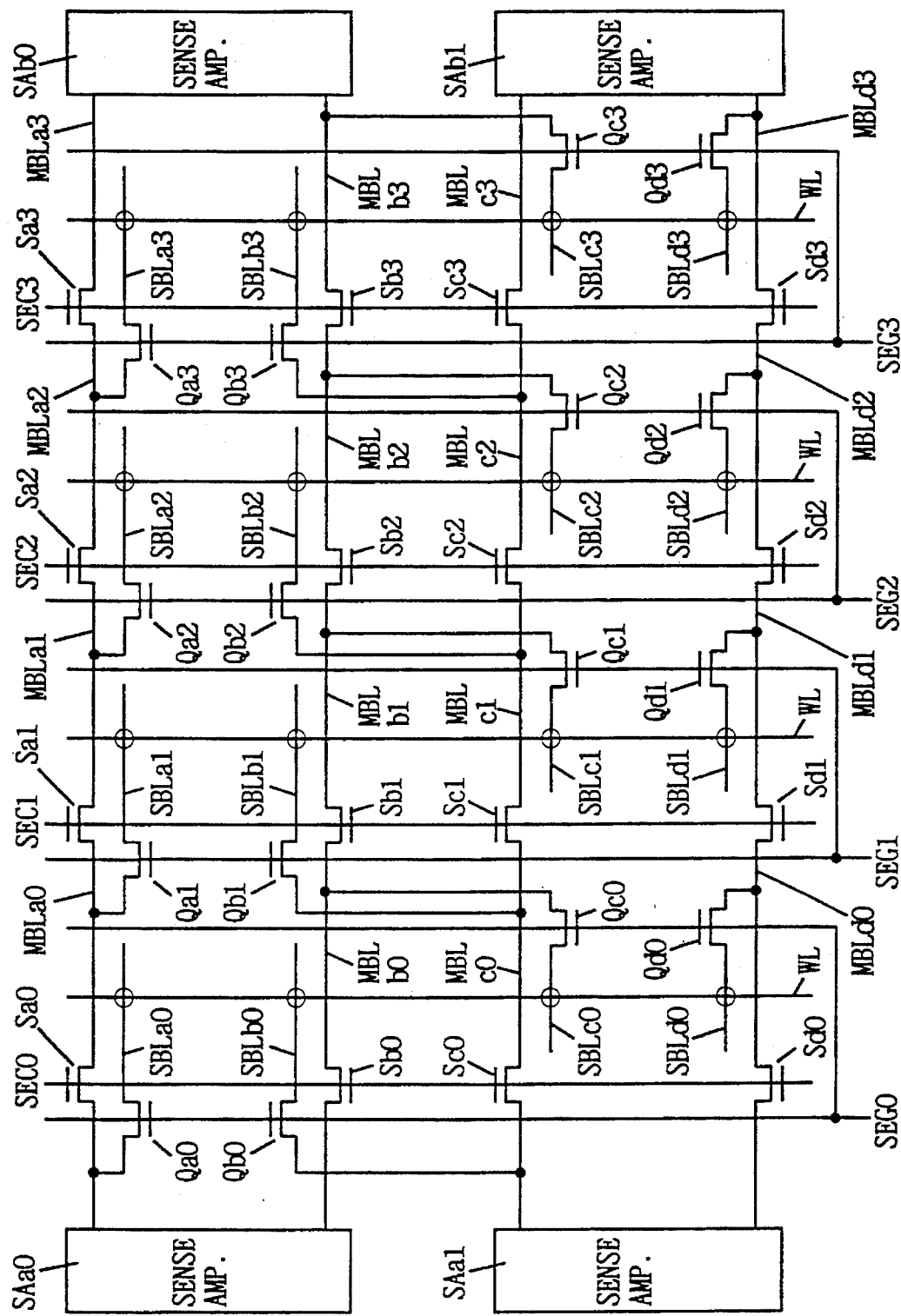
FIG. 28 shows a structure of a main portion of a semiconductor memory device of a sixth embodiment of the invention.

FIG. 28 shows a structure of a main portion of a semiconductor memory device of a sixth embodiment of the invention. FIG. 28 shows a structure for memory cells arranged in four columns. Each column of the memory cells is divided into four memory blocks. Sub-bit line SBL is provided corresponding to each column block. Memory cells MC are provided corresponding to crossings of sub-bit lines SBL ("SBL" generally indicates the respective sub-bit lines) and word line WL. When the word line is selected, data of memory cells are transmitted to the sub-bit lines which are adjacent to each other along the word line.

Main bit line MBL is provided corresponding to each memory cell column. Main bit line MBL is divided into four divided main bit lines corresponding to the column blocks of memory cells. Main bit line MBLa is divided into four divided main bit lines MBLa0–MBLa3 by section select gates Sa0–Sa3 which are turned off in response to section select signals SEC0–SEC3, respectively. Main bit line MBLb is likewise divided into four divided main bit lines MBLb0–MBLb3 by section select gates Sb0–Sb3, respectively. Each of main bit lines MBLc and MBLd is divided into four divided main bit lines MBLc0–MBLc3 or MBLd0–MBLd3 by section select gates Sc0–Sc3 or Sd0–Sd3.

Sub-bit lines SBLa0–SBLa3 are connected to the adjacent divided main bit lines in the corresponding main bit line via block select gates Qa0–Qa3, which are turned on in response to block select signals SEGi (i=0–3), respectively. For example, sub-bit line SBLa1 is connected to divided main bit line MBLa0 via block select gate Qa1. In this structure, section select signal SEC1 attains the low level, so that data on sub-bit line SBLa1 is sensed and amplified by sense amplifier SAa.

Sub-bit lines SBLb0–SBLb3 are connected to divided main bit lines MBLc(i–1) in the adjacent main bit line via block select gates Qb0–Qb3, respectively, which are turned on in response to segment select signals SEGi. Sub-bit line SBLb0 is connected to a sense node of sense amplifier SAa1 provided corresponding to the adjacent column pair via block select gate Qb0.

Sub-bit lines SBLc0–SBLc3 are connected to divided main bit lines MBLb0–MBLb3 in the adjacent main bit line via block select gates Qc0–Qc3, respectively, which are turned on in response to segment select signals SEGi.

Sub-bit lines SBLd0–SBLd3 are connected to divided main bit lines MBLd0–MBLd3 in the corresponding main bit line via block select gates Qd0–Qd3, which are turned on in response to segment select signals SEG0–SEG3, respectively. Also in the arrangement shown in FIG. 28, crossings can be formed at the hierarchical bit lines without providing an additional region.

Figure 29A:
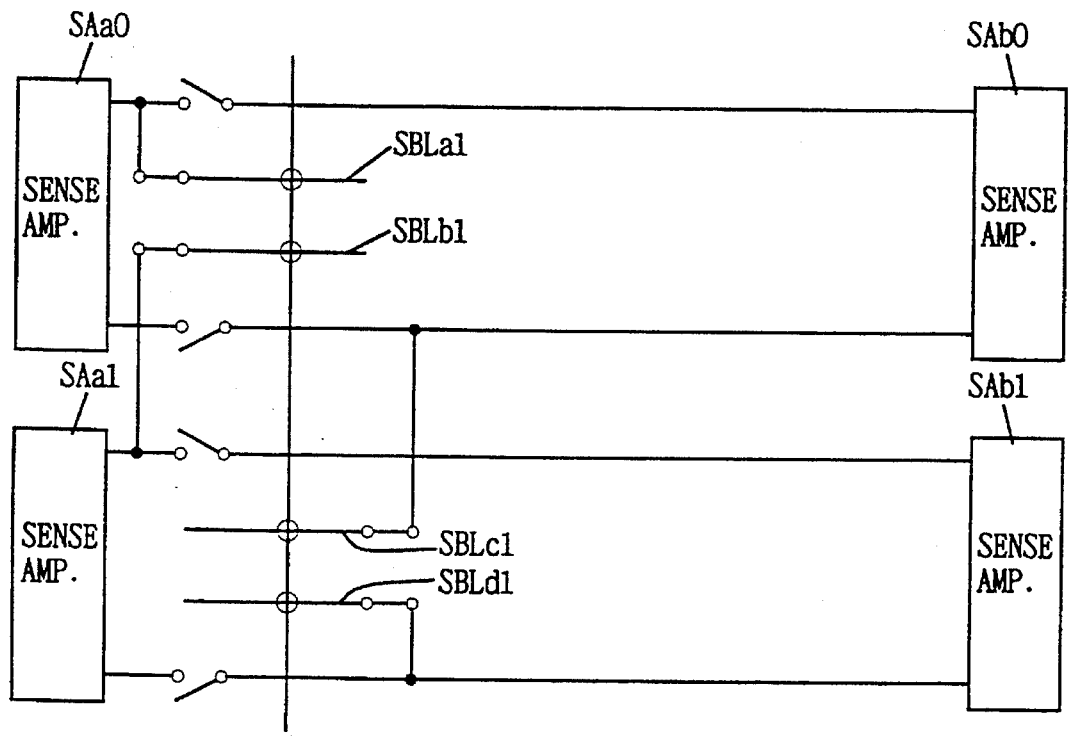
FIGS. 29A and 29B show operation of the semiconductor memory device shown in FIG. 28.

FIG. 29A schematically shows a connection mode of the sub-bit lines and main bit lines at the time when segment select signal SEG1 is high and section select signal SEC1 is low. As shown in FIG. 29A, sub-bit lines SBLa1, SBLb1, SBLc1 and SBLd1 are selected. Sub-bit line SBLa1 is connected to sense amplifier SAa0. Sub-bit line SBLb1 is connected to sense amplifier SAa1. Sub-bit line SBLc1 is connected to sense amplifier SAb0. Sub-bit line SBLd1 is connected to sense amplifier SAb1.

Figure 29B:
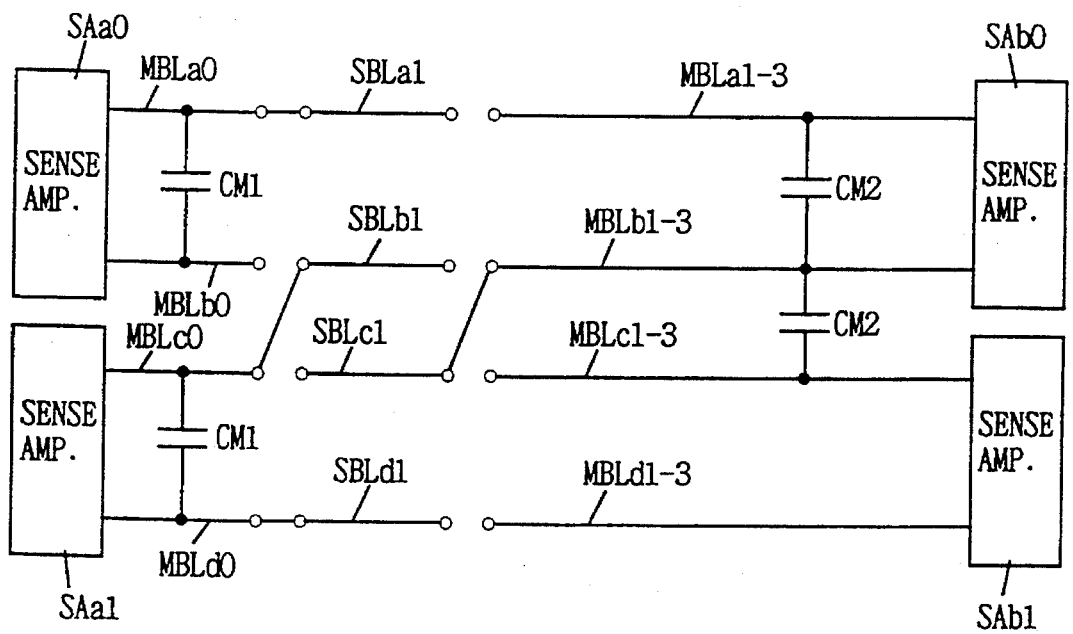

FIG. 29B shows an electrically equivalent circuit of the connection shown in FIG. 29A. As shown in FIG. 29B, divided main bit line MBLa0 and sub-bit line SBLa1 as well as divided main bit line MBLb0 are connected to the respective sense nodes of sense amplifier SAa0. Divided main bit line MBLc0 and sub-bit line SBLb1 are connected to one of the sense nodes of sense amplifier SAa1, and divided main bit line MBLd0 and sub-bit line SBLd1 are connected to the other sense node thereof.

Sense amplifier SAb0 is connected at one of its sense nodes to divided main bit lines MBLa1–MBLa3 and is also connected at the other sense node to sub-bit lines SBLc1 and divided main bit lines MBLb1–MBLb3. Sense amplifier SAb1 is connected to divided main bit lines MBLc1–MBLc3 and divided main bit lines MBLd1–MBLd3. A coupling capacitance CM1 exists between divided main bit lines MBLa0 and MBLb0, and a coupling capacitance CM2 exists between divided main bit lines MBLa1–MBLa3 and divided main bit lines MBLb1–MBLb3. In this case, the coupling capacitance with respect to each divided main bit line is reduced by a magnitude corresponding to the coupling capacitance between sub-bit lines. Thereby, it is possible to reduce not only the coupling capacitance between adjacent bit lines but also the coupling capacitance between paired bit lines, which enables the stable sensing operation.

[Modification]

Figure 30:
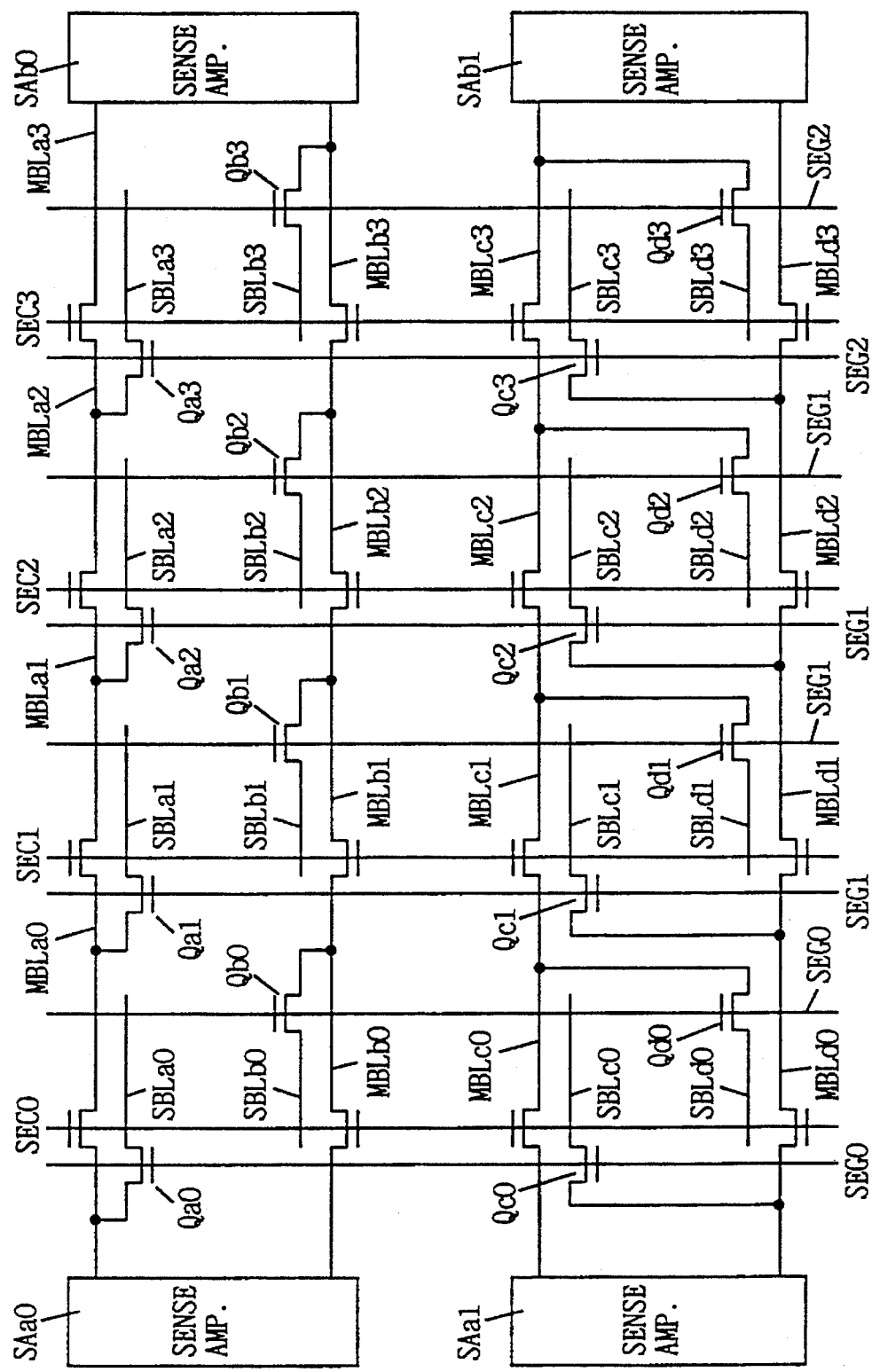
FIG. 30 shows modification of the semiconductor memory device shown in FIG. 28.

FIG. 30 shows a modification of the sixth embodiment. Memory cells are arranged in the same manner as the structure shown in FIG. 27. In the arrangement shown in FIG. 30, paired sub-bit lines are provided with block select gates Q at their ends remote from each other. Thus, in the word line extending direction, the block select gates in the alternate columns are aligned to each other. This mitigates the pitch conditions of the block select gates.

Sub-bit lines SBLa1–SBLa3 are connected to divided main bit lines MBLa0–MBLa2 via block select gates Qa1–Qa3, respectively. Sub-bit line SBLa0 is connected to the sense node of sense amplifier SAa0 via block select gate Qa0. Sub-bit lines SBLb0–SBLb3 are connected to divided main bit lines MBLb0–MBLb3 via block select gates Qb0–Qb3, respectively.

Sub-bit lines SBLc1–SBLc3 are connected to divided main bit lines MBLd0–MBLd2. Sub-bit line SBLc0 is connected to the sense node of sense amplifier SAa1 via block select gate Qc0. Sub-bit lines SBLd0–SBLd3 are connected to divided main bit lines MBLc0–MBLc3, respectively. Also in the arrangement shown in FIG. 30, bit line crossings can be formed by altering the bit lines to which the block select gates is connected.

Figure 31A:
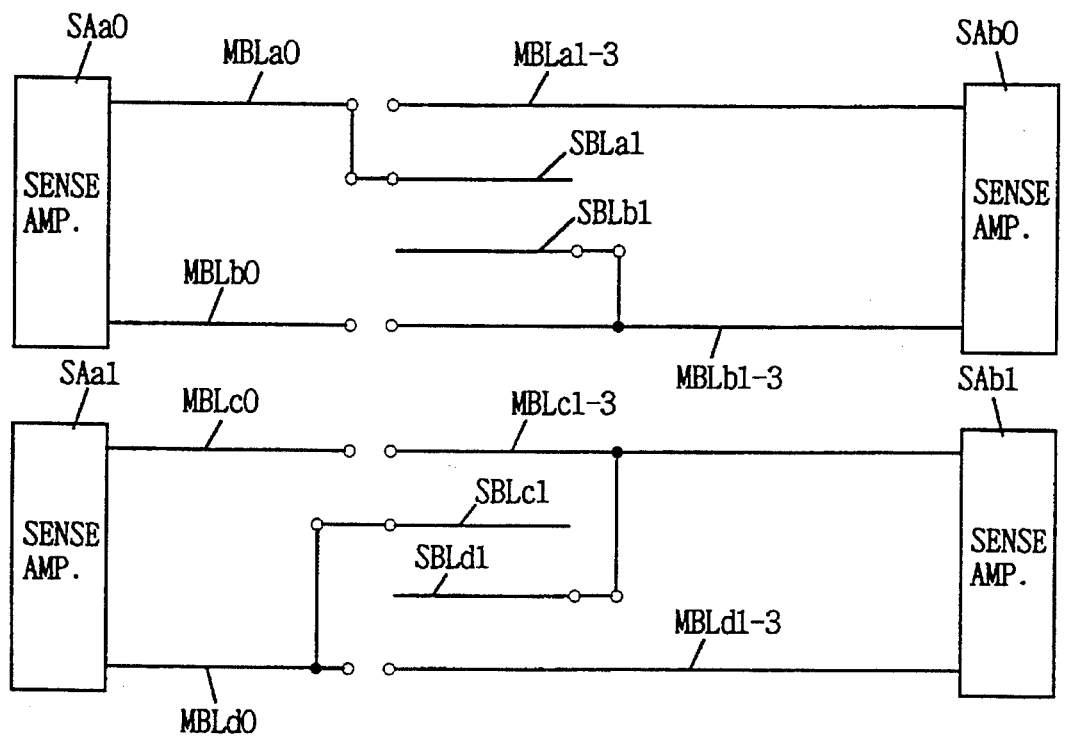
FIGS. 31A and 31B show operation of the semiconductor memory device shown in FIG. 30.
Figure 31B:
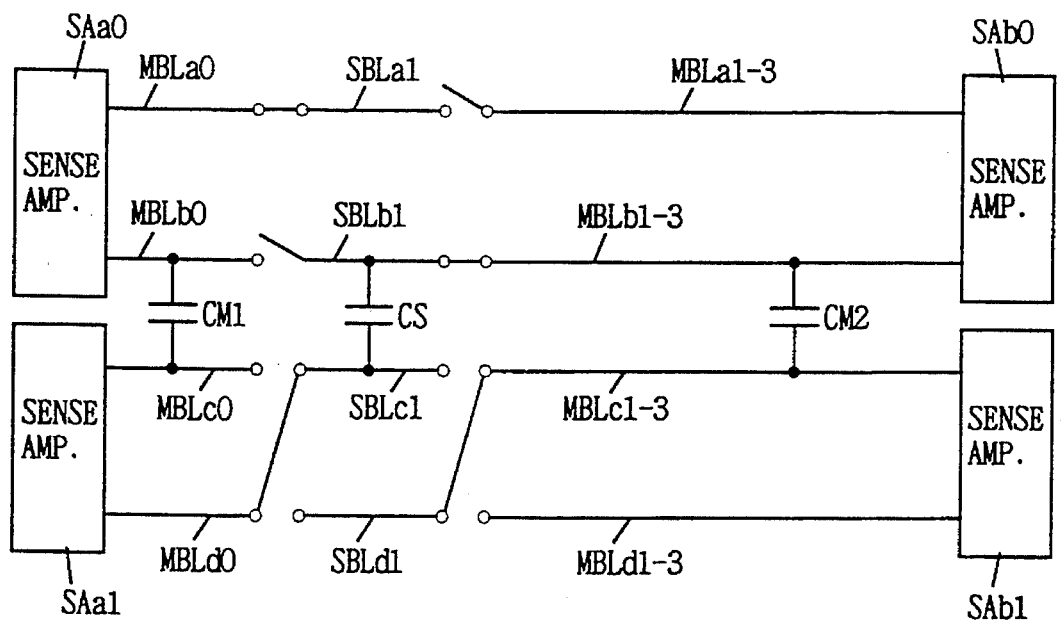

FIGS. 31A and 31B show connection between the sub-bit lines and main bit lines at the time when section select signal SEC is low and segment select signal SEG1 is high.

More specifically, FIG. 31A schematically shows a connection mode of sub-bit lines and main bit lines. As shown in FIG. 31A, sub-bit line SBLa1 is connected to one of sense nodes of sense amplifier SAa0 via main bit line MBLa0. Divided main bit lines MBLa1–MBLa3 are connected to one of sense nodes of sense amplifier SAb0. Divided main bit line MBLb0 is connected to the other sense node of sense amplifier SAa0. Sub-bit line SBLb1 and divided main bit lines MBLb1–MBLb3 are connected to the other sense node of sense amplifier SAb0. Sense amplifier SAa1 is connected at one of its sense nodes to divided main bit line MBLc0 and is connected at the other sense node to divided main bit line MBLd0 and sub-bit line SBLc1. Sense amplifier SAb1 is connected at one of its sense nodes to sub-bit line SBLb1 and divided main bit lines MBLc1–MBLc3 and is connected at the other sense node to divided main bit lines MBLd1–MBLd3.

As shown in FIG. 31B, the coupling capacitance between the adjacent hierarchical bit lines is reduced by a magnitude corresponding to the coupling capacitance between the sub-bit lines. Also in this case, therefore, it is possible to suppress the influence by noises caused by the coupling capacitance between bit lines, and thus the sensing operation can be performed stably. In the structure shown in FIG. 31B, it is possible to suppress the influence by noises not only between the adjacent hierarchical bit lines but also between hierarchical bit line pairs. The problem related to imbalance between the bit line capacitances with respect to sense amplifiers is overcome by isolating the bit lines from the sense amplifiers during the sensing operation.

[Embodiment 7]

Figure 32:
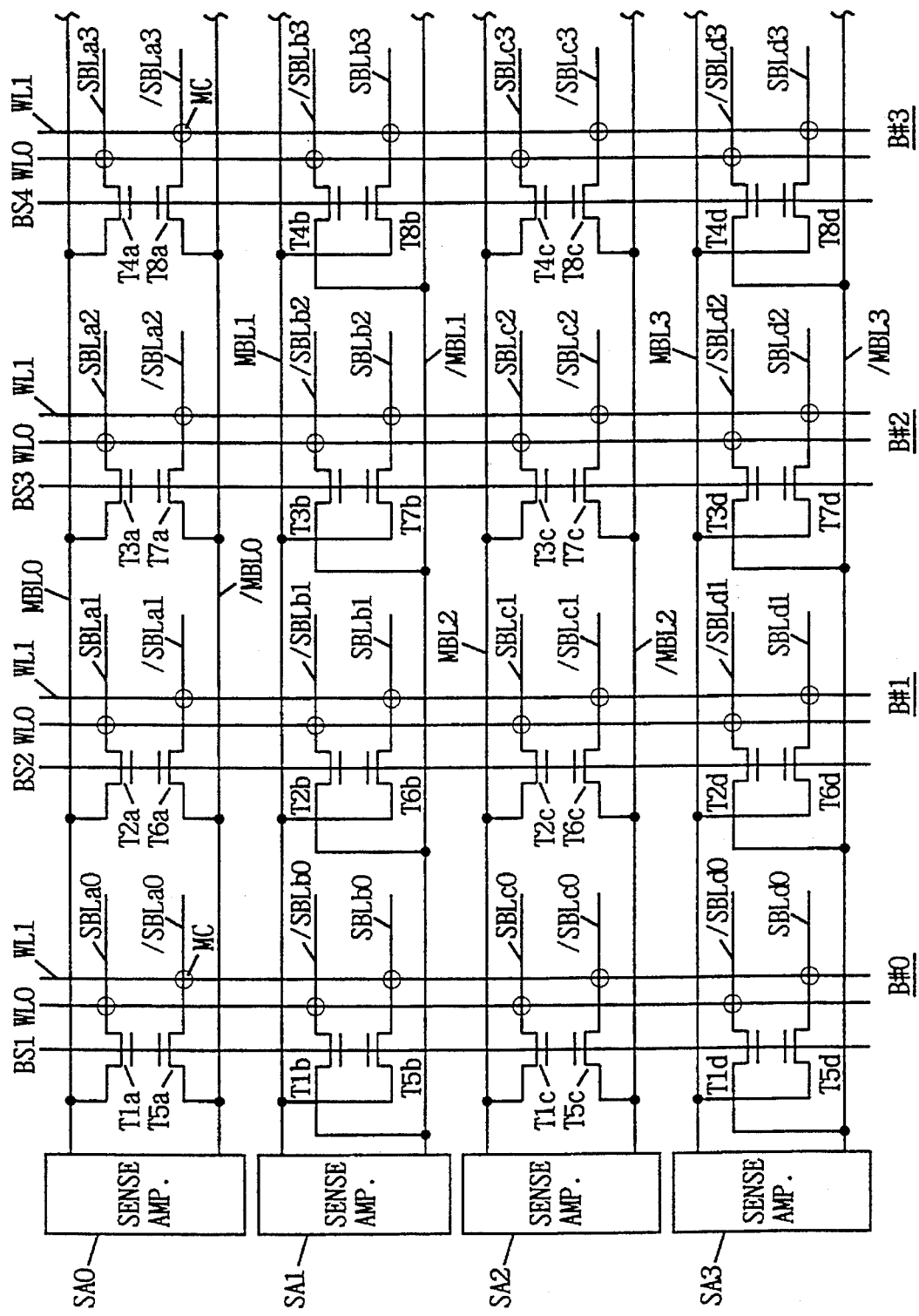
FIG. 32 shows a structure of a main portion of a semiconductor memory device of a seventh embodiment of the invention.

FIG. 32 shows a structure of a main portion of a semiconductor memory device of a seventh embodiment of the invention. More specifically, FIG. 32 shows the structure related to memory cells arranged in four columns. The memory cells in each column is divided into a plurality of column blocks. In FIG. 32, four memory cell blocks B#0–B#are representatively shown. Sub-bit line pair SBL and SBL is provided corresponding to each memory cell column block. Here, reference characters "SBL" and "/SBL" generally indicate the respective sub-bit likes. Memory cells MC are provided corresponding to crossings of word lines and sub-bit lines SBL (SBLa0–SBLa3, ... , SBLd0–SBLd3) or sub-bit lines /SBL (/SBLa0–/SBLa3, ... , /SBLd0–/SBLd3). Thus, in the arrangement shown in FIG. 32, the sub-bit lines have the "folded bit line structure". Main bit line pairs MBL0 and /MBL0–MBL3 and /MBL3 are provided corresponding to the memory cell columns, respectively. Sense amplifiers SA0–SA3 are provided corresponding to main bit line pairs MBL0 and /MBL0–MBL3 and /MBL3, respectively. Each of sense amplifiers SA0–SA3 senses and amplifies memory cell data using one of corresponding paired main bit lines MBL and /MBL as a reference hierarchical bit line.

For the memory cells forming the first row, sub-bit lines SBLa0–SBLa3 are connected to main bit line MBL0 via block select gates T1a–T4a, respectively. Sub-bit lines /SBLa0–/SBLa3 are connected to the complementary main bit line /MBL0 via block select gates T5a–T8a, respectively. Block select gate pairs T1a and T5a–T4a and T8a receive block select signals BS1–BS4, respectively.

For the memory cells forming the second column, sub-bit lines /SBLb0–/SBLb3 disposed on the upper side in the figure are connected to complementary main bit line /MBL1 via block select gates T1b–T4b, respectively. Sub-bit lines SBLb0–SBLb3 on the lower side in the figure are connected to main bit line MBL1 via block select gates T5b–T8b, respectively.

For the memory cells forming the third column, sub-bit lines SBLc0–SBLc3 on the upper side in the figure are connected to main bit line MBL2 via gates T1c–T4c, respectively. Sub-bit lines /SBLb0–/SBLb3 on the lower side in the figure are connected to complementary main bit line /MBL2 via gates T5c–T8c, respectively.

For the memory cells forming the fourth column, sub-bit lines /SBLd0–/SBLd3 on the upper side in the figure are connected to complementary main bit line /MBL3 via block select gates T1d–T4d, respectively. Sub-bit lines SBLd0–SBLd3 are connected to main bit line MBL3 via gates T5d–T8d, respectively. Thus, the block select gates are disposed in such a manner that a connection mode of the sub-bit lines and main bit lines in one column extending along the bit line is different from that in the adjacent column and is the same as those in the alternate columns. In this structure, the main bit lines are disposed in the order of positive main bit line MBL and complementary main bit line /MBL. Meanwhile, the sub-bit lines are disposed in the order of true sub-bit line SBL, complementary sub-bit line /SBL, complementary sub-bit line /SBL, true sub-bit line SBL, complementary sub-bit line /SBL, complementary sub-bit line /SBL and true sub-bit line SBL. Then, operation will be briefly described below.

In the arrangement shown in FIG. 32, one memory cell block is selected in accordance with block select signal BSi (i=0–3). Sub-bit lines SBL and /SBL contained in the column block thus selected are connected to main bit lines MBL and /MBL, respectively. Data of the selected memory cell is transmitted onto sub-bit line SBL and main bit line MBL, or complementary sub-bit line /SBL and complementary main bit line /MBL. Thereafter, sense amplifier SA is activated to sense and amplify the memory cell data using the main bit line and sub-bit line, which does not receive the data, as the reference hierarchical bit line. Thereafter, writing or reading of data is performed. Then, restoring is performed. At this time, the block select signal may be raised to a boosted level, and the potential of word line may be boosted. Then, the sense amplifier is deactivated, so that an equalizing transistor (not shown) is turned on to equalize the potentials of main bit lines and sub-bit lines. Thereafter, the block select signal falls to the low level, and one memory cycle is completed.

Figure 33A:
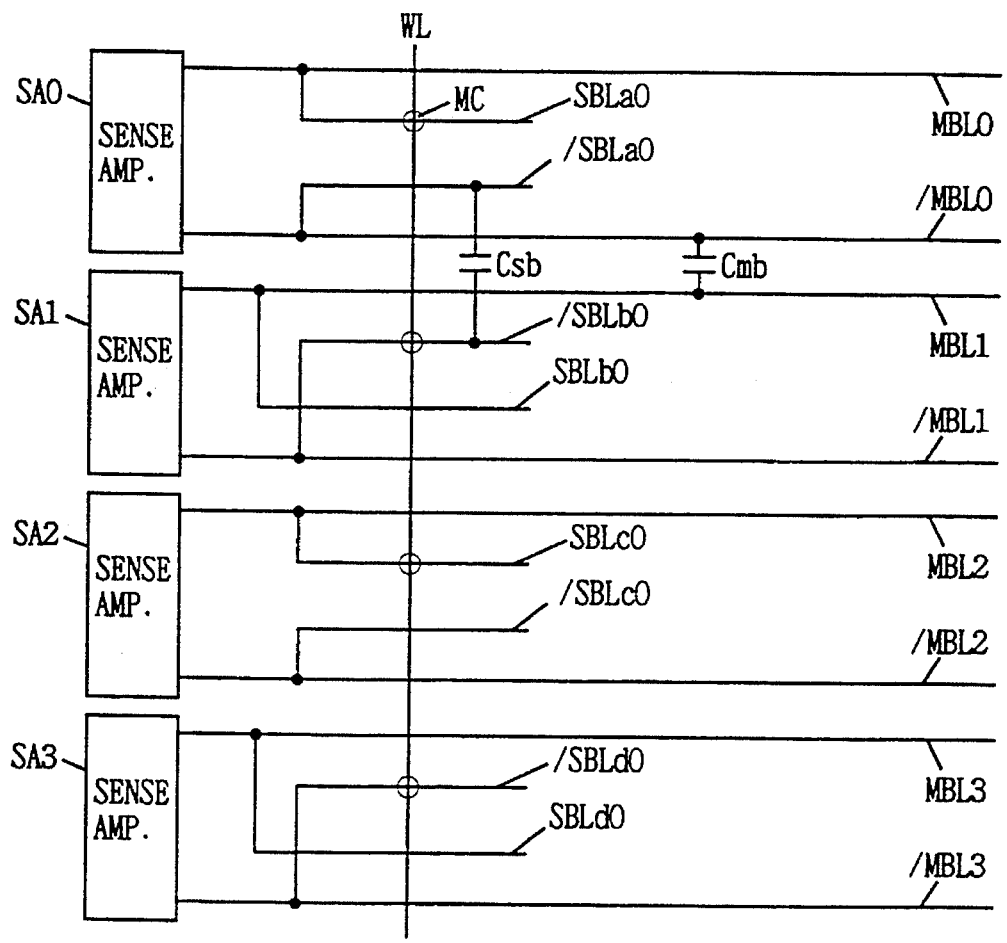
FIGS. 33A and 33B show operation of the semiconductor memory device shown in FIG. 32.

FIG. 33A shows a connection mode of the sub-bit lines and main bit lines at the time when memory cell block B#0 is selected. As shown in FIG. 33A, sub-bit lines SBLa0 and /SBLa0 are connected to main bit lines MBL0 and /MBL0, respectively. Sub-bit lines SBLb0 and /SBLb0 are connected to main bit lines MBL1 and /MBL1, respectively. It is assumed that a selected memory cell MC is connected to a true sub-bit line SBL. In this case, memory cell data is transmitted onto main bit line MBL. Modes of connection of sub-bit lines related to main bit lines MBL2 and /MBL2 as well as MBL3 and /MBL3 are the same as those related to main bit lines MBL0 and /MBL0 as well as MBL1 and /MBL1. Coupling capacitance Csb exists between the adjacent sub-bit lines. Coupling capacitance Cmb exists between the adjacent main bit lines.

Figure 33B:
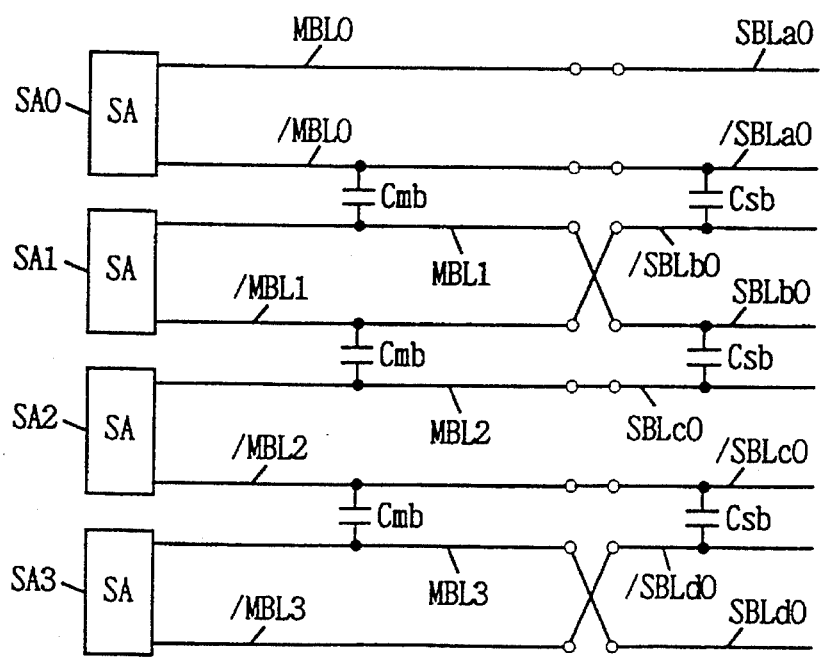

FIG. 33B shows an electrically equivalent circuit of the structure in FIG. 33A. As is apparent from FIG. 33B, crossings are provided at the connections between sub-bit lines and main bit lines in the odd number memory cell columns. As compared with the case where a crossing is not provided, the capacitance between the adjacent bit lines is reduced by a magnitude corresponding to the coupling capacitance between the sub-bit lines. Thereby, generation of noises due to the capacitive coupling can be suppressed, and the sensing operation can be performed stably.

In the odd number columns, the capacitive coupling noises caused between the adjacent bit lines are applied as the noises of the same phase to both the main bit lines. Therefore, during the sensing operation of sense amplifier, influences by the noises caused by the capacitive coupling can be surely canceled, and thus the sensing operation can be performed accurately.

Figure 34A:
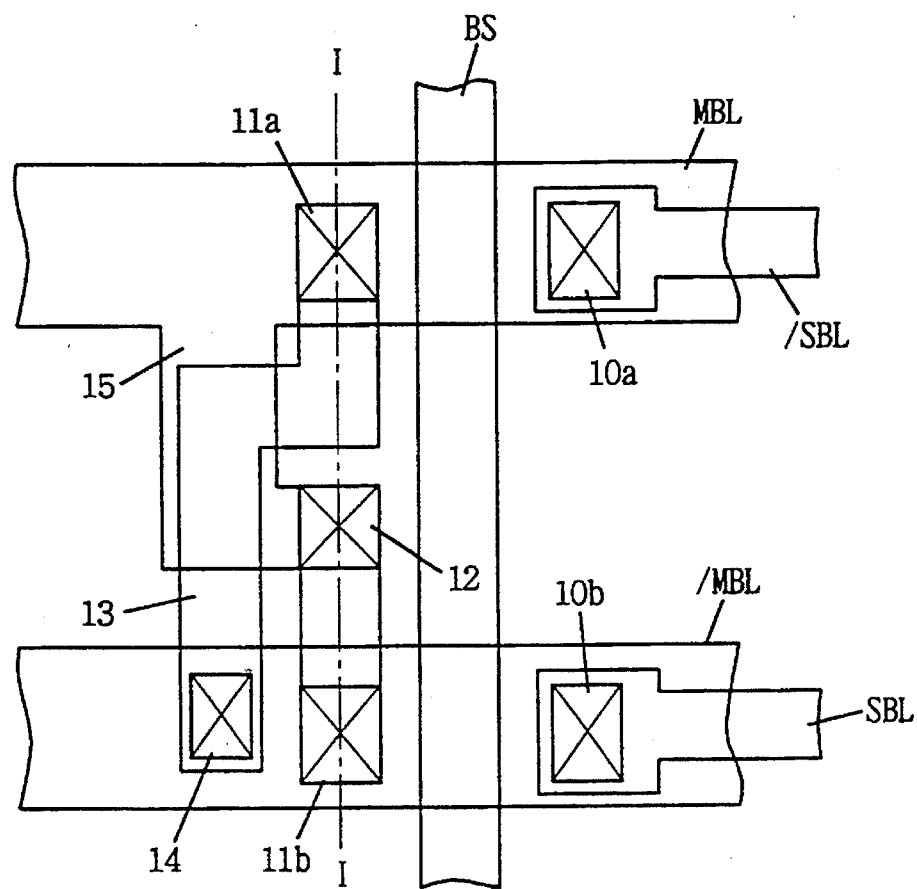
FIGS. 34A and 34B show arrangement and a sectional structure of a block select gate of the semiconductor memory device shown in FIG. 32, respectively.
Figure 34B:
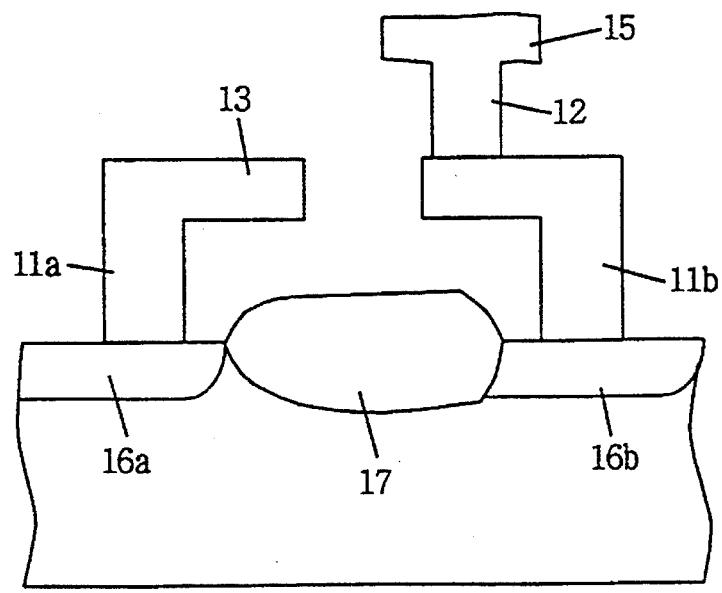

FIGS. 34A and 34B show a structure of the block select switch for making cross-connection between the sub-bit lines and main bit lines.

In FIG. 34A, main bit lines MBL and /MBL are disposed parallel to each other. Complementary sub-bit line /SBL is disposed under main bit line MBL, and sub-bit line SBL is disposed under complementary main bit line /MBL. Sub-bit lines SBL and /SBL are made of, e.g., polycrystalline silicide. Sub-bit lines SBL and /SBL are connected to diffusion layers of transistors forming select gates through contact holes 10a and 10b. In the direction crossing the main bit lines MBL and /MBL, there is disposed a block select signal transmission line BS which is made of a first level polycrystalline silicon layer and a second level aluminum layer similarly to, e.g., the world line. There are disposed contact holes 11a and 11b which are symmetrical to contact holes 10a and 10b with respect to block select signal line BS. Contact holes 11a and 11b are formed under main bit lines MBL and /MBL, respectively, and are connected to another diffusion regions forming the block select gates via interconnection layers at the same level as sub-bit lines SBL and /SBL. Contact hole 11a is extended to the other main bit line /MBL via a lead layer 13 formed of the same level interconnection layer as sub-bit lines SBL and /SBL. Interconnection layer 13 is connected to complementary main bit line /MBL via a contact hole 14. Contact hole 12 is connected to main bit line MBL via a lead interconnection layer 15 made of the same level interconnection layer as the main bit line MBL. As described above, the structure uses the same level interconnection layers as sub-bit lines SBL and main bit line MBL, so that the crossing region of the signal interconnections can be formed easily.

FIG. 34B shows a sectional structure taken along line I—I in FIG. 34A. A field oxide film (LOCOS film) 17 is formed between diffusion layers 16a and 16b. Diffusion region 16a is connected to interconnection layer 13 via contact hole 11a. Diffusion layer 16b is led through contact hole 11b by the same level interconnection layer as the sub-bit line, and is connected through contact hole 12 to the same level interconnection layer 15 as the main bit line MBL. The crossing can be formed easily at the hierarchical bit lines with a small occupied area and without requiring an additional interconnection forming step.

[Modification]

Figure 35A:
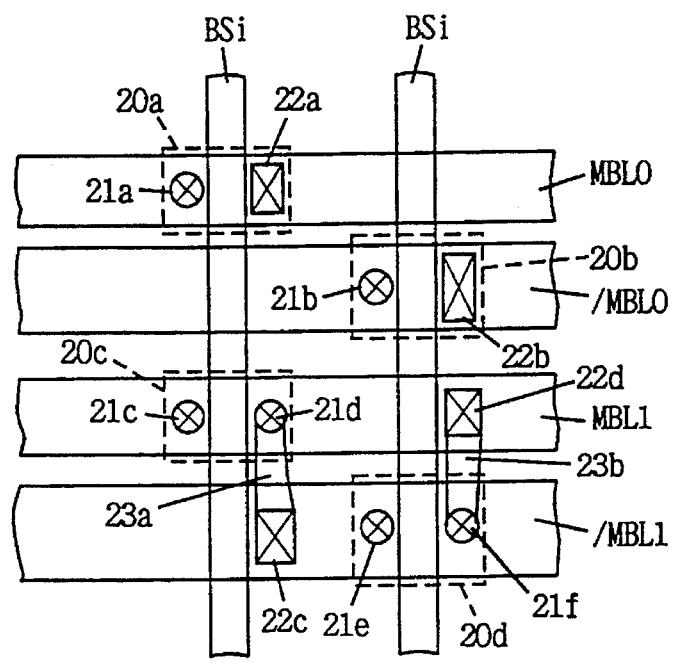
FIGS. 35A and 35B show modification of the arrangement and sectional structure of the block select gate shown in FIG. 32, respectively.

FIG. 35A shows a planar layout of the block select gates related to two pairs of main bit lines MBL0, /MBL0 and MBL1, /MBL1. Block select gates are formed at field regions 20a, 20b, 20c and 20d. These field regions 20a–20d are aligned in the row direction but are disposed at shifted positions. Thus, they are arranged in two rows extending in the row direction. A signal line for transmitting block select signals BSi is provided for the block select gates in one of the rows, and likewise, another signal line for transmitting block select signal BSi is provided for the block select gates in the other row. Arrangement of the block select gates in two rows relaxes the pitch conditions of block select gates, and thus facilitates the design of layout. This structure of the block select gates arranged in two rows facilitates formation of the crossings at the hierarchical bit lines. In the regions where the crossing is not formed, i.e., field regions 20a and 20b, there are formed sub-bit lines SBL0 and /SBL0, each of which is connected to one of the diffusion regions of the block select gate through contact hole 21a or 21b. Main bit lines MBL0 and /MBL0 are connected to the other diffusion regions of the block select gates through contact holes 22a and 22b, respectively.

In the field region 20c, sub-bit line /SBL1 is formed at one of the diffusion regions of the block select gate through contact hole 21c. The other diffusion region of this block select gate is connected through contact hole 21d to a lead layer 23a which is formed of the same level interconnection layer as the sub-bit line. This lead interconnection layer 23a is connected to main bit line /MBL1 via contact hole 22c. In the field region 20d, sub-bit line SBL1 is formed at one of the diffusion regions of the block select gate through a contact hole 21e. The other diffusion region of this block select gate is connected to a lead interconnection layer 23b through a contact hole 21f. Lead interconnection layer 23b is formed of the same level interconnection layer as the sub-bit line. Lead interconnection layer 23b is connected to main bit line MBL1 through contact hole 22d.

Figure 35B:
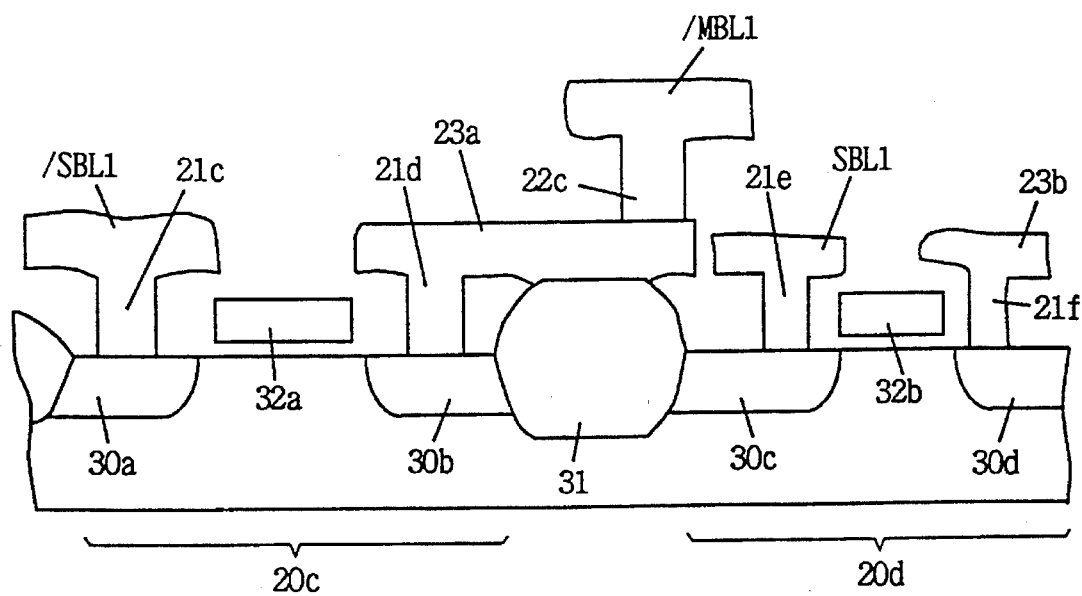

FIG. 35B shows a sectional structure of field regions 20c and 20d. Field regions 20c and 20d are isolated by an LOCOS film 31. In filed region 20c, a diffusion layer 30a is connected to sub-bit line /SBL1 via contact hole 21c. An interconnection layer 32a for transmitting block select signal BSi is formed on a channel region between diffusion layers 30a and 30b. Diffusion layer 30b is connected to lead interconnection layer 23a through contact hole 21d. Lead interconnection layer 23a is connected to main bit line /MBL1 through contact hole 22c.

In field region 20d, diffusion layer 30c is connected to sub-bit line SBL1 through contact hole 21e. Interconnection layer 32b forming the gate of this block select gate receives block select signal BSi. Other diffusion layer 30d is connected to lead interconnection layer 23b through contact hole 21f. Lead interconnection layer 23b is connected at (not shown) region to main bit line MBL1. Interconnection layers 32a and 32b each are connected to a low resistance upper level interconnection layer (not shown) to form a "shunt structure".

By utilizing the structure described above, the crossings can be formed at the hierarchical bit lines without especially crossing the signal lines.

The above structure in which the block select gates are disposed at shifted positions in two rows can be used also in the case where the crossing described above is not provided. Utilization of the above structure can relaxes the pitch conditions of gates.

[Modification]

Figure 36:
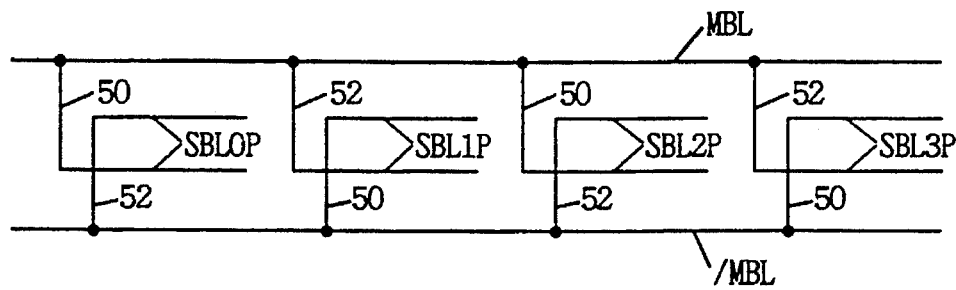
FIG. 36 shows an example of an interconnection layer for interconnecting a sub-bit line and a main bit line in the semiconductor memory device shown in FIG. 32.

FIG. 36 shows a first modification of the seventh embodiment. More specifically, FIG. 36 shows main bit line pair MBL and /MBL as well as sub-bit line pairs SBL0p–SBL3p provided with crossings.

Alternate sub-bit line pairs SBL0p and SBL2p each include a sub-bit line connected to main bit line MBL via an interconnection layer 50 formed of the same level interconnection layer as the sub-bit line, and another sub-bit line connected to complementary main bit line /MBL via a complementary interconnection layer 52 formed of the same level interconnection layer as the main bit line.

Sub-bit line pairs SBL1p and SBL3p each include a sub-bit line connected to main bit line MBL via an interconnection layer 52 formed of the same level interconnection layer as the sub-bit line, and another sub-bit line connected to complementary main bit line /MBL via an interconnection layer 50 formed of the same level interconnection layer as the main bit line.

As described above, the interconnection layers for each sub-bit line pair are formed of the different level interconnection layers, and the interconnection layers for sub-bit line pairs at alternate blocks are formed of the same level interconnection layers, so that it is possible to provide the equal resistance components and the equal parasitic capacitance components by the interconnection layers with respect to main bit line MBL and complementary main bit line /MBL, and thus balance can be kept between the capacitances of main bit line MBL and complementary main bit line /MBL.

[Embodiment 8]

Figure 37:
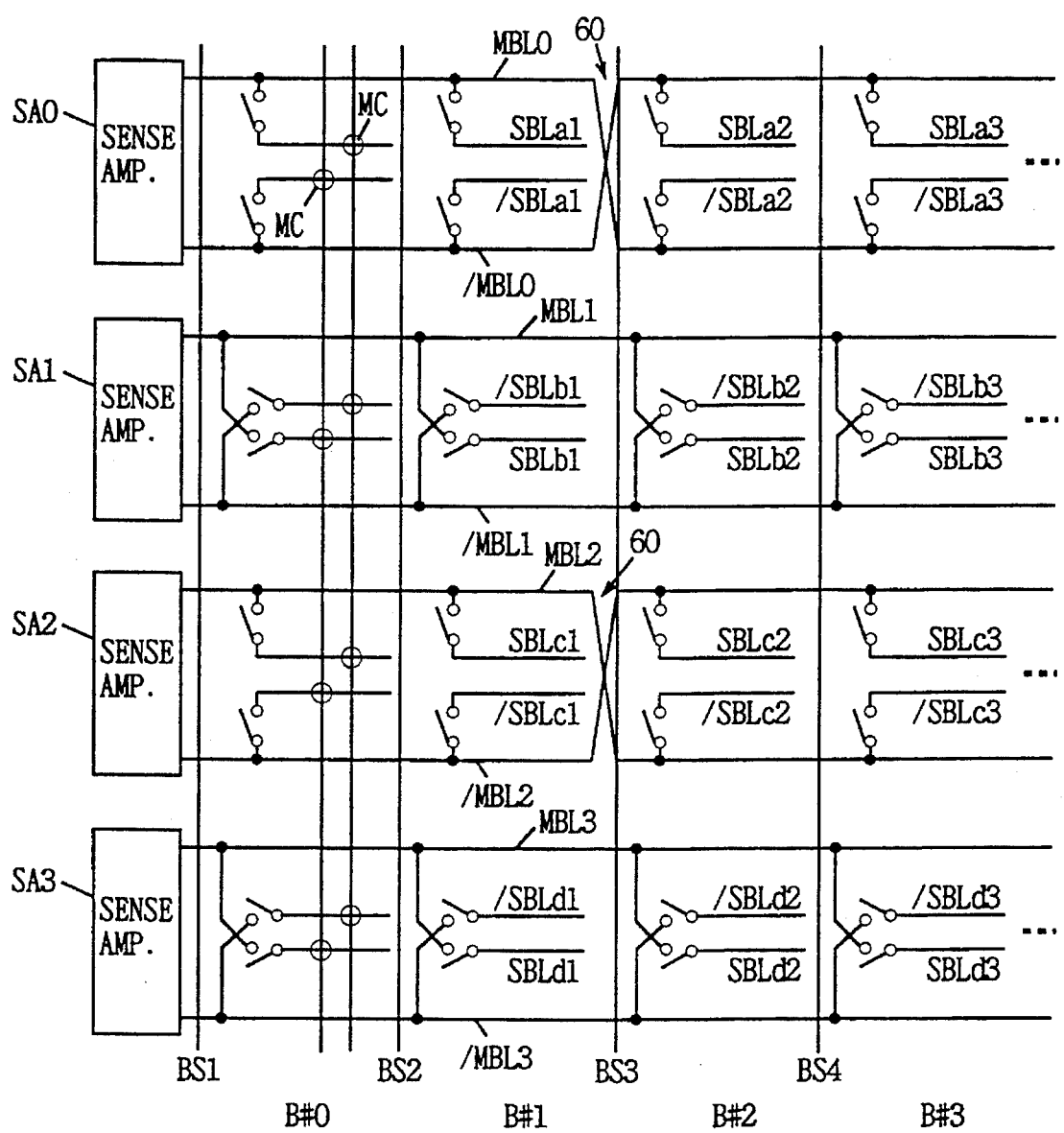
FIG. 37 shows a structure of a main portion of a semiconductor memory device of an eighth embodiment of the invention.

FIG. 37 shows a structure of a main portion of a semiconductor memory device of an eighth embodiment of the invention. The structure shown in FIG. 37 includes crossings at the odd number main bit line pairs located in addition to the components shown in FIG. 32.

In FIG. 37, the block select gates are shown as mechanical switches for simplicity reasons. These switches are actually formed of transistors as already described.

In FIG. 37, main bit line pairs MBL0, /MBL0 and MBL2, MBL2 at even number columns are provided with crossings 60 located between memory cell blocks B#1 and B#2. Main bit line pairs MBL1, /MBL1 and MBL3, /MBL3 at odd number columns are not provided with a crossing. Other structures are the same as those shown in FIG. 32, and the connection mode of the main bit lines and sub-bit lines in the even columns is different from that in the odd columns.

Figure 38A:
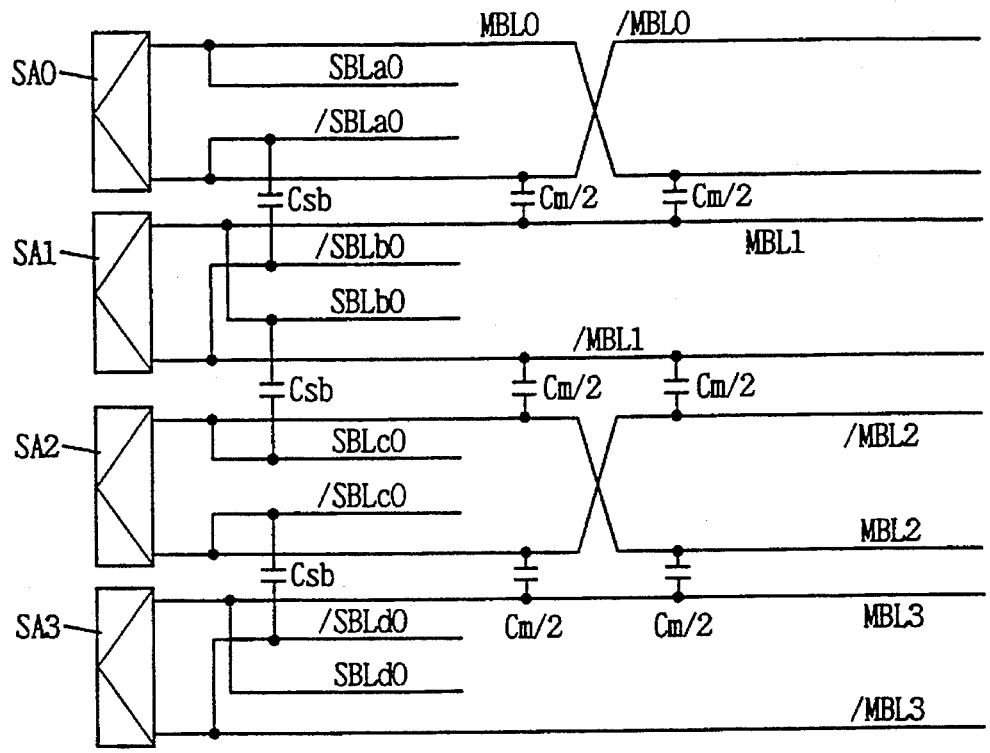
FIGS. 38A and 38B show operation of the semiconductor memory device shown in FIG. 37.
Figure 38B:
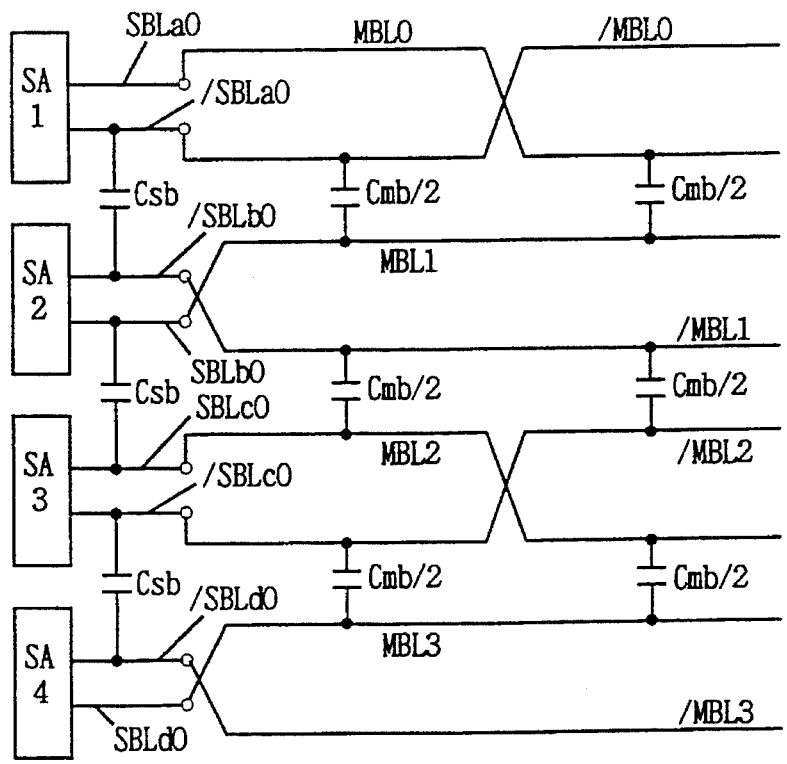

FIGS. 38A and 38B show a connection mode of the sub-bit lines and main bit lines and an electrically equivalent circuit thereof at the time when the word line in memory cell block B#0 is selected. As shown in FIGS. 38A and 38B, coupling capacitance Csb exists between the adjacent sub-bit lines. For the adjacent main bit lines, the coupling capacitance is formed only between the portions facing to each other, and main bit line MBL1 forms the coupling capacitance of Cmb/2 with main bit line /MBL0, and forms the coupling capacitance Cmb/2 with main bit line MBL0. Here, Cmb indicates the coupling capacitance between the adjacent main bit lines having no crossing.

As shown in FIG. 38B, the coupling capacitance in the hierarchical bit lines is reduced by either the coupling capacitance with the sub-bit line or a half of the capacitance with the main bit line, or by the sum of the both. Therefore, the influence by the coupling noises can be reduced significantly. Further, between the adjacent main bit lines, the capacity-coupling noises act on one hierarchical bit line to cancel each other. Thereby, capacitive coupling noises can be surely prevented, and thus the sensing operation can be performed accurately.

FIG. 39 shows a planar structure of crossing 60 at main bit line pair MBL0 and /MBL0. As shown in FIG. 39, main bit line MBL0 is continuously formed of one interconnection layer. Complementary main bit line /MBL0 has portions which are interconnected by an interconnection layer 65 through contact holes 63a and 63b. Interconnection layer 65 is formed by using the same level interconnection layer forming the sub-bit line. The crossing can be formed without utilizing an additional interconnection layer.

[Ninth Embodiment]

Figure 40:
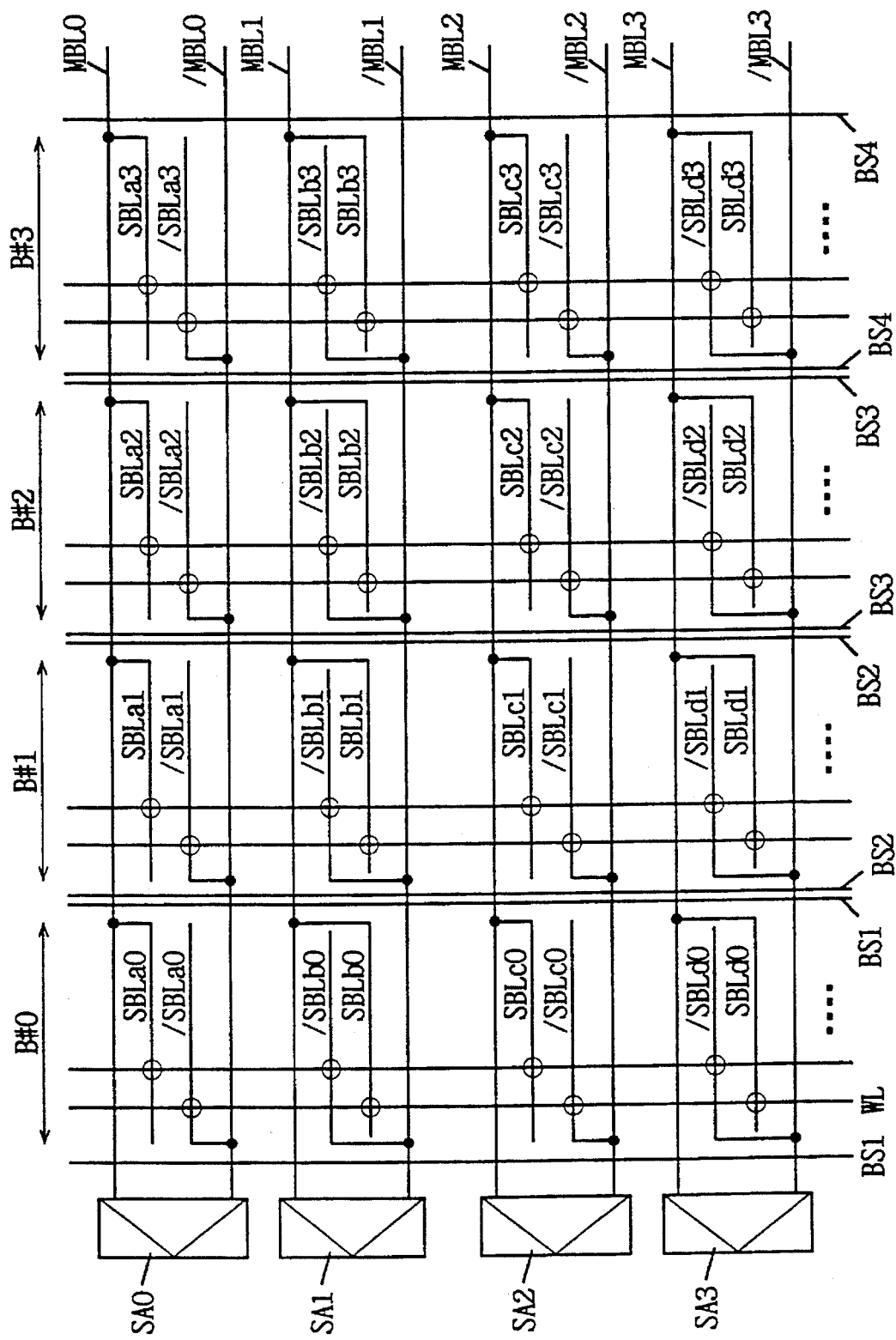
FIG. 40 shows a structure of a main portion of a semiconductor memory device of a ninth embodiment of the invention.

FIG. 40 shows a structure of a main portion of a semiconductor memory device of a ninth embodiment of the invention. The structure shown in FIG. 40 is electrically equivalent to the structure shown in FIG. 32. The structure in FIG. 40 is different from the structure in FIG. 32 in the positions of the block select gates connecting sub-bit lines and main bit lines. In FIG. 40, each block select gate is simply represented by one straight line. Each pair of the sub-bit lines are provided at their ends remote from each other with the block select gates, by which sub-bit line is connected to the corresponding or adjacent main bit line. In this structure, signal lines for transmitting the block select signals are disposed at opposite sides of each memory cell block.

Since the arrangement shown in FIG. 40 is electrically equivalent to the arrangement shown in FIG. 32, the influences by the capacitive coupling noises between the adjacent bit lines can be surely canceled, similarly to the arrangement shown in FIG. 32. The structure in FIG. 40 further has the following advantage.

Figure 41:
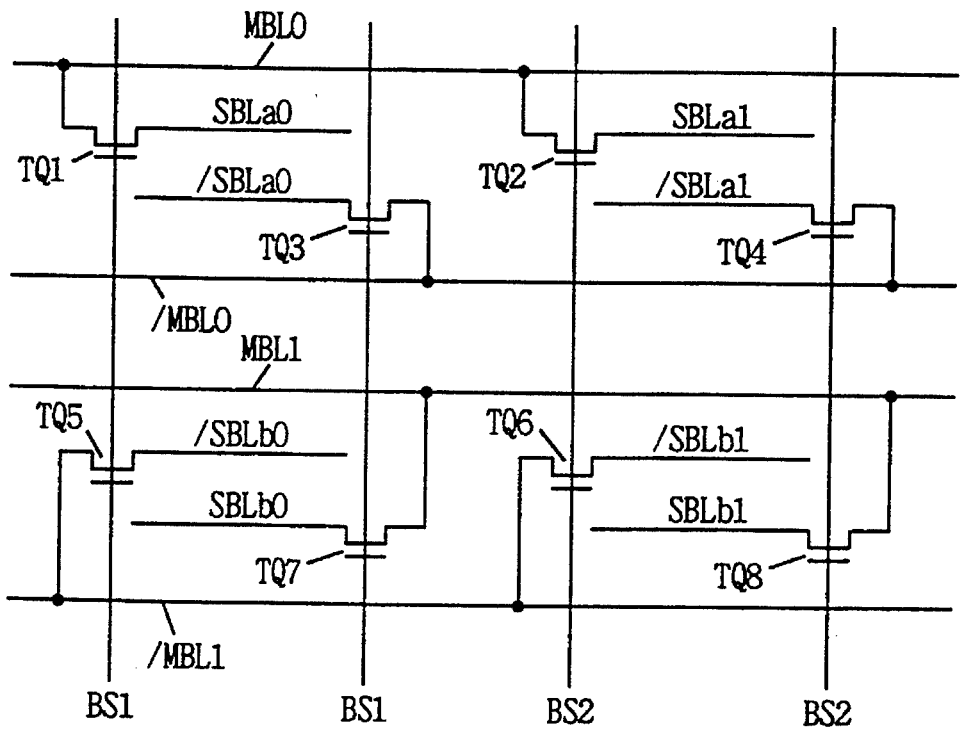
FIG. 41 shows a specific structure of a block select gate portion in the semiconductor memory device shown in FIG. 40.

FIG. 41 shows the arrangement of the block select gates for the memory cells arranged in two rows and two columns in the structure shown in FIG. 40. In FIG. 41, sub-bit line SBLa0 is provided at its one end (left end in FIG. 41) with a block select gate TQ1. Complementary sub-bit line /SBLa0 is provided at its end remote from the above mentioned one end (i.e., right end in FIG. 41) with block select gate TQ3. Sub-bit lines SBLa1 and /SBLa1 are provided at their ends remote from each other with block select gates TQ2 and TQ4, respectively.

Sub-bit lines /SBLb0 and /SBLb1 each are connected at one side to complementary main bit line /MBL1 via block select gate TQ5 or TQ6. Sub-bit lines SBLb0 and SBLb1 each are connected at the opposite side to main bit line MBL1 via block select gate TQ7 or TQ8. In the pitch direction of the sub-bit line, i.e., direction perpendicular to the sub-bit line, it is necessary to dispose only one block select gate at an area between adjacent two sub-bit lines. Therefore, the layout pitch of block select gates can be relaxed, and thus the block select gates can be disposed with a sufficient margin.

The same layouts as that shown in FIG. 41 are repetitively applied in the row and column directions. Therefore, the memory cell array can be formed by repetitively employing the same patterns in both directions, which facilitates design of the layout of the memory cell array.

[Modification]

Figure 42:
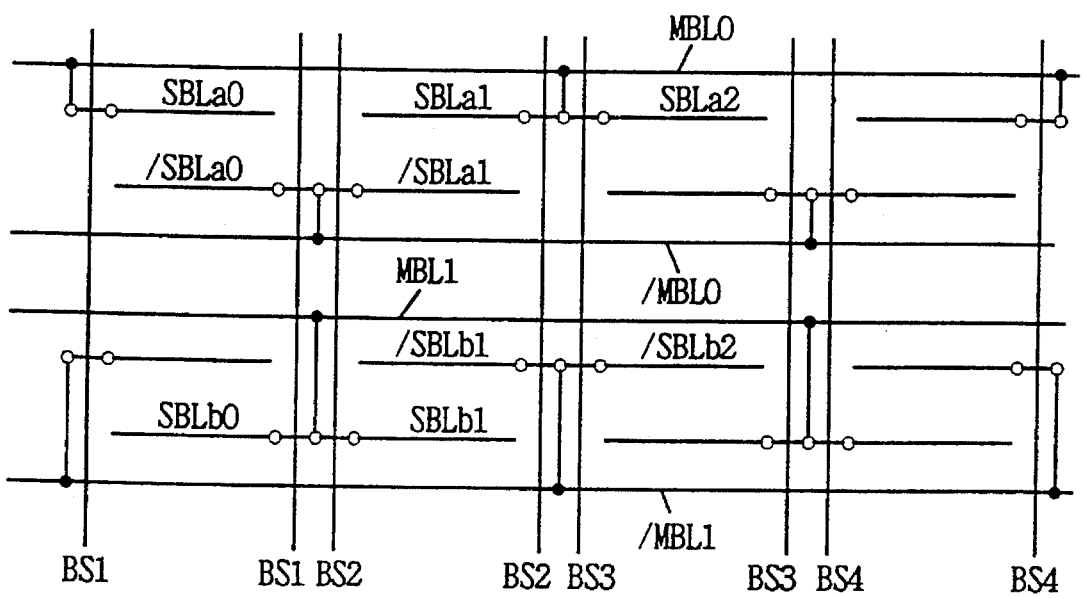
FIG. 42 shows modification of the semiconductor memory device shown in FIG. 40.

FIG. 42 shows a modification of the arrangement shown in FIG. 40. In FIG. 42, the block select gates are represented simply by symbols of mechanical switches. In the structure shown in FIG. 42, the paired sub-bit lines SBL and /SBL are provided at their ends remote from each other with the block select gates. The sub-bit lines which are adjacent to each other in the column direction are provided at adjacent ends with the block select switches. For example, sub-bit line SBLa0 is provided at its one end with the block select gate, and complementary sub-bit line /SBLa0 paired therewith is provided at the opposite end with the block select gate. Complementary bit line /SBLa1, which is adjacent in the column direction to bit line SBLa0, is provided at the end adjacent to the complementary bit line /SBLa0 with the block select gate.

The adjacent block select gates disposed in this manner are connected to the main bit line through a common contact hole. In each region for forming the block select gate, the block select gate is formed for only one of the paired sub-bit lines. According to the arrangement shown in FIG. 42, the diffusion layer in the block select gate can be commonly used by the adjacent block select gates, so that an area occupied by the block select gates can be made small, and the layout area of block select gates can be reduced. The arrangement shown in FIG. 42 is different from that in FIG. 40 only in the positions of the block select gates, so that the crossings can be formed at the hierarchical bit lines without an additional interconnection layer and an extra area, similarly to the structure shown in FIG. 40.

[Tenth Embodiment]

Figure 43:
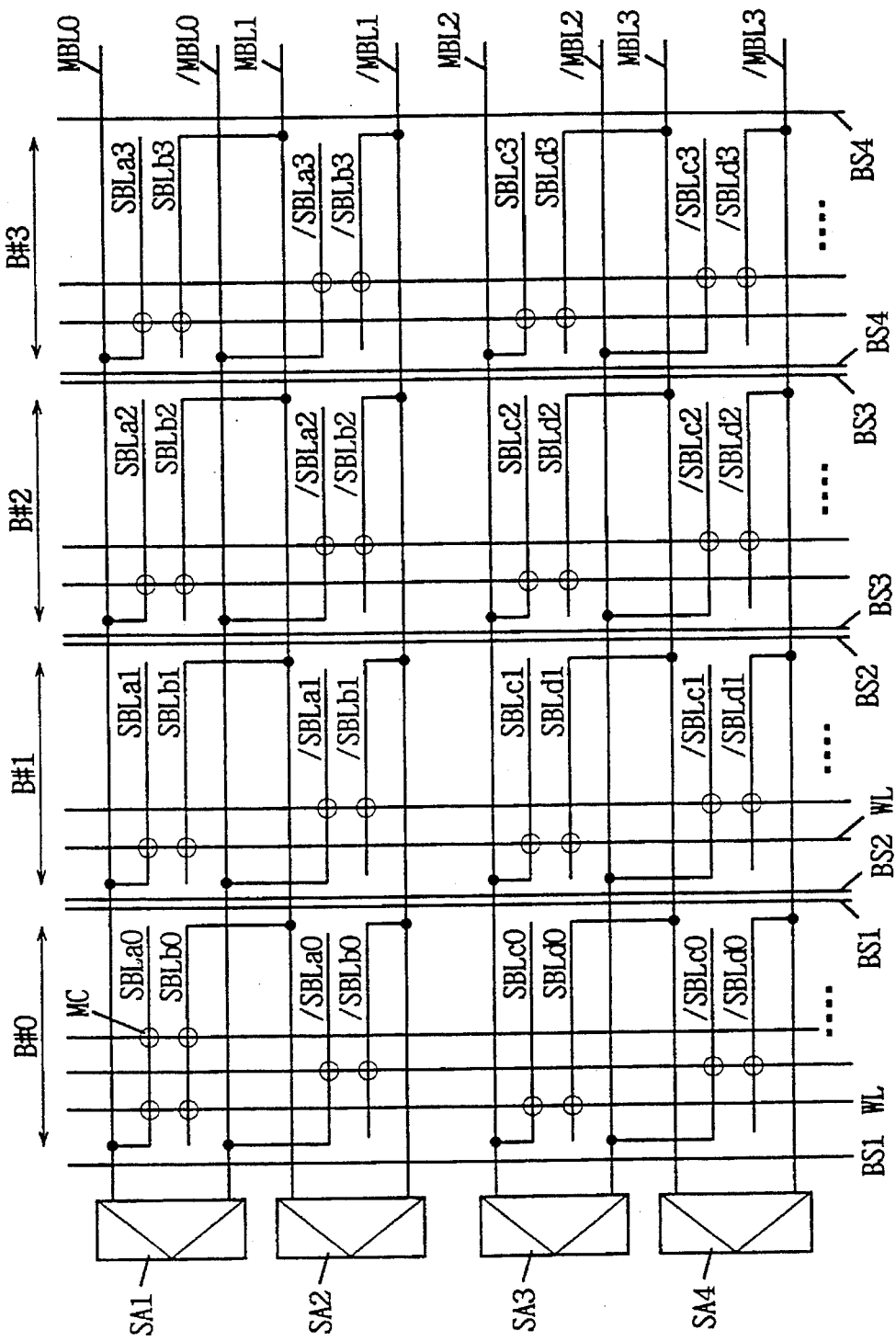
FIG. 43 shows a structure of a main portion of a semiconductor memory device of a tenth embodiment of the invention.

FIG. 43 shows a structure of a main portion of a semiconductor memory device of a tenth embodiment of the invention. More specifically, FIG. 43 schematically shows a structure related to memory cells arranged in four columns.

In the arrangement shown in FIG. 43, sub-bit lines for one of the adjacent main bit line pairs are disposed at the places of the sub-bit lines for the other of the adjacent main bit line pairs. More specifically, sub-bit lines SBLb0–SBLb3 are disposed at the places of complementary sub-bit lines /SBLa0–/SBLa3 in the embodiments already described. Each sub-bit line is connected to the corresponding main bit line via the block select gate. For each main bit line pair, the memory cells are aligned in the word line direction, and the memory cells aligned in the column direction (the main bit line extending direction) are disposed corresponding to alternate word lines.

Likewise, sub-bit lines SBLd0–SBLd3 are disposed at the places of complementary sub-bit lines /SBLc0–/SBLc3 in the embodiments already described. The block select gates for each sub-bit lines pair are disposed at ends of the sub-bit lines remote from each other. This arrangement of sub-bit lines can be easily achieved by using the same level interconnection layers as the sub-bit lines and extending the interconnection layers to the positions under the adjacent main bit line. For example, sub-bit line SBLb0 is connected to main bit line MBL1 via the block select gate (not clearly shown) and via the interconnection layer which is the same level layer as the sub-bit line.

Figure 44A:
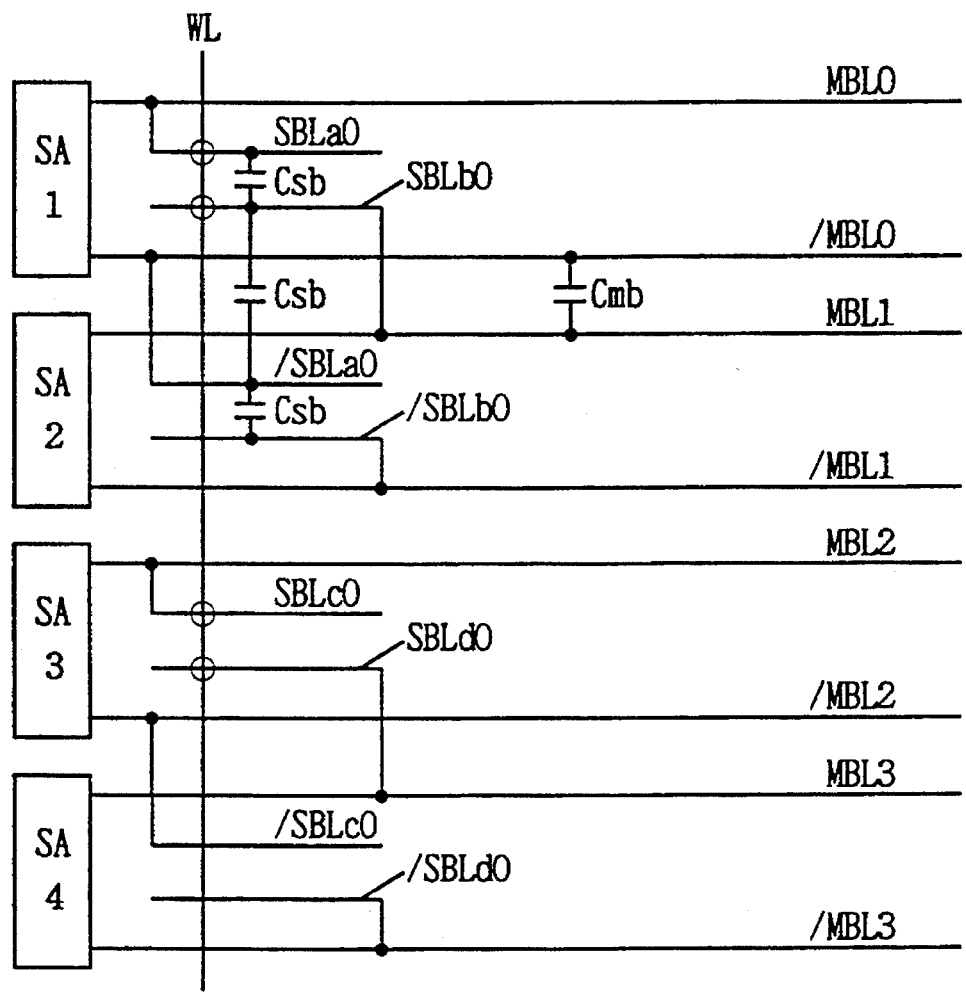
FIGS. 44A and 44B show operation of the semiconductor memory device shown in FIG. 43.
Figure 44B:
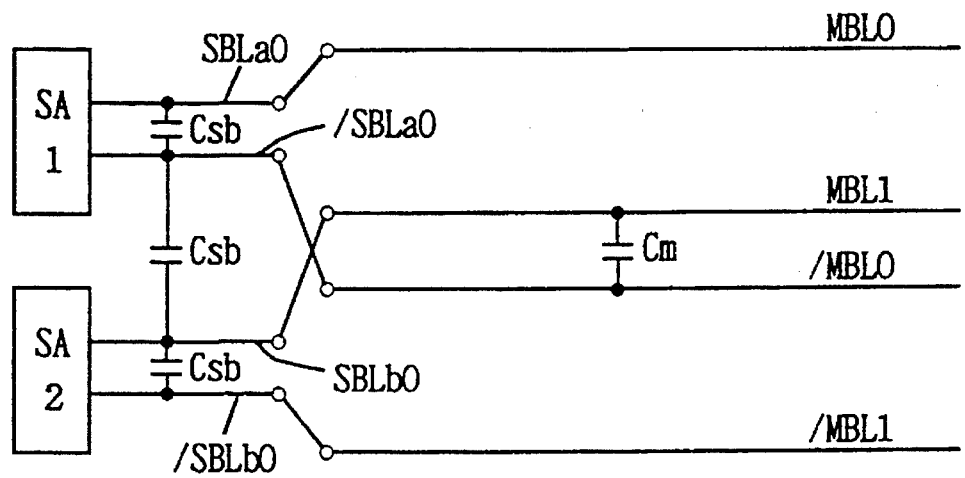

FIGS. 44A and 44B show a connection mode of the sub-bit lines and main bit lines at the time when block B#0 is selected. Sub-bit line SBLa0 is connected to main bit line MBL0, and sub-bit line SBLb0 extends beyond complementary main bit line /MBL0 and is connected to adjacent main bit line MBL1. Sub-bit line /SBLa0 is connected to complementary main bit line /MBL0, and sub-bit line /SBLb0 is connected to main bit line /MBL1. Main bit line pairs MBL2, /MBL2 and MBL3 and /MBL3 are provided with the similar connection arrangement.

FIG. 44B shows a connection mode of sub-bit lines and main bit lines with respect to sense amplifiers SA1 and SA2. Since the memory cells are connected directly to the sub-bit lines, sub-bit lines SBLa0 and /SBLa0 are shown connected directly to sense amplifier SA1 in the figure, and sub-bit lines SBLb0 and /SBLb0 are shown connected directly to sense amplifier SA2 in the figure. In this connection mode, main bit line MBL1 is disposed at the place of main bit line /MBL0 in the embodiments already described. In this case, sub-bit line /SBLa0 and main bit line /MBL0 form the crossing with sub-bit line SBLb0 and main bit line MBL1. Therefore, capacitive coupling noises between the adjacent main bit line pairs are canceled. In the main bit line pair, since the coupling capacitance is small, the capacitive coupling noise is reduced, so that the sensing operation can be performed stably.

[Eleventh Embodiment]

Figure 45A:
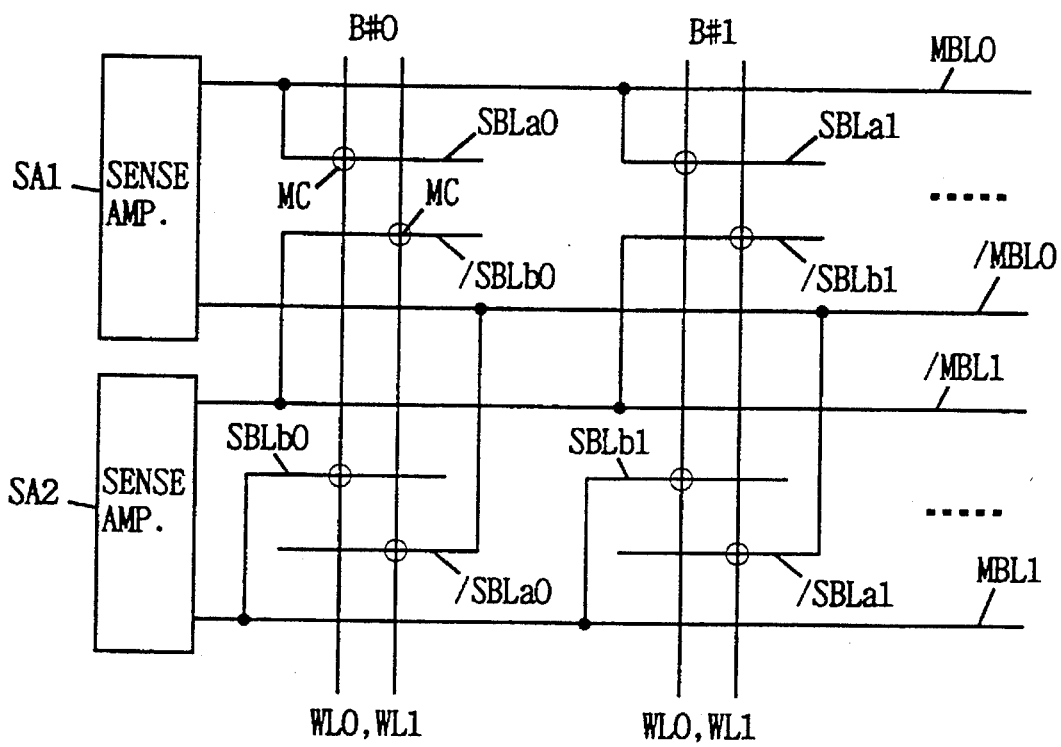
FIGS. 45A and 45B schematically show a structure of a main portion and an operation of a semiconductor memory device of an eleventh embodiment of the invention.
Figure 45B:
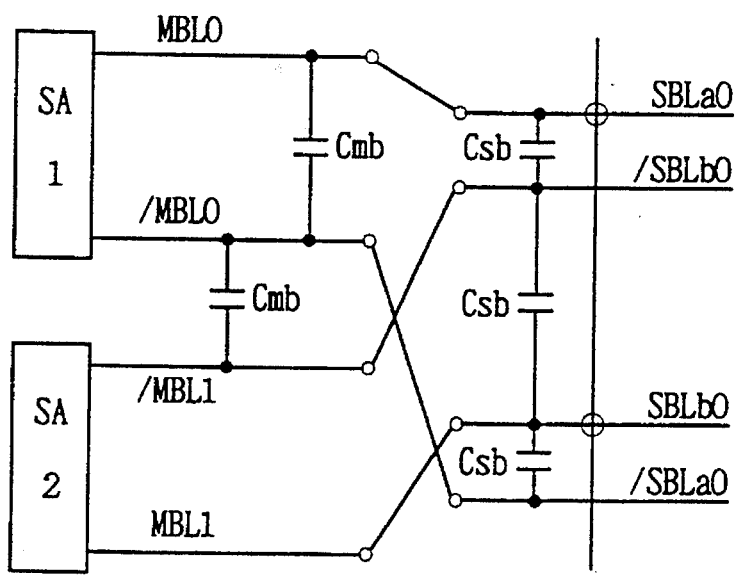

FIGS. 45A and 45B show a semiconductor memory device of an eleventh embodiment of the invention. More specifically, FIGS. 45A and 45B schematically show a structure of two memory blocks B#0 and B#1 related to two pairs of main bit lines. The structure shown in FIGS. 45A and 45B is repeated in the column and row directions.

In the arrangement shown in FIGS. 45A and 45B, each of main bit lines MBL1 and /MBL1 is disposed at the place of the other in the embodiments already described, and sub-bit lines /SBLa0 and /SBLb0 are similarly disposed in the replaced arrangement. Thus, sub-bit lines SBLa0, SBLb0, SBLa1, /SBLb1, are disposed corresponding to main bit line pair MBL0 and /MBL0. Likewise, sub-bit lines SBLb0, /SBLa0, SBLb1, /SBLa1, ... are disposed corresponding to main bit line pair MBL1 and /MBL1. Although not shown clearly, sub-bit lines SBLa0 and SBLa1 are connected to main bit line MBL0 via block select gates. Sub-bit lines /SBLb0 and /SBLb1 are connected not to complementary main bit line /MBL0 but to adjacent main bit line /MBL1.

In connection with the memory cells in the second column, sub-bit lines SBLb0 and SBLb1 are connected to main bit line MBL1 via block select gates (not shown). Sub-bit lines /SBLa0, /SBLa1, ... on the lower side of the figure are connected to main bit line /MBL0 via block select gates (not shown). Memory cells MC related to each main bit line pair are disposed corresponding to the crossings of word lines WL and the paired sub-bit lines provided corresponding to the above mentioned main bit line pair. For example, in the structure where memory cell MC is disposed corresponding to the crossing of word line WL0 and sub-bit line SBLa0, a memory cell is not disposed at the crossing of word line WL0 and sub-bit line /SBLb0, and memory cell MC is disposed corresponding to the crossing of word line WL1 and sub-bit line /SBLb0. FIG. 45B is an electrically equivalent circuit diagram showing the connection mode of sub-bit lines and main bit lines at the time when word line WL0 in memory cell block B# is selected.

As shown in FIG. 45B, only the coupling capacitance between the main bit lines exists as the coupling capacitance between the adjacent bit lines, and the crossings exist, so that noises caused in the respective bit lines by the capacitive coupling act to cancel each other. Therefore, influence by the capacitive coupling noises is suppressed, and the sensing operation can be performed stably.

In the structures shown in FIGS. 40, 43, 45A and 45B, crossing is not provided at the main bit lines. However, crossings may be provided at the main bit lines as shown in FIG. 37, in which case influence by the noises caused by coupling capacitances can be further suppressed.

[Twelfth Embodiment]

Figure 46:
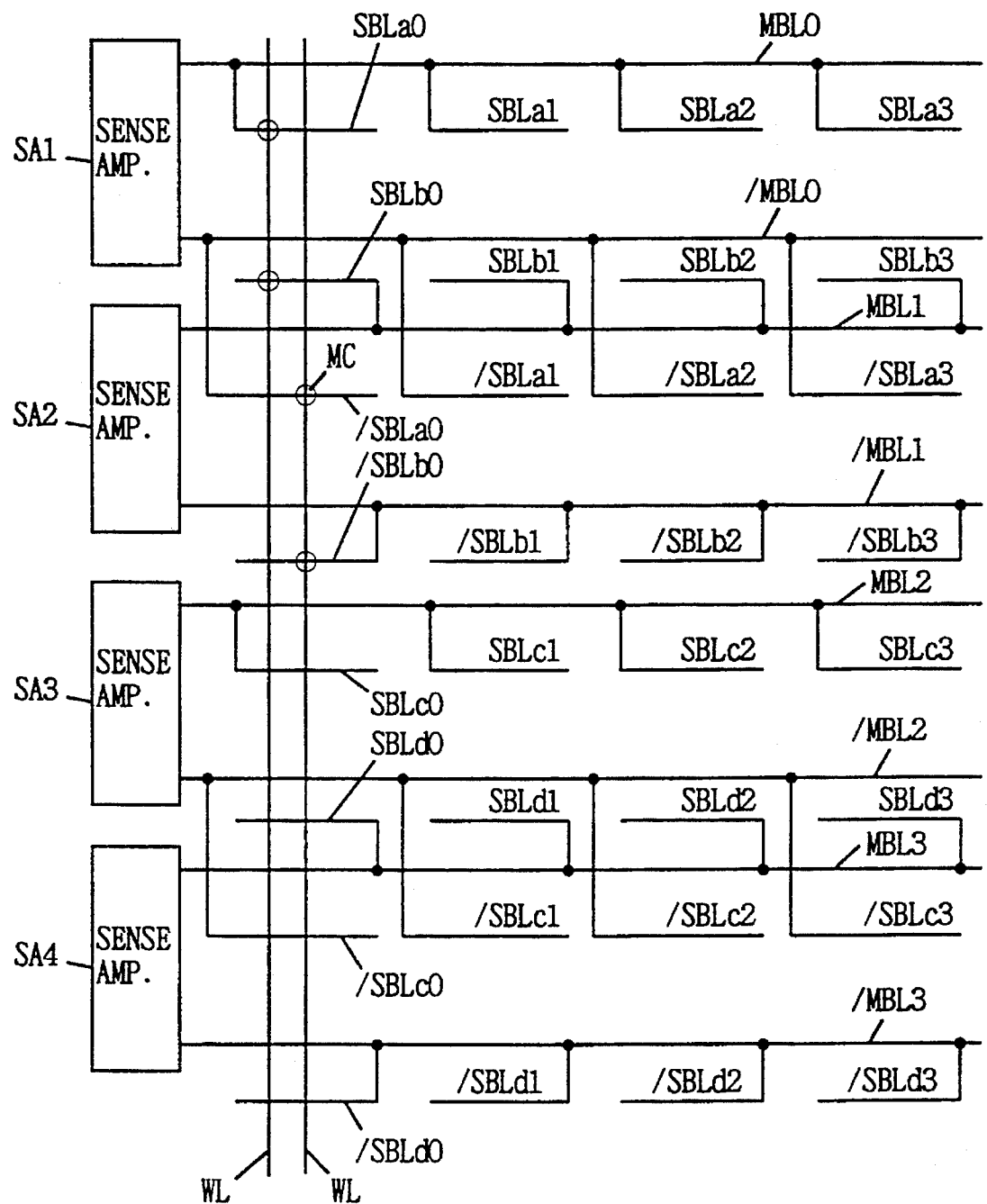
FIG. 46 shows a structure of a main portion of a semiconductor memory device of a twelfth embodiment of the invention.

FIG. 46 shows a structure of a main portion of a semiconductor memory device of a twelfth embodiment of the invention. A connection mode of sub-bit lines and main bit lines shown in FIG. 46 is equivalent to the form shown in FIG. 43. The corresponding portions bear the same reference characters. The arrangement shown in FIG. 46 includes sub-bit lines SBL disposed between the main bit line pairs. The pitch of main bit lines is equal to the pitch of sub-bit lines. In the embodiments already described, all the main bit lines overlap with sub-bit lines in a planar view. In the structure shown in FIG. 46, however, main bit lines are shifted from sub-bit lines in the planar view.

Figure 47:
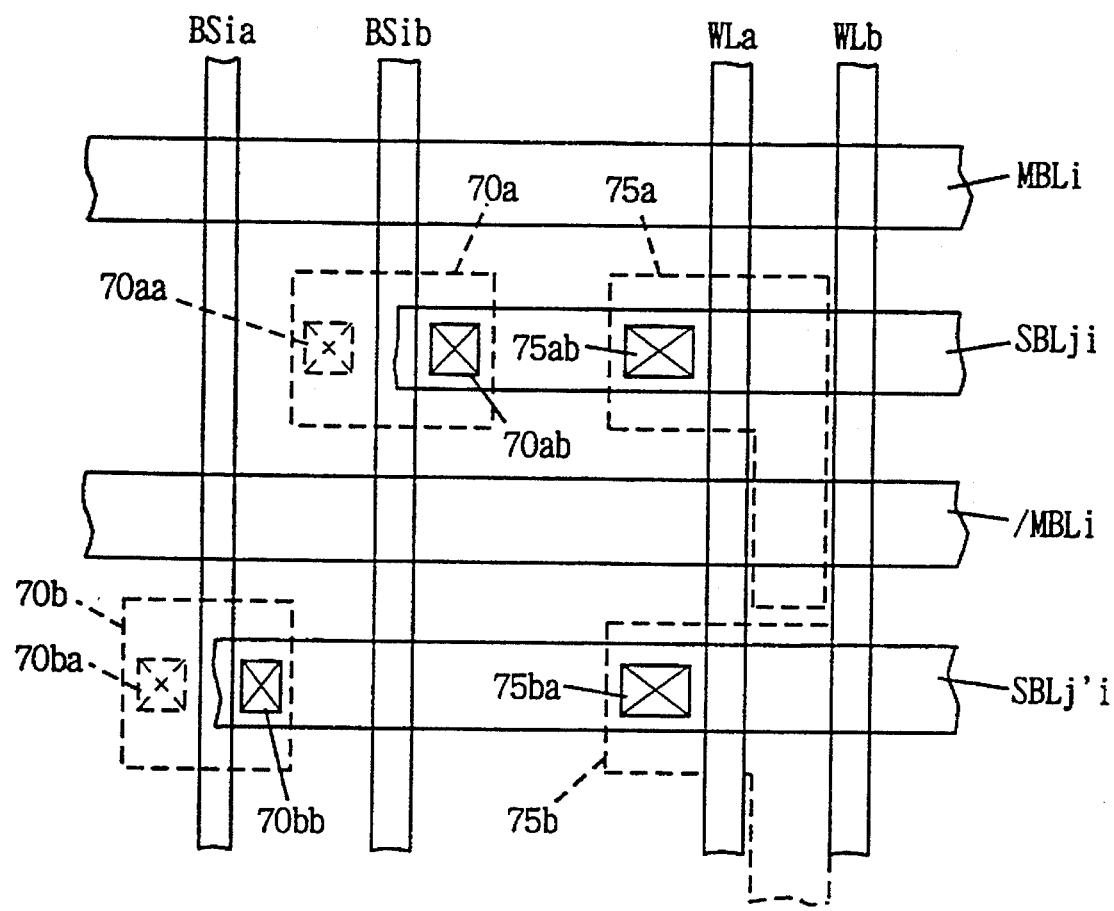
FIG. 47 shows planar arrangement of a block select gate portion in the semiconductor memory device shown in FIG. 46.

FIG. 47 partially shows a layout of the main bit lines and sub-bit lines in the structure shown in FIG. 46. As shown in FIG. 47, main bit line MBLi, sub-bit line SBLji, main bit line /MBLi and sub-bit line SBLj'i are disposed in this order in the planar view. Main bit lines MBLi and /MBLi are formed of aluminum interconnection layers or tungsten interconnection layers. Sub-bit lines SBLji and SBLj'i are formed of, e.g., polycrystalline silicide interconnection layers. For sub-bit lines SBLji and SBLj'i, field regions 70a and 70b are formed for forming block select gates, respectively. Through a contact hole 70ab in field region 70a, one of diffusion regions of a transistor forming the block select gate is connected to sub-bit line SBLji. Sub-bit line SBLji shown in FIG. 47 terminates on a block select signal transmission line BSib.

In field region 70b, one of diffusion regions of a transistor forming the block select gate is connected to sub-bit line SBLj'i through a contact hole 70bb. Contact holes 70aa and 70ba are connected to main bit line MBLi or /MBLi depending on the respective connection paths. In this structure, interconnection layers of the same level interconnection layers as sub-bit lines SBLji and SBLj'i can be connected to the other of the diffusion layers of the block select gates without additionally providing an interconnection layer, whereby it is possible to make easily connection of block select gates to main bit lines MBLi and /MBLi.

In FIG. 47, there are shown field regions 75a and 75b for forming memory cells. In field region 75a, one of conduction regions of an access transistor of the memory cell is connected to sub-bit line SBLji through contact hole 75ab. In field region 75b, one of conduction regions of an access transistor of the memory cell is connected to sub-bit line SBLj'i through contact hole 75ba. An overall layout of field regions 75a and 75b forming the memory cells may be determined appropriately. In this case, a cell plate line forming an electrode node of a memory cell capacitor may be disposed under the main bit line, and this cell plate can be used as a shield film for the main bit line.

[Arrangement of Array]

Figure 48:
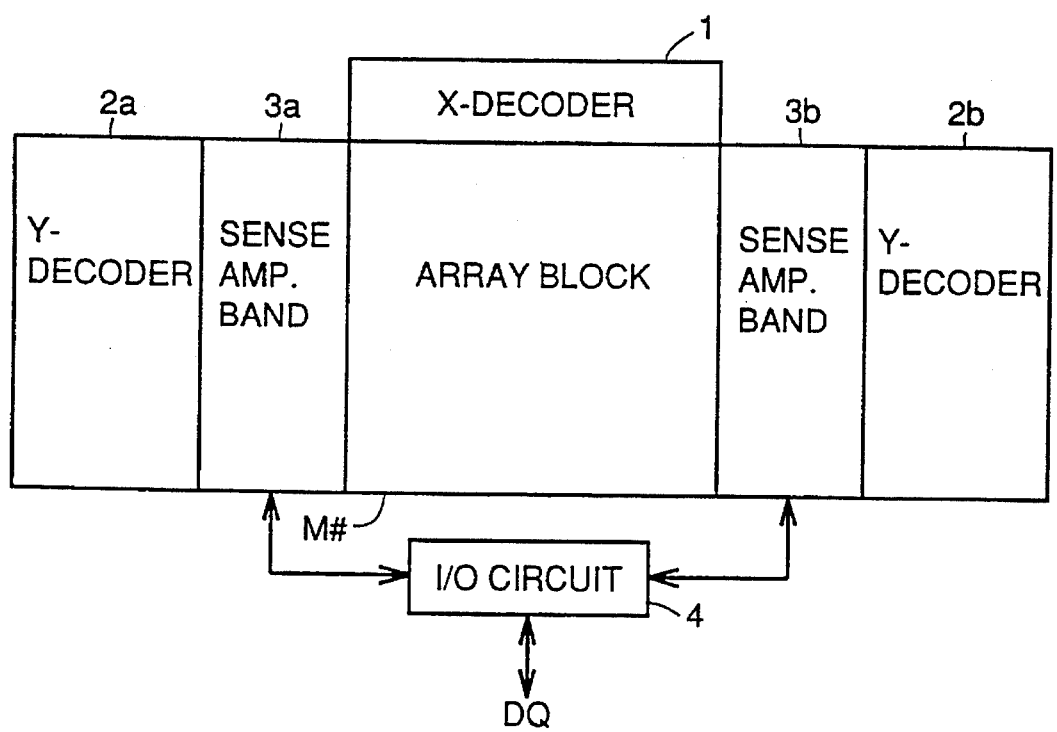
FIG. 48 shows a structure of a peripheral portion of the semiconductor memory device according to the invention.

FIG. 48 shows arrangement of the array of the semiconductor memory device already described. In FIG. 48, only one array block M# is shown. Array block M# is provided with the hierarchical bit lines already described. An X-decoder 1 is disposed at one side of array block M# for selecting a word line in array block M#. Sense amplifier bands 3a and 3b each include a plurality of sense amplifiers which are provided corresponding to the respective main bit line pairs, and are disposed at opposite sides of array block M#. Y-decoders 2a and 2b which decode a Y-address to generate a column select signal are disposed adjacently to sense amplifier bands 3a and 3b, respectively. Sense amplifier bands 3a and 3b are provided with I/O gates corresponding to the main bit line pairs, as will be described later. When a column (main bit line pair) is selected in response to a column select signal supplied from Y-decoders 2a and 2b, the I/O gate provided corresponding to the selected column is turned on to connect the selected main bit line pair to an internal data bus.

The column designated or selected by Y-decoders 2a and 2b is connected to I/O circuit 4. I/O circuit 4 performs input/output of data DQ with the selected column (main bit line pair). I/O circuit 4 may perform input/output of data in units of one bit, and alternatively may perform input/output of data in units of multiple bits such as 4 bits or 8 bits.

In the array arrangement shown in FIG. 48, if the sub-bit lines connect the memory cells which are arranged to form the "folded bit line" structure as shown in FIG. 46, one of the sense amplifier bands and one of the Y-decoders are not necessary. Y-decoders 2a and 2b may be adapted to supply the column select signals to adjacent array blocks (not shown). In the structure shown in FIG. 48, a block decoder included in X-decoder 1 generates the block select signal for selecting sub-bit lines. At the positions or regions where the block select switches are disposed, a memory cell does not exist and hence the word line is not arranged, so that block decoder circuits are arranged corresponding to the respective memory cell blocks at these regions.

[Array Arrangement]

Figure 49:
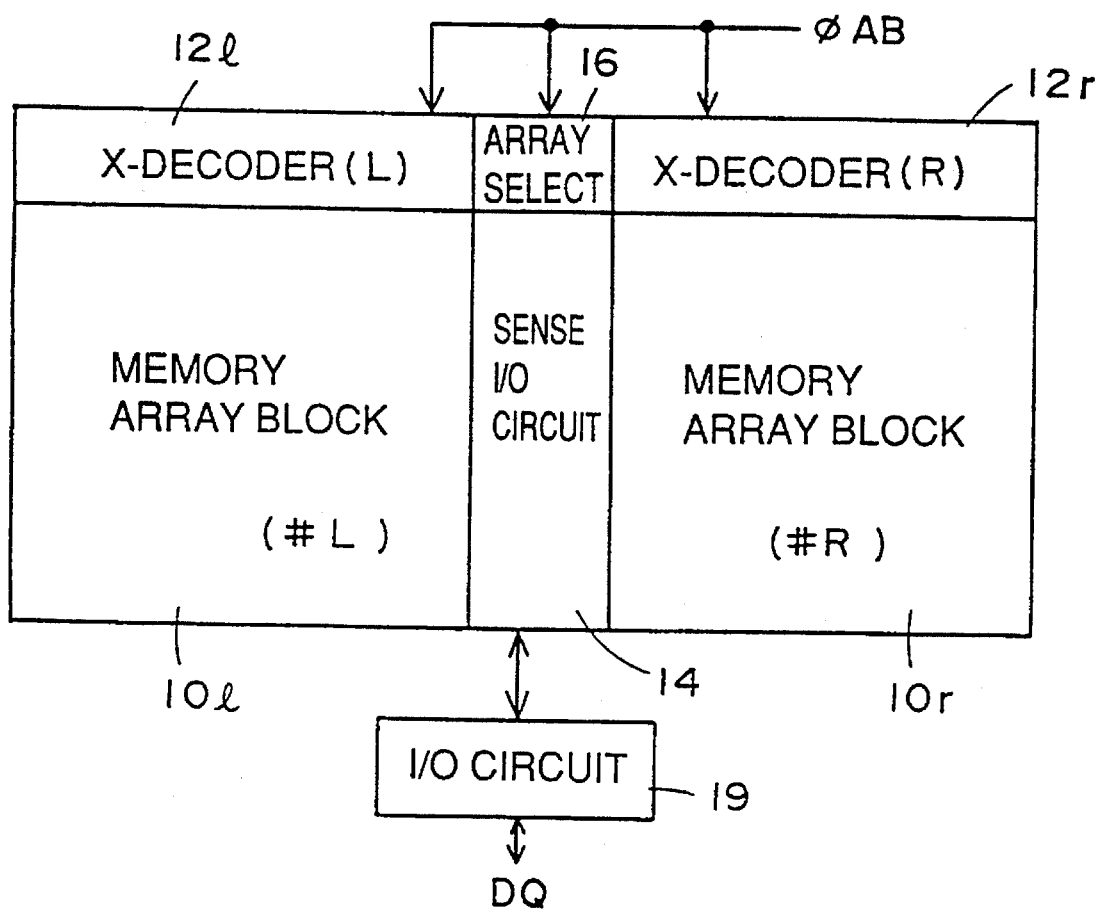
FIG. 49 shows another arrangement of the array in the semiconductor memory device according to the invention.

FIG. 49 shows a second example of array arrangement in the semiconductor memory device according to the invention. In FIG. 49, there are shown two adjacent memory array blocks (#L and #R) 10l and 10r. A sense I/O circuit 14 is arranged between memory array blocks 10l and 10r, and an X-decoder (L) 12l and an X-decoder (R) 12r are provided corresponding to memory array blocks 10l and 10r, respectively. Memory array blocks 10l and 10r include hierarchical bit lines formed of main bit lines and sub-bit lines. Sense I/O circuit 14, of which specific structure will be described later, includes sense amplifiers provided corresponding to the main bit line pairs and I/O gates which are turned on to connect a selected column to an internal data bus in response to an output of Y-decoder. Memory array blocks 10l and 10r commonly use the sense amplifiers contained in sense I/O circuit 14. Only one of memory array blocks 10l and 10r, i.e., X-decoders 12l and 12r is activated in accordance with a block address φAB, and the other maintains the standby state. In order to connect the activated memory array block to sense I/O circuit 14, the memory array block which is selected in response to the block address φAB is connected to sense I/O circuit 14, and the nonselected memory array block is isolated from sense I/O circuit 14. For this connection and isolation, an array select circuit 16 is provided. The selected column is connected to I/O circuit 16, and input/output of data DQ is performed via I/O circuit 16. Input/output data DQ may be 1-bit data or multi-bit data.

Figure 50:
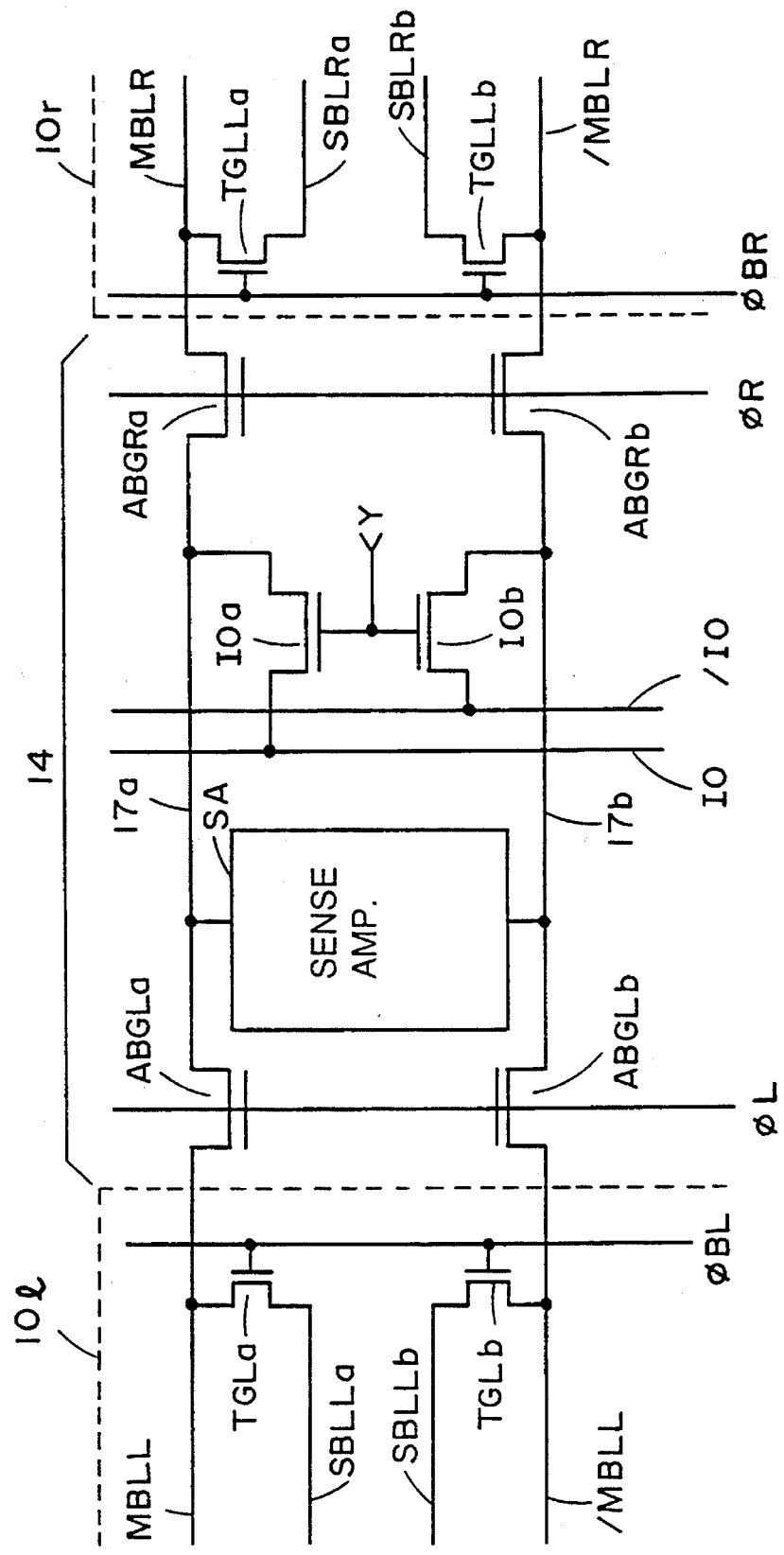
FIG. 50 shows a structure of a main portion of the array arrangement shown in FIG. 49.

FIG. 50 specifically shows the structure of the sense I/O circuit corresponding to one main bit pair shown in FIG. 49.

In FIG. 50, memory array block 10l includes a pair of main bit lines MBLL and /MBLL, and memory array block 10r includes a pair of main bit lines MBLR and /MBLR. Main bit line MBLL is connected via a block select switch TGLa to a sub-bit line SBLLa which is connected to a memory cell in one column block. Main bit line /MBLL is connected via a block select switch TGLb to a sub-bit line SBLLb which is connected to a memory cell in the same column block. Main bit line MBLR is connected via a block select switch TGLLa to a sub-bit line SBLRa which is connected to a memory cell in a column block. Main bit line /MBLR is connected through a block select switch TGLLb to a sub-bit line SBLRb. Paired main bit lines MBLL and /MBLL as well as paired main bit lines MBLR and /MBLR may be arranged in one of the arrangements of main bit lines already described. Likewise, sub-bit lines SBLLa, SBLLb, SBLRa and SBLRb may be arranged in any one of arrangements of sub-bit lines already described. FIG. 50 representatively shows an exemplary arrangement of the hierarchical bit lines for the simplicity reasons and for showing the fact that the bit lines have the hierarchical bit line structures formed of the main bit lines and sub-bit lines.

The sense I/O circuit 14 includes array block select gates ABGLa and ABGLb which are turned on in response to an array block select signal φL to connect main bit lines MBLL and /MBLL to signal lines 17a and 17b, respectively, array block select gates ABGRa and ABGRb which are turned on in response to an array block select signal φR to connect main bit lines MBLR and /MBLR to signal lines 17a and 17b, respectively, column select gates (I/O gates) IOa and IOb which are turned on in response to column select signal Y to connect signal lines 17a and 17b to internal data lines IO and /IO, respectively, and sense amplifier SA which differentially amplifies signal potentials on signal lines 17a and 17b.

Array block select signals φL and φR are generated by array select circuit 16 shown in FIG. 49. In the standby state, both array block select signals φL and φR are high, array block select gates ABGLa, ABGLb, ABGRa and ABGRb are on, signal lines 17a and 17b are precharged to an intermediate potential of Vcc/2, i.e., substantially the same potential as main bit lines MBLL, /MBLL, MBLR and /MBLR. Upon start of the memory cycle, one of memory array blocks 10l and 10r is designated in accordance with block address φAB (see FIG. 49). It is assumed that memory array block 10l is designated. Array select circuit 16 lowers the array block select signal φR to the low level and turns off array block select gates ABGRa and ABGRb in accordance with the block address φAB. Thereby, sense I/O circuit 14 and memory array block 10r are isolated from each other. Array block select signal φL maintains the high level.

Then, row selection is performed in memory array block 10l. The potential of word line corresponding to the selected row rises to the high level, so that data of the memory cell is transmitted onto main bit lines MBLL and/or /MBLL. The signal potentials on main bit lines MBLL and /MBLL are transmitted onto signal lines 17a and 17b via array block select gates ABGLa and ABGLb, respectively. Then, sense amplifier SA is activated and differentially amplifies the signal potentials on signal lines 17a and 17b. Then, column select signal Y rises to the high level, and thus column select gates IOa and IOb are turned on, so that signal potentials of signal lines 17a and 17b are transmitted to internal data lines IO and /IO, respectively. After completion of one memory cycle, the operation similar to the operation already described is performed. More specifically, the potential of selected word line falls to the low level and operation such as equalization of the bit lines are performed. Array block select signal φR rises to the high level again, and array block select gates ABGRa and ABGRb are turned on.

The above structure, in which the sense amplifier is disposed between the adjacent memory array blocks and these two memory array blocks commonly use the sense amplifier, has been known as the "shared sense amplifier arrangement". Such a shared sense amplifier arrangement can employ the hierarchical bit line structure in the embodiments already described. Particularly, in the structure of, e.g., embodiment in FIG. 1 performing the "latch-type sensing operation", the array block select gates ABGLa, ABGLb, ABGRa and ABGRb can be used also as transfer gates TG (e.g., TGaa, TGba, TGab and TGbb in FIG. 1) connecting the corresponding sense amplifiers to main bit lines MBL and /MBL. This common-use structure can be easily implemented by such control signals produced from logical product of the select signals in the respective embodiments and the array block select signals shown in FIG. 50, provided that the high level of the control signal represents the active state.

[Arrangement of Y-decoders]

Figure 51:
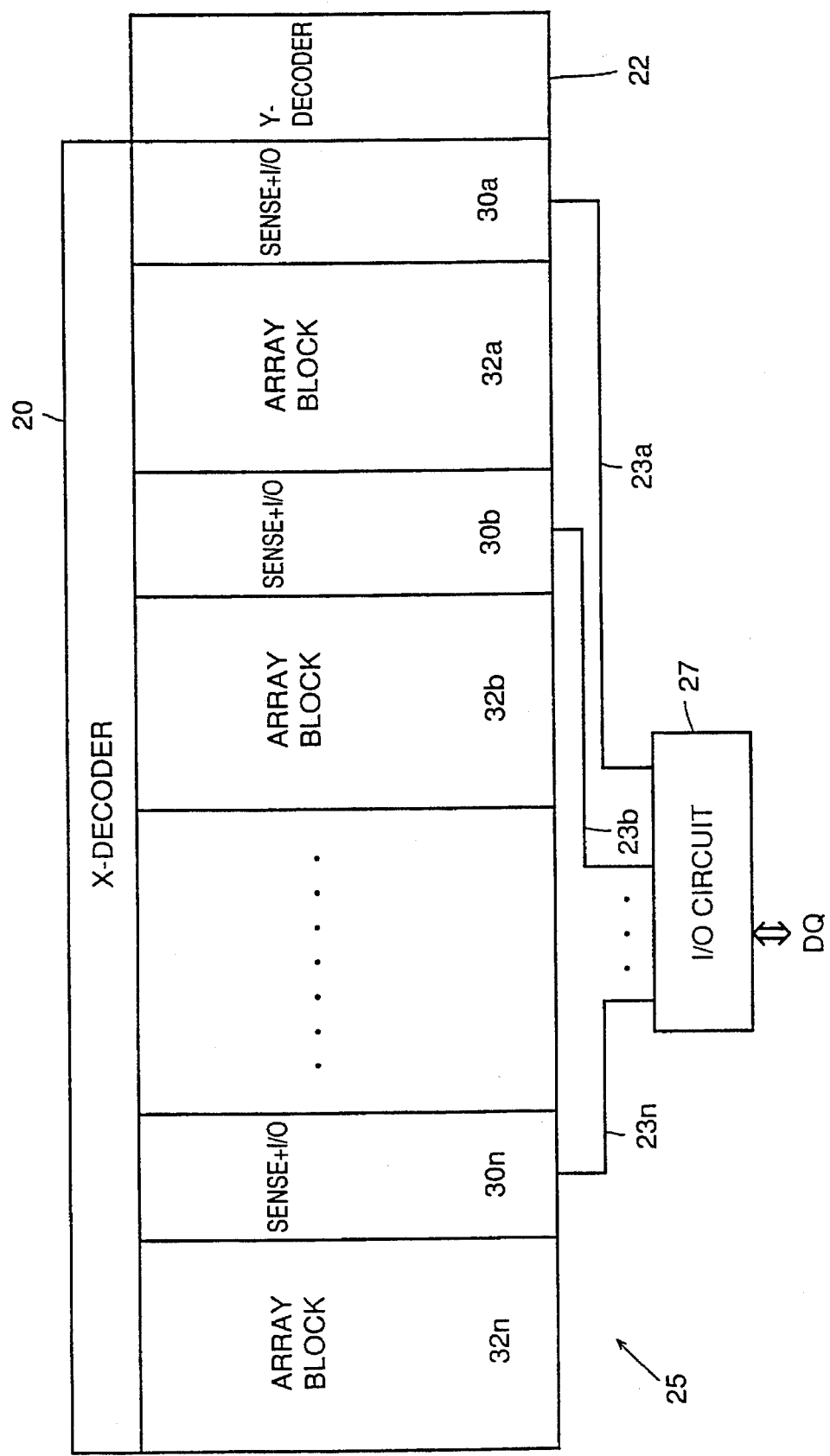
FIG. 51 schematically shows a whole structure of the semiconductor memory device according to the invention.

FIG. 51 schematically shows the whole array arrangement in the semiconductor memory device according to the invention. In FIG. 51, a memory cell array 25 is divided into a plurality of array blocks 32a, 32b, . . . 32n. Each of array blocks 32a, 32b, . . . 32n includes a plurality of memory cells arranged in rows and columns, and a plurality of main bit lines arranged corresponding to the respective columns. Each column of memory cells is divided into a plurality of memory cell blocks, and sub-bit lines are arranged for the blocks in each column. For arrangement of the bit lines in array blocks 32a, 32b, . . . 32n can employ any one of the arrangements of the hierarchical bit lines already described can be employed.

Figure 52:
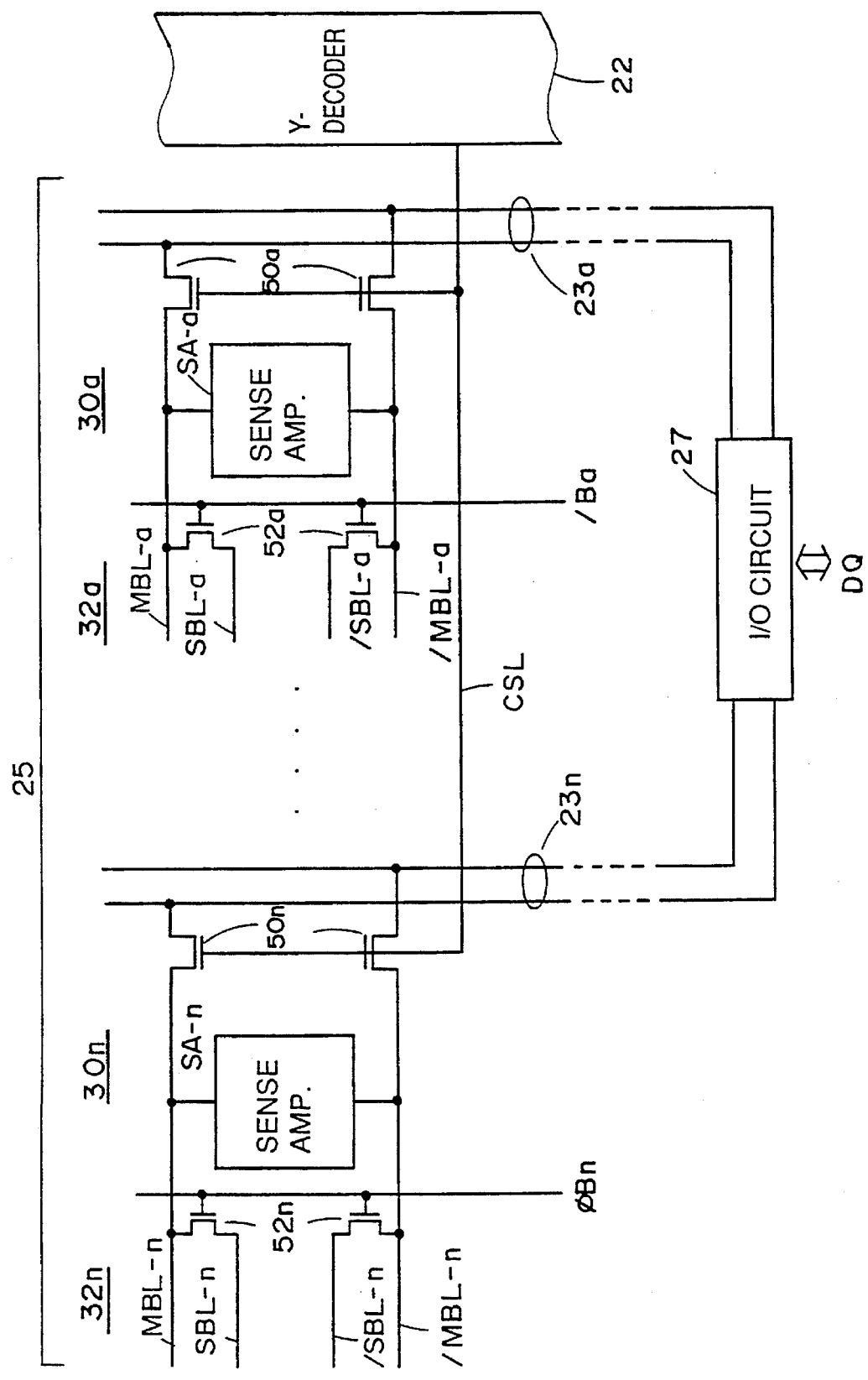
FIG. 52 schematically shows a structure of a main portion of the semiconductor memory device shown in FIG. 51.

Corresponding to array blocks 32a, 32b, . . . 32n, there are provided (sense+I/O) blocks 30a, 30b, . . . 30n, respectively, each of which includes sense amplifiers and I/O gates. The arrangement of sense amplifiers shown in FIG. 52 is not the shared sense amplifier arrangement. However, the shared sense amplifier arrangement described in connection with FIG. 50 may be used.

An X-decoder 20 is disposed along one side of memory cell array 25, and a Y-decoder 22 is disposed along an adjacent side to X-decoder 20. X-decoder 20 selects one word line in each of array blocks 32a, 32b, . . . 32n. Y-decoder 22 is provided commonly to array blocks 32a, 32b, . . . 32n, and the column select signal supplied from Y-decoder is transmitted via column select signal lines disposed extending throughout the memory cell array 25, as will be specifically described later. Only one Y-decoder 22 is provided commonly for a plurality of array blocks 32a, 32b, . . . 32n, which reduces an area required by the Y-decoder. The signal on the column which is selected by the column select signal from Y-decoder 22 is transmitted via (sense+I/O) blocks 30a, 30b, . . . 30n onto internal data buses 23a, 23b, . . . 23n, and then is transmitted to an I/O circuit 27. I/O circuit 27 performs external input/output of data with internal data lines 23a, 23b, . . . 23n in accordance with the number of bits of input/output data DQ.

The arrangement shown in FIG. 51 may utilize a "partial activation method" in which all array blocks 32a, 32b, . . . 32n are not simultaneously activated, and only a predetermined number of array blocks are simultaneously activated.

FIG. 52 schematically shows a structure related to one column in the memory cell array of the array arrangement shown in FIG. 51. In FIG. 52, only portions related to array blocks 32a and 32n are shown. In array block 32a, main bit lines MBL-a and /MBL-a are disposed, and sub-bit lines SBL-a and /SBL-a are connected to main bit lines MBL-a and /MBL-a via block select gates 52a. Array block select gate 52a is turned on in response to array block select signal φBa. In FIG. 52, only one sub-bit line pair is shown in connection with one main bit line pair in each array block. Actually, a plurality of sub-bit line pairs corresponding to the respective column blocks of memory cells are disposed in connection with one main bit line pair, as described before. (Sense+I/O) block 30a includes a sense amplifier SA-a which differentially amplifies the signal potentials on main bit lines MBL-a and /MBL-a, and also includes a column select gate 50a which connects main bit lines MBL-a and /MBL-a to internal data lines 23a (I/O and /I/O).

Array block 32n likewise includes main bit lines MBLn and /MBL-n as well as sub-bit lines SBL-n and /SBL-n. Sub-bit lines SBL-n and /SBL-n are connected to main bit lines MBL-n and /MBL-n via array block select gates 52n which are turned on in response to array block select signal φBn, respectively. (Sense+I/O) block 30n includes a sense amplifier SA-n which differentially amplifies the signal potentials on main bit lines MBL-n and /MBL-n, and also includes column select gate 50n which connects main bit lines MBL-n and /MBL-n to internal data lines or bus 23a. In the arrangement shown in FIG. 52, the main bit lines and the sub-bit lines have any of the arrangements of arrangement of the hierarchical bit lines already described. The arrangement of Y-decoder, which will be described below, can be generally applied to semiconductor memory devices having the hierarchical bit line structure.

Y-decoder 22 has output nodes corresponding to the respective columns. The column select signals from the output nodes of Y-decoder 22 is transmitted to control gates of the respective column select gates 50a, . . . 50n via column select lines CSL extending throughout memory cell array 25. Column select lines CSL is disposed parallel to main bit lines MBL and /MBL in each of array blocks 32a–32n. In FIG. 52, it is shown that column select line CSL extending from Y-decoder 22 selects only one column. However, such a structure may be employed in which multiple columns are simultaneously selected. Internal data lines 23a–23n are connected to I/O circuit 27. Therefore, if the output of Y-decoder 22 via the column select lines CSL brings multiple columns to the selected state at the same time, I/O circuit 27 further performs the selecting operation in accordance with the number of bits of input/output data DQ.

According to the structure shown in FIGS. 51 and 52, one column in each of array blocks 32a, . . . 32n is selected at the same time, and each main bit line pair is connected to internal data buses 23a, . . . 23n. I/O circuit 27 may select data of one bit in accordance with the array block select signal, or such a structure may be employed in which data of, e.g., four bits is output if the array blocks are four in number.

According to the partial activation method, such a structure may be employed in which one or a predetermined number of array blocks are simultaneously activated, and the other array blocks are kept inactive. In this case, I/O circuit 27 selects the output(s) of the activated array block(s). The column selecting operation which is performed in the non-selected array block causes no problem, because internal data bus 23a are precharged to the same intermediate potential as the main bit lines.

As shown in FIGS. 51 and 52, the Y-decoder is provided commonly for a plurality of array blocks in memory cell array 25, and the output of this Y-decoder is transmitted via column select lines CSL arranged extending throughout the memory cell array, whereby the number of Y-decoders can be reduced, and thus an area occupied thereby can be reduced.

[Arrangement of Y-decoder]

Figure 53:
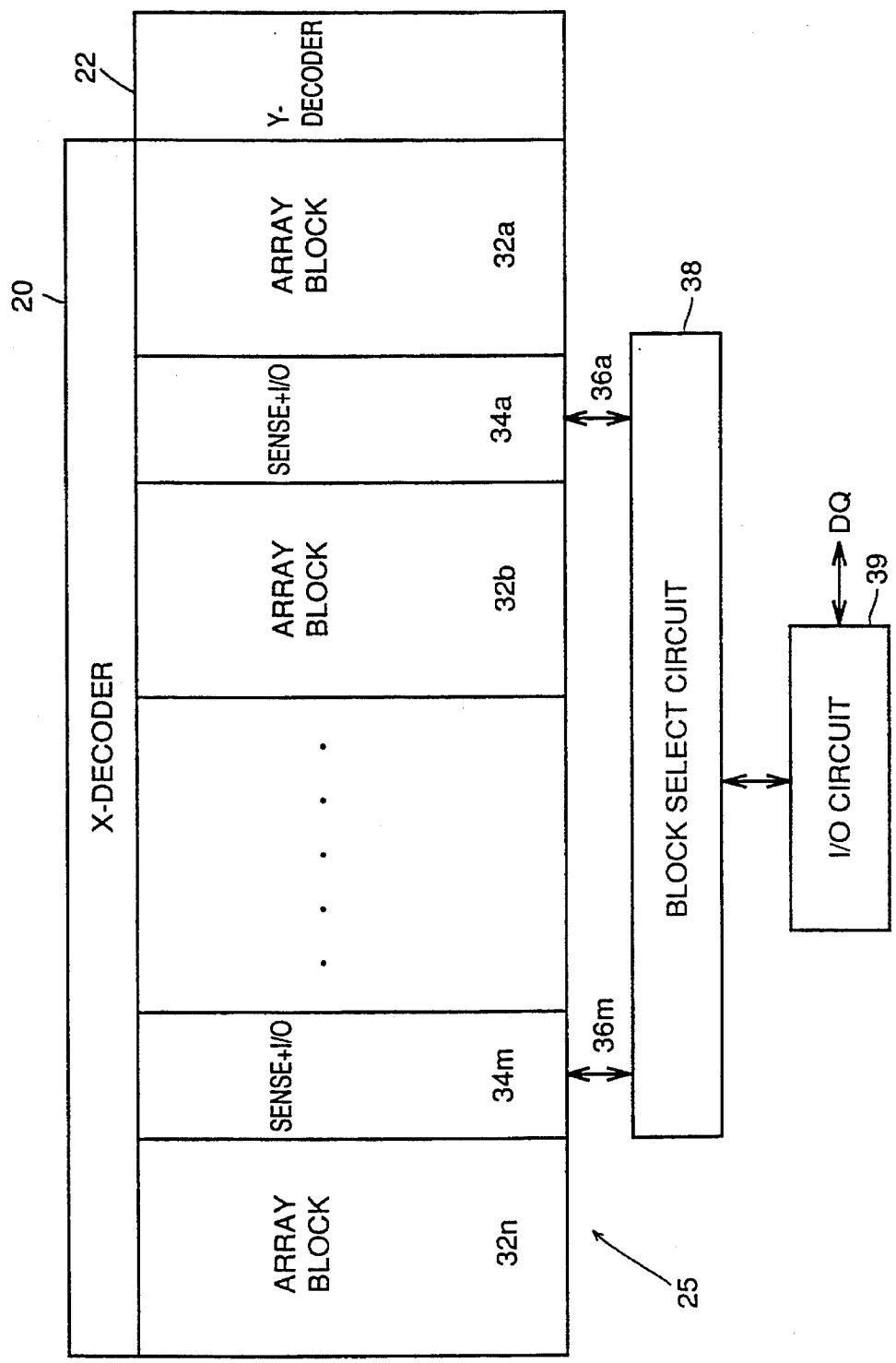
FIG. 53 shows modification of the array arrangement shown in FIG. 51.

FIG. 53 schematically shows another example of entire array in the semiconductor memory device according to the invention. In the structure shown in FIG. 53, a (sense+I/O) block (34a) is disposed between adjacent two array blocks (e.g., 32a and 32b). Thus, in the array arrangement shown in FIG. 53 the "shared sense amplifier arrangement" is employed. Memory cell array 25 is divided into a plurality of array blocks 32a, 32b, ... 32n similarly to the structure shown in FIG. 51. In FIG. 53, there is also shown a (sense+I/O) block 34m utilized by array block 32n. The column select gates included in the (sense+I/O) blocks connect the selected columns to a block select circuit 38 via internal data buses 36a, ... 36n.

X-decoder 20 is disposed at one side of memory cell array 25, and Y-decoder 22 is provided commonly for a plurality of array blocks 32a, 32b, ... 32n. Similarly to the structure shown in FIG. 52, the column select signal supplied from Y-decoder 22 is commonly applied to array blocks 32a, 32b, ... 32n via column select lines CSL which are disposed extending throughout the memory cell array.

Block select circuit 38 includes block select switches provided corresponding to internal data buses 36a, ... 36m, and one or a predetermined number of global I/O bus(es) provided commonly to internal data buses 36a, ... 36m. The number of global I/O bus(es) depends on the number of bits of input/output data. During operation, one or a predetermined number of array blocks are activated, and the data of the activated array block(s) is selected by block select circuit 38 and is transmitted to an I/O circuit 39.

Figure 54:
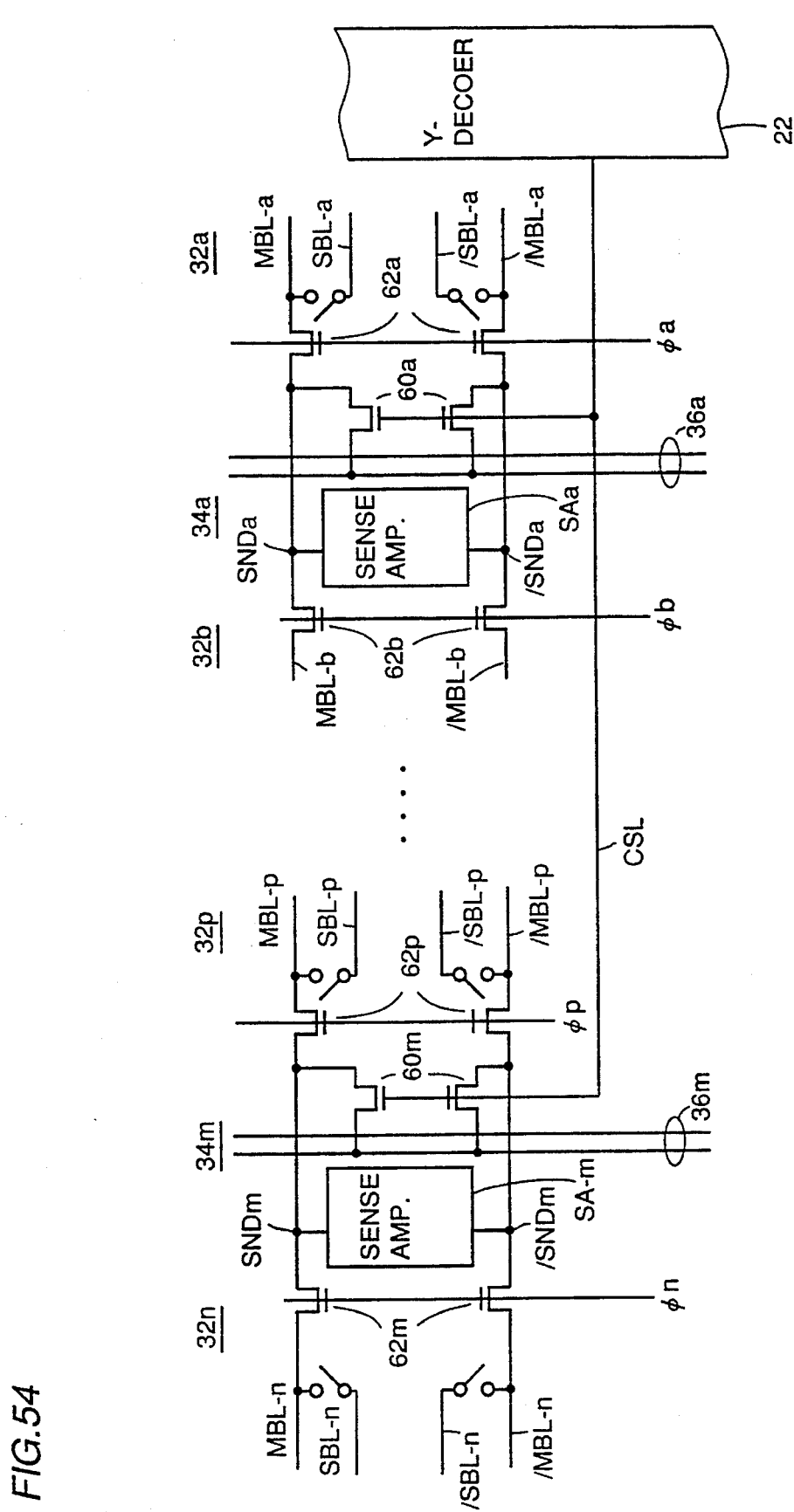
FIG. 54 shows a structure of a main portion of the array arrangement shown in FIG. 53.

FIG. 54 shows a structure of a main portion of the memory cell array shown in FIG. 53. FIG. 54 shows a portion of (sense+I/O) block 34a disposed between array blocks 32a and 32b and a portion of (sense+I/O) block 34m disposed between array blocks 32n and 32m (not shown in FIG. 53).

(Sense+I/O) block 34m includes an array block select gate 62a which connects main bit lines MBL-a and /MBL-a contained in array block 32a to sense nodes SNDa and /SNDa in response to an array block select signal φa, respectively, an array block select gate 62b which connects main bit lines MBL-b and /MBL-b contained in array block 32b to sense nodes SNDa and /SNDa in response to an array block select signal φb, respectively, a sense amplifier SA-a which differentially amplifies signal potentials on sense nodes SNDa and SNDa, and a column select gate 60a which connects sense nodes SNDa and /SNDa to internal data bus 36a in response to a column select signal which will be described later.

(Sense+I/O) block 34p includes an array block select gate 62p which connects main bit lines MBL-p and /MBL-p contained in array block 32p to sense nodes SNDm and /SNDm in response to an array block select signal φp, respectively, an array block select gate 62n which connects main bit lines MBL-n and /MBL-n contained in array block 32n to sense nodes SNDm and /SNDm in response to an array block select signal φn, respectively, a sense amplifier SA-m which differentially amplifies signal potentials on sense nodes SNDm and /SNDm, and a column select gate 60m which is turned on to connect sense nodes SNDm and /SNDm to internal data bus 36m in response to a column select signal which will be described later.

In each of array blocks 32a, 32b, 32p and 32n, sub-bit lines SBL and /SBL are disposed corresponding to the main bit lines. These main bit lines and sub-bit lines may be arranged in any form, provided that they form the hierarchical bit lines. The main bit lines and sub-bit lines included in each array block are distinguished from those in the other array blocks with the same suffixes as the characters added to the array blocks.

Y-decoder 22 is provided with output nodes each corresponding to a predetermined number of column. In the example shown in FIG. 54, each output node corresponds to one column. The output nodes of Y-decoder 22 are connected to column select lines CSL extending throughout memory array blocks 32a–32n. The column select signal is transmitted onto these column select lines CSL to turn on/off column select gates 60a–60m. Then, the operation will be briefly described below.

In the "partial activation" system, only a predetermined number of array block(s) are selected in memory cell array 25. It is assumed that only array block 32a is selected. In this case, array block select signal φa attains the high level, and array block select signal φb attains the low level. Thereby, main bit lines MBL-a and /MBL-a are connected to sense nodes SNDa and /SNDa of sense amplifier SA-a. Internal bit lines MBL-b and /MBL-b are isolated from sense nodes SNDa and /SNDa. In array blocks 32p and 32n, both array block select signals φp and φn maintain the high level, and these array blocks 32p and 32n maintain the standby state. Sub-bit lines SBL-p, /SBL-p, SBL-n and /SBL-n are isolated from corresponding main bit lines MBL-p, /MBL-p, MBL-n and /MBL-n, respectively.

After data of the memory cell are read and the signal potentials to sense nodes SNDa and /SNDa sufficiently are increased, the column select signal from Y-decoder 22 is transmitted onto column select lines CSL. Column select gates 60a, ... 60m are turned on in response to the column select signal on column select lines CSL, so that sense nodes SNDa and /SNDa, ... SNDm and /SNDm are connected to internal data buses 36a, ... 36m. These internal data buses 36a, ... 36m have been precharged to the intermediate potential. Therefore, the potential of internal data bus 36m does not change because sense nodes SNDm and /SNDm maintain the intermediate potential, i.e., the standby state. Meanwhile, the potential of internal data bus 36a changes in accordance with the potentials of sense nodes SNDa and /SNDa, and is transmitted to I/O circuit 39 via block select circuit 38 shown in FIG. 53. Thereafter, I/O circuit 39 and block select circuit 38 perform writing or reading of data.

As shown in FIGS. 53 and 54, Y-decoder 22 is provided commonly to a plurality of array blocks, and the column select lines for transmitting the output of Y-decoder 22 are disposed throughout the memory cell array. This can reduce the number of Y-decoders, and can reduce an area occupied by the memory cell array.

In the structure shown in FIGS. 53 and 54, the operation of selecting the memory cell is performed in accordance with the partial activation method in the shared sense amplifier arrangement. For this operation, such a structure may be employed in which all the array blocks (actually, a half of array blocks in memory cell array 25) are activated, block select circuit 38 selects the required number of array blocks (depending on the number of bits of input/output data), and data is input/output through I/O circuit 39.

[Array Arrangement 3]

Figure 55:
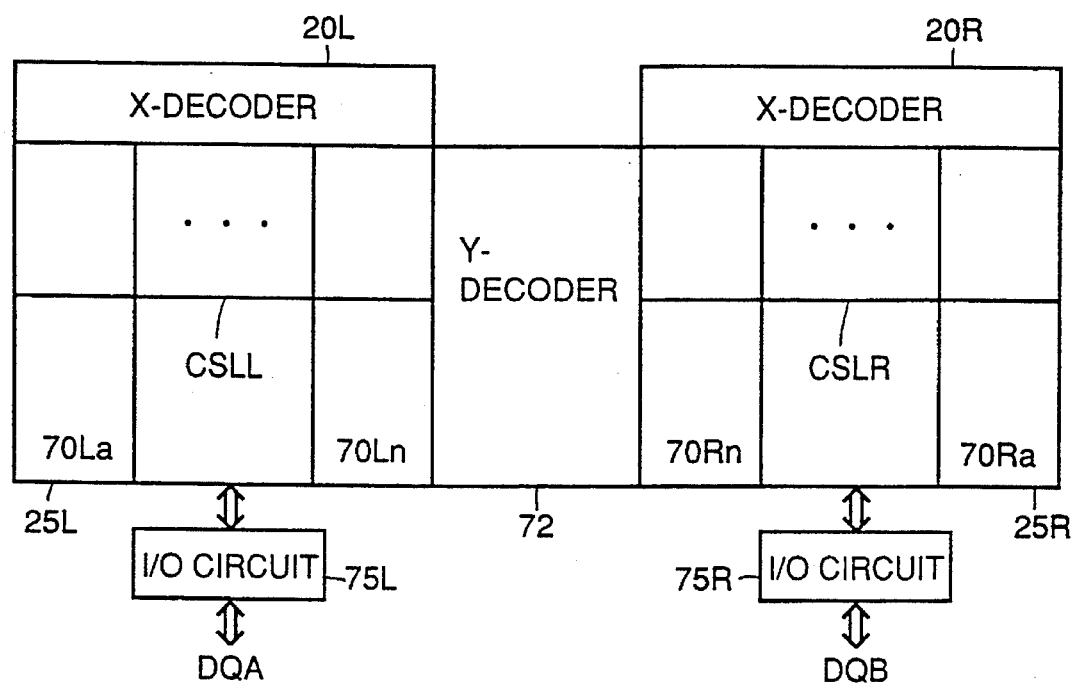
FIG. 55 shows still another array arrangement in the semiconductor memory device according to the invention.

FIG. 55 shows still another example of arrangement of the memory cell array. In FIG. 55, a Y-decoder 72 is disposed between memory cell arrays 25L and 25R. Memory cell array 25L is divided into a plurality of memory array blocks 70La–70Ln, and memory cell array 25R is divided into a plurality of memory array blocks 70Ra–70Rn. Each of array blocks 70La–70Ln and 70Ra–70Rn is further divided into memory cell blocks, and includes sub-bit lines arranged corresponding to each memory cell block. Thus, each array block has the hierarchical bit like structure. This hierarchical bit lines may have any appropriate structure.

X-decoders 20L and 20R are provided corresponding to memory cell arrays 25L and 25R, and I/O circuits 75L and 75R are also provided for inputting/outputting data.

The output signal from Y-decoder 72 is transmitted onto all array blocks 70La–70Ln in memory cell array 25L via column select lines CSLL, and is also transmitted commonly onto all array blocks 70Ra–70Rn in memory cell array 25R via column select lines CSLR. In the arrangement shown in FIG. 55, Y-decoder 72 is utilized commonly by the two memory cell arrays, so that an area occupied by the Y-decoder can be reduced, and an area occupied by the semiconductor memory device can be made small.

Sense amplifiers in memory cell arrays 25L and 25R may be arranged in any one of the constructions shown in FIGS. 52 and 54. In the arrangement shown in FIG. 55, data DQA and DQB are input/output via I/O circuits 75L and 75R with respect to the selected memory cells in memory cell arrays 25L and 25R, respectively. Such a structure may be employed that includes circuits connected to I/O circuits 75L and 75R for performing input/output of data with respect to only one of the I/O circuits (thus, input/output of data are performed with respect to only one of memory cell arrays 25L and 25R).

To each of memory cell arrays 25L and 25R the "partial activation" scheme structure which activates a predetermined number of array blocks may be applied.

[Arrangement of Block Select Lines]

Figure 56:
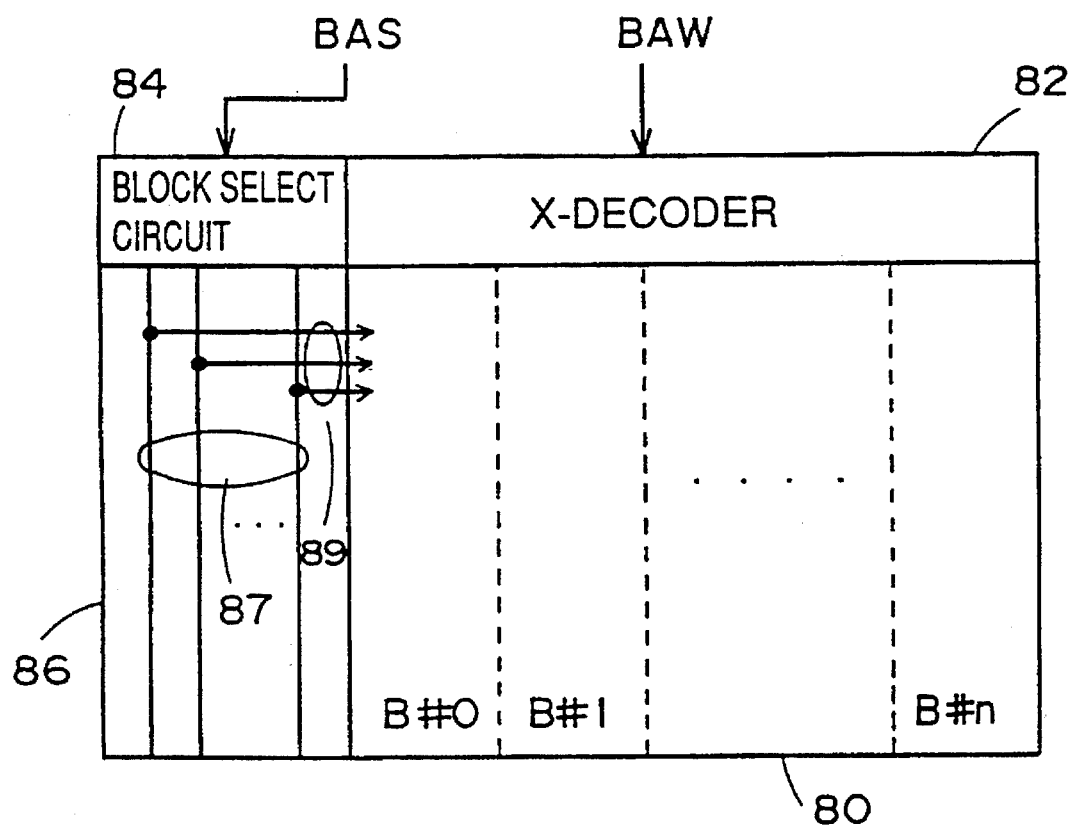
FIG. 56 shows a structure for transmitting a block select signal in the semiconductor memory device according to the invention.

FIG. 56 shows arrangement of the block select lines which transmit the block select signals for selecting the memory cell blocks. In FIG. 56, one array block 80 is shown. An X-decoder 82 is provided corresponding to array block 80. Array block 80 is divided into (n+1) memory cell blocks B#0–B#n. X-decoder 82 decodes a row address signal BAW including a block designating signal to bring the word line in one of memory cell blocks B#0–B#n to the selected state. FIG. 56 shows, as an example, a semiconductor memory device of the "partial activation" scheme which utilize row address signal BAW including the block designating signal. Such a structure may be utilized in which all the array blocks are brought to the selected state. In this case, row address signal BAW does not include the block designating signal for designating an array block (however, in the case of the shared sense amplifier arrangement, it naturally includes the block designating signal because only one of the associated blocks is connected to the sense amplifier).

There is disposed a block select circuit 84 which is adjacent to X-decoder 82 and is responsive to block address BAS to supply to each of memory cell blocks B#0–B#n the block select signal for connecting the sub-bit lines to the main bit lines. A block select signal transmitting line extending from block select circuit 84 includes a main block select signal transmitting bus 87 in an interconnection region 86 for supplying the block select signal commonly to all the columns (main bit line pairs), and block select signal transmission sub-buses 89 each of which is provided corresponding to a predetermined number of columns in the array block 80 for transmitting the block select signal to the predetermined number of columns. Main block select signal transmission bus 87 extends in the row direction (word line extending direction), and block select signal transmission sub-buses 89 extend in the column (main bit line extending direction).

As shown in FIG. 56, since block select circuit 84 is provided independently from X-decoder 82, X-decoder 82 is not required to contain a circuit portion generating the block select signal, so that the block select circuits can be arranged concentratedly at one place, and only the decoder circuits are repetitively disposed in X-decoder 82, which facilitates design of layout inside X-decoder 82 and allows reduction of the occupied area. Also, the block select circuit 84 is arranged concentratedly at one place, so that an area occupied thereby can be made smaller than that in the case where block select circuits are dispersedly disposed in X-decoder 82, and thus the occupied area can be reduced. If a portion such as an X-decoder repetitively including the same layout patterns were internally provided with portions such as block select circuits having a different circuit structure, regularity of the layout pattern would be impaired, so that an extra space or area would be required at connection to these different circuit portions, resulting in increase of an area occupied by the circuitry. By concentratedly disposing the circuit portions having the same function at one place, it is possible to optimize the layout pattern and to minimize the occupied area.

Figure 57:
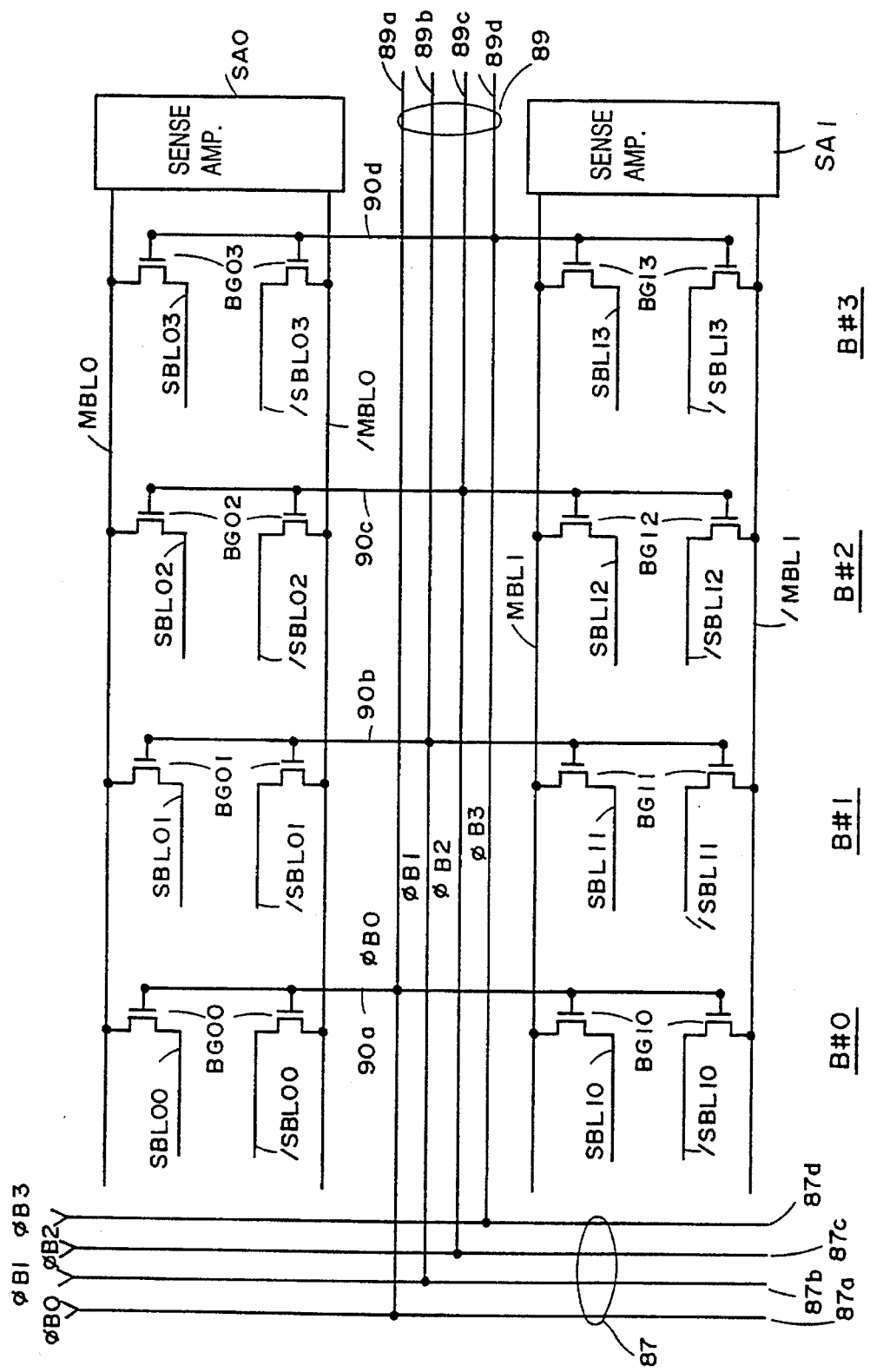
FIG. 57 shows a more specific structure of the main portion shown in FIG. 56.

FIG. 57 shows a portion related to one pair of main bit lines in array block 80 shown in FIG. 56. FIG. 57 shows, as an example, a structure in which the memory cell block includes four blocks. But, it may include more or fewer blocks.

For main bit line pair MBL0 and /MBL0, as shown in FIG. 57, there are provided sub-bit line pairs SBL00 and /SBL00, SBL01 and /SBL01, SBL02 and /SBL02, and SBL03 and /SBL03 corresponding to memory cell blocks B#0–B#3, respectively. Sense amplifier SA0 is provided for main bit line pair MBL0 and /MBL0. Block select gates are provided for connecting the sub-bit lines and the main bit lines, and are controlled to be turned on and off by the block select signal which will be described later. Main bit lines MBL0 and /MBL0 as well as sub-bit lines SBL00 and /SBL00–SBL03 and /SBL03 shown in FIG. 57 have a typical hierarchical bit line structure, but may have the hierarchical bit line structure in any of the embodiments already described. An arrangement of lines transmitting the block select signals, which will be described later, can be generally applied to a semiconductor memory device having a hierarchical bit line structure, and hence, a general hierarchical bit structure is shown as the bit line structure in FIG. 57.

For main bit line pair MBL1 and /MBL1, there are provided sub-bit line pairs SBL10 and /SBL10, SBL11 and /SBL11, SBL12 and /SBL12, and SBL13 and /SBL13 corresponding to memory cell blocks B#0–B#3, respectively. Sense amplifier SA1 is provided for main bit line pair MBL1 and /MBL1. Sense amplifiers SA0 and SA1 in FIG. 57 are shown to sense and amplify only the potentials on the corresponding main bit line pairs. However, these sense amplifiers SA0 and SA1 may have the "shared sense amplifier arrangement".

At an end remote from sense amplifiers SA0 and SA1, there is disposed main block select signal transmission bus 87 extending in the row direction (direction of unillustrated word line extension). Main block select signal transmission bus 87 includes signal lines 87a, 87b, 87c and 87d which transmit block select signals φB0, φB1, φB2 and φB3, respectively. A block select signal transmission sub-bus 89 which is common to two main bit line pairs MBL0, /MBL0 and MBL1, /MBL1 is disposed at a region between these two pairs. Block select signal transmission sub-bus 89 includes a signal line 89a connected to signal line 87a and transmitting block select signal φB0, a signal line 89b connected to signal line 87b and transmitting block select signal φB1, a signal line 89c connected to signal line 87c and transmitting block select signal φB2, and a signal line 89d connected to signal line 87d and transmitting block select signal φB3.

Block select signal φB0 on signal line 89a is transmitted through a line or interconnection 90a to gates (control electrodes) of block select gates BG00 and BG10 which are provided for sub-bit line pair SBL00 and /SBL00 and sub-bit line pair SBL10 and /SBL10, respectively. Block select signal φB1 on signal line 89b is transmitted through a line or interconnection 90b to gates (control electrodes) of block select gates BG01 and BG11 which are provided for sub-bit line pair SBL01 and /SBL01 and sub-bit line pair SBL11 and /SBL11, respectively. Block select signal φB2 on signal line 89c is transmitted through a line or interconnection 90c to gates (control electrodes) of block select gates BG02 and BG12 which are provided for sub-bit line pair SBL02 and /SBL02 and sub-bit line pair SBL12 and /SBL12, respectively. Block select signal φB3 on signal line 89d is transmitted through a line or interconnection 90d to gates (control electrodes) of block select gates BG03 and BG13 which are provided for sub-bit line pair SBL03 and /SBL03 and sub-bit line pair SBL13 and /SBL13, respectively.

In operation, one of block select signals φB0-φB3 is activated in accordance with the position of the selected word line in the array block.

In the block select signal transmission sub-lines, one signal line drives up to four transistors (block select gates, the number of which changes depending on the applied hierarchical bit line structure), and the gate capacitance associated with this signal line is small. Therefore, the line widths of signal lines 89a-89d of block select signal transmission sub-bus 89 can be made relatively small (because a relatively large drive power is not required). If each of signal lines 87a-87d of main block select signal transmission bus 87 is made relatively wide and is made of material have a relatively low resistance, the block select signal can be transmitted at a high speed to each column. If the block select signal line extending from the output node of the block select circuit directly drives the block select gates in all the columns, the gate capacitance associated with this signal line would be large, resulting in a low-speed change of the signal potential. As shown in FIG. 57, however, the main line and sub-lines for transmitting the block select signal have the hierarchical structure, whereby the block select signal can be transmitted at a higher speed, i.e., at a speed higher than the speed of potential change of word line, so that connection and disconnection between the sub-bit line pairs and main bit line pairs can be performed at an accurate timing. Thus, the sub-bit lines and main bit lines can be surely connected together prior to rise of the potential of word line, and disconnection or isolation of the sub-bit lines from the main bit lines can be performed quickly after rise of the potential of a selected word line, so that it is not necessary to take a margin for the timing of change of the block select signal into consideration, allowing high-speed access.

[Modification]

Figure 58:
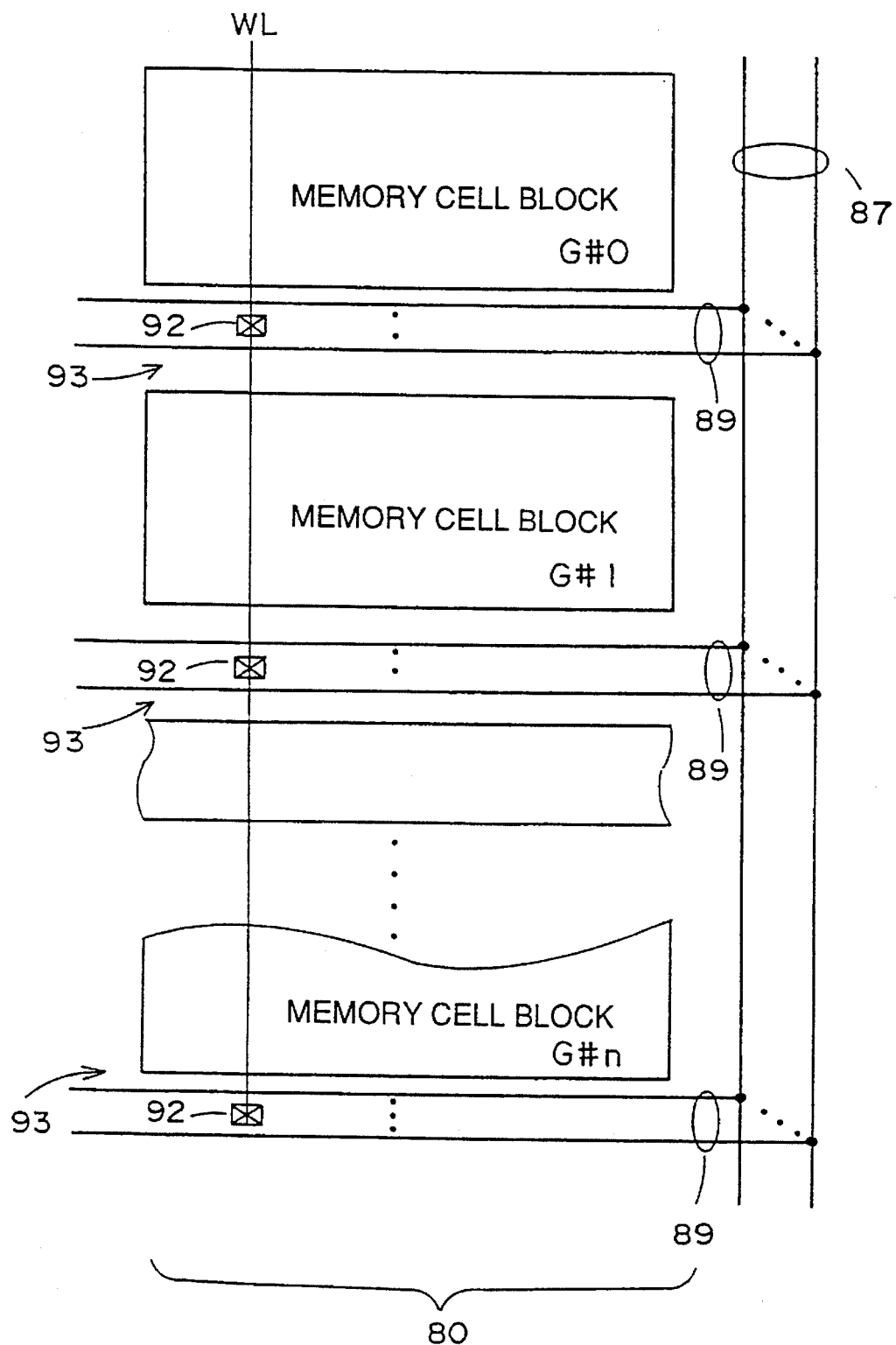
FIG. 58 shows another arrangement of block select signal transmitting lines in the semiconductor memory device according to the invention.

FIG. 58 shows a modification of the arrangement of block select signal transmission lines. In FIG. 58, array block 80 is divided into a plurality of ((n+1) in FIG. 58) memory cell groups G#0-G#n in the word line extending direction. Word line WL is provided commonly to these memory cell groups G#0-G#n. Word line shunt regions 93 are formed between the memory cell groups. In each word line shunt region 93, word line WL is connected to the word line drive signal transmission line of a low resistance via a contact region 92. A portion forming the gate of the access transistor included in a memory cell is made of polycrystalline silicon, a line or interconnection transmitting the word line drive signal is made of material of a low resistance, and the word line portion forming the gate of the memory cell access transistor is connected to a low resistance conductor in word line shut region 93. As a result, the resistance of the word line portion of polycrystalline silicon is reduced, and thus the word line drive signal is transmitted at a high speed to the gate of the access transistor in each memory cell. In word line shunt region 93, therefore, the memory cell does not exist. In other words, a main bit line and a sub-bit line are not disposed in word line shunt region 93. Block select signal transmission sub-bus 89 is disposed at each word line shunt region 93. Block select signal transmission sub-bus 89 is connected to main block select signal transmission bus 87 disposed at one end of the array block 80.

Owing to provision of block select signal transmission sub-buses 89 at word line shunt regions 93, it is not necessary to dispose block select signal transmission sub-buses 89 between the main bit lines, so that the block select signal transmission sub-bus can be disposed without affecting the pitch of main bit lines. Owing to provision of block select signal transmission sub-bus 89 at word line shunt region 93, the block select signal transmission sub-lines do not require an additional area, and thus do not increase an area occupied by the array.

In FIG. 58, block select signal transmission sub-buses 89 disposed at word line shunt regions 93 are provided for respective memory cell groups G#0-G#n. According to this structure, each block select signal transmission sub-bus 89 transmits the block select signal to a predetermined number of columns in the corresponding memory cell group G# (one of G#0-G#n). In the structure shown in FIG. 58, block select signal transmission sub-bus 89 may be constructed such that it is used commonly by two adjacent memory cell groups. This arrangement corresponds to the arrangement shown in FIG. 57 except for that block select signal transmission sub-bus 89 is disposed at the word line shunt region, with main bit lines MBL0 and /MBL0 corresponding one memory cell group, with the other main bit line pair MBL1 and /MBL1 corresponding to the other memory cell groups.

[Modification 2]

Figure 59:
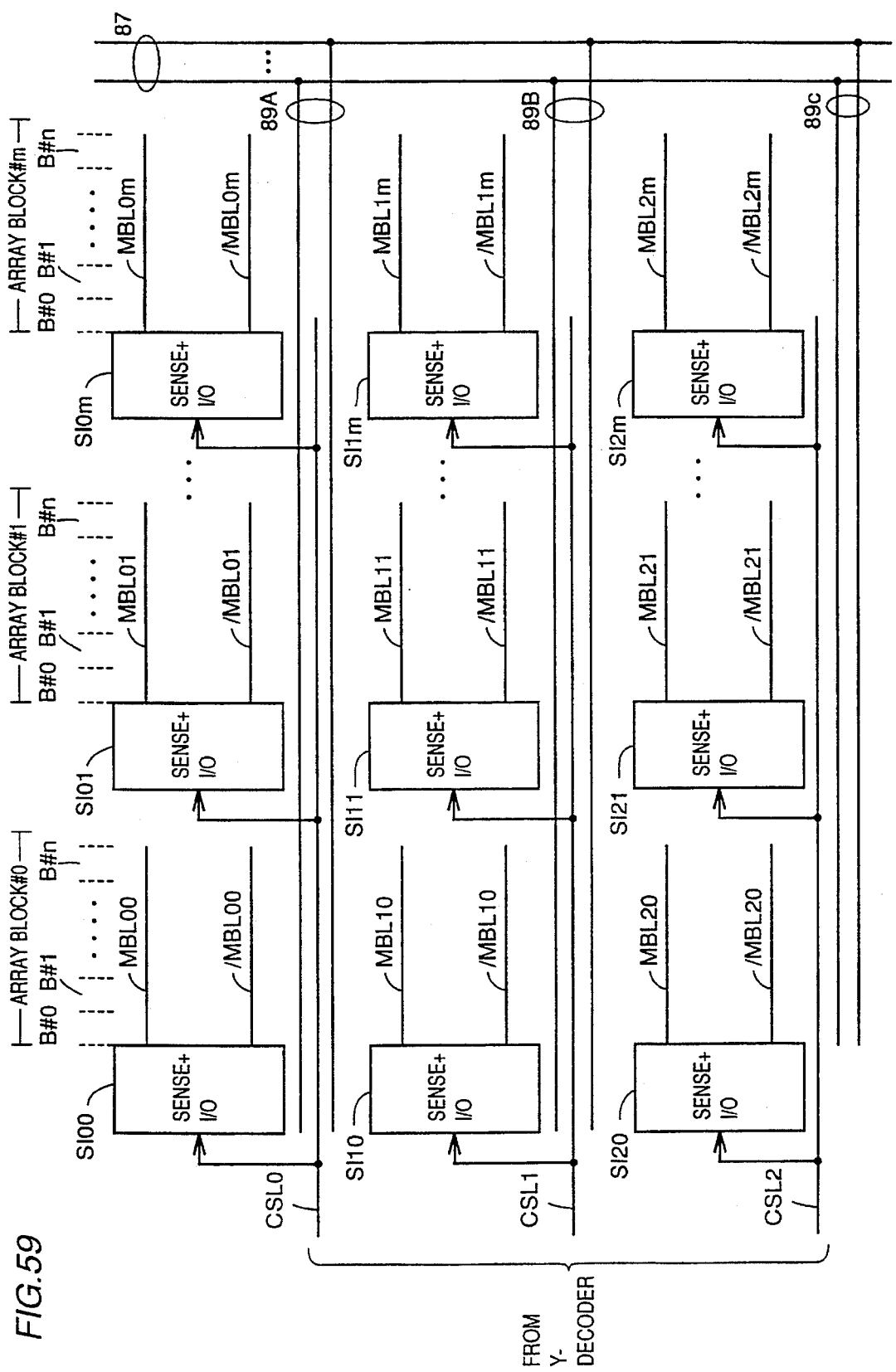
FIG. 59 shows still another arrangement of block select signal transmitting lines according to the invention.

FIG. 59 shows a second modification of the block select signal transmission lines. FIG. 59 shows only a memory cell array portion. In FIG. 59, the memory cell array is divided into a plurality of ((m+1) in FIG. 59) array blocks #0-#m. Each of array blocks #0-#m is divided into a plurality of cell blocks B#0-B#n.

In each of array blocks #0-#m, there are disposed main bit line pairs and (sense+I/O) blocks. FIG. 59 shows the structure relating to three columns. Array block #0 includes main bit lines MBL01 and /MBL01, MBL11 and /MBL11, and MBL21 and /MBL21. For these main bit line pairs MBL01 and /MBL01–MBL21 and /MBL21, there are disposed (sense+I/O) blocks SI00, SI10 and SI20 performing the sensing operation and column selecting operation (connection between the corresponding main bit lines and the internal data bus). Array block #2 includes main bit lines MBL02 and /MBL02, MBL12 and /MBL12, and MBL22 and /MBL22. For these main bit line pairs MBL02 and /MBL02–MBL22 and /MBL22, there are disposed (sense+I/O) blocks SI01, SI11 and SI21. Array block #m includes main bit lines MBL0m and /MBL0m, MBL1m and /MBL1m, and MBL2m and /MBL2m. For these main bit line pairs MBL0m and /MBL0m–MBL2m and /MBL2m, there are disposed (sense+I/O) blocks SI0m, SI1m and SI2m.

In connection with the main bit line pairs shown in FIG. 59, each array block is provided with sub-bit lines corresponding to memory cell blocks B#0–B#n. These sub-bit lines are not shown in FIG. 59 for simplicity reasons. The hierarchical bit lines may have any of the structures in the embodiments already described, and may also have a general hierarchical bit line structure.

At one end of the memory cell array, there is disposed main block select signal transmission bus 87 in the row direction. At a region between main bit line pairs MBL0i (i=0–n) and /MBL0i at the 0th column and main bit line pairs MBL1i and /MBL1i at the 1st column, there is disposed a block select signal transmission sub-bus 89A which is commonly used by array blocks #0–#m and transmits the block select signal to a half of memory cell blocks B#0–B#n (e.g., blocks at the front half). At a region between main bit line pairs MBL1i and /MBL1i at the 1st column and main bit line pairs MBL2i and /MBL2i at the 2nd column, there is disposed a block select signal transmission bus 89B which transmits the block select signal to the other half of memory cell blocks. Between main bit line pairs MBL2i and /MBL2i at the 2nd column and the main bit line pairs at the next column, there is disposed a block select signal transmission bus 89C which transmits the block select signal to the one half (e.g., front half) of the memory cell blocks. Block select signal transmission buses 89A, 89B and 89C are connected to the corresponding block select signal transmission lines in the main block select signal transmission bus 87. Corresponding to the respective columns, there are disposed column select signal transmission lines CSL0, CSL1 and CSL2, which are parallel to block select signal transmission sub-buses 89A, 89B and 89C, for transmitting the column select signal sent from the Y-decoder (not shown). Column select signal transmission lines CSL0–CSL2 commonly transmit the column select signal for (sense+I/O) blocks SI in the corresponding columns.

As shown in FIG. 59, since each of block select signal transmission buses 89A–89C transmits the block select signal for the half of the memory cell blocks, an area occupied by the block select signal transmission lines can be reduced, so that restriction by the pitch of main bit lines can be mitigated, and thus column select signal transmission lines CSL0–CSL2 can be disposed parallel to the block select signal transmission sub-lines.

In the structure shown in FIG. 59, main block select signal transmission bus 87 transmits the block select signal commonly to the respective array blocks #0–#m. According to the shared sense amplifier arrangement, nonselected array blocks maintain the standby state. Therefore, in the above "partial activation scheme", such a structure may be employed in which the main block select signal transmission lines are provided corresponding to the array blocks, respectively. Also in this structure, column select signal transmission lines CSL0–CSL2 are provided commonly to memory array blocks #0–#m. Also in the partial activation scheme, such a structure may be employed in which main block select signal transmission bus 87 is provided commonly to all the array blocks in order to reduce an area occupied by the array.

Figure 60:
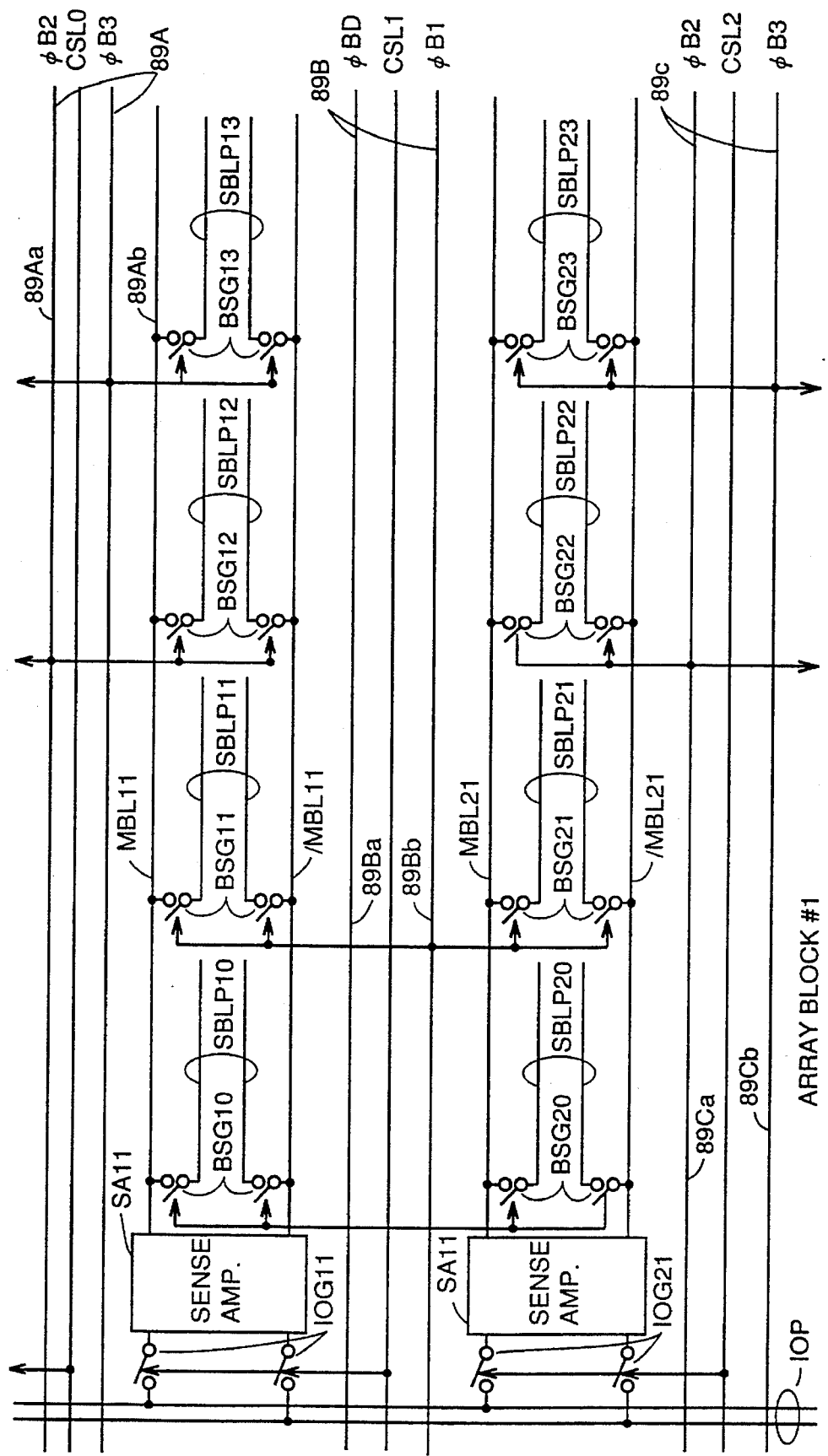
FIG. 60 shows a more specific structure of a main portion of the array arrangement shown in FIG. 59.
Figure 61:
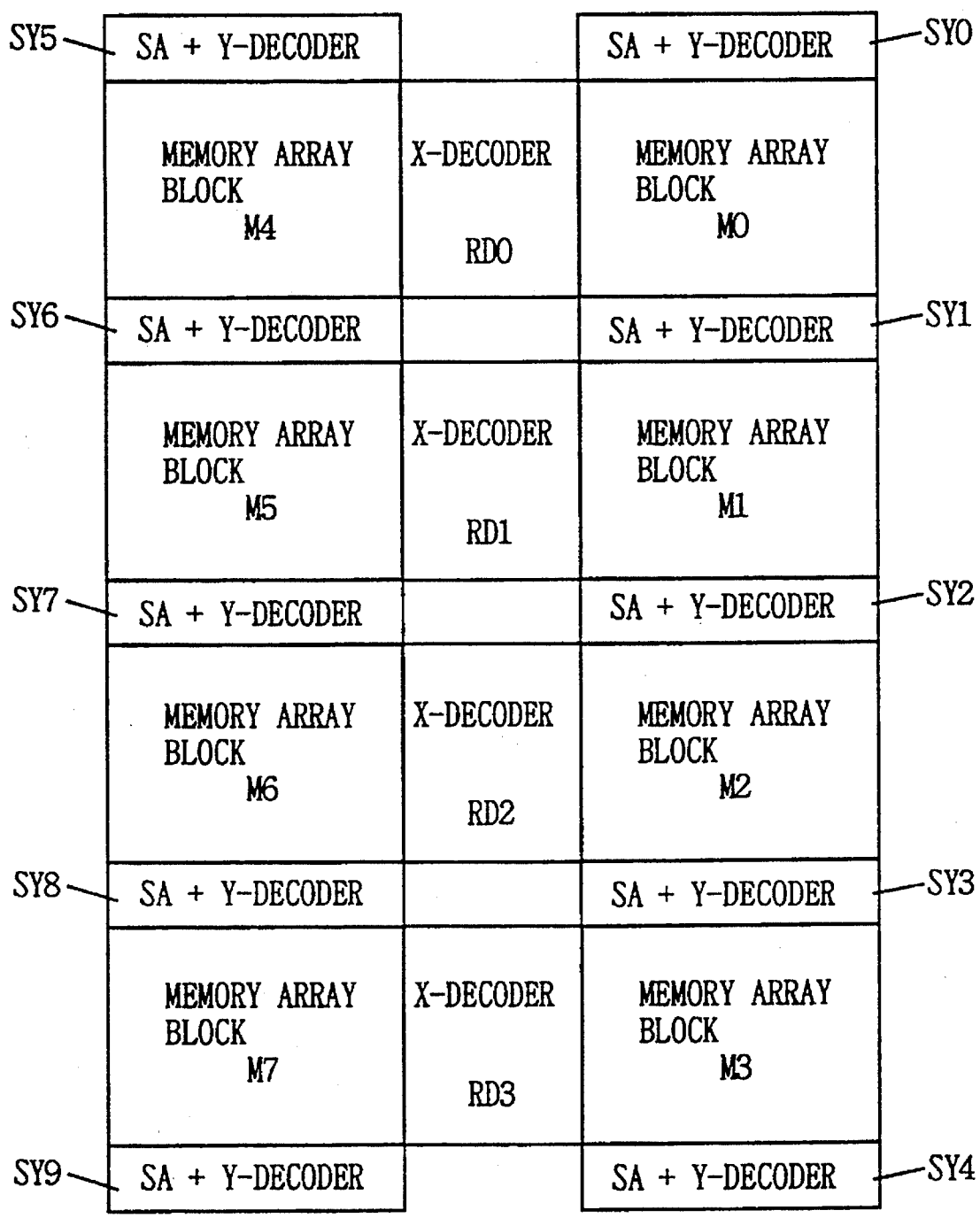
FIG. 61 schematically shows a whole structure of a semiconductor memory device in the prior art.
Figure 62:
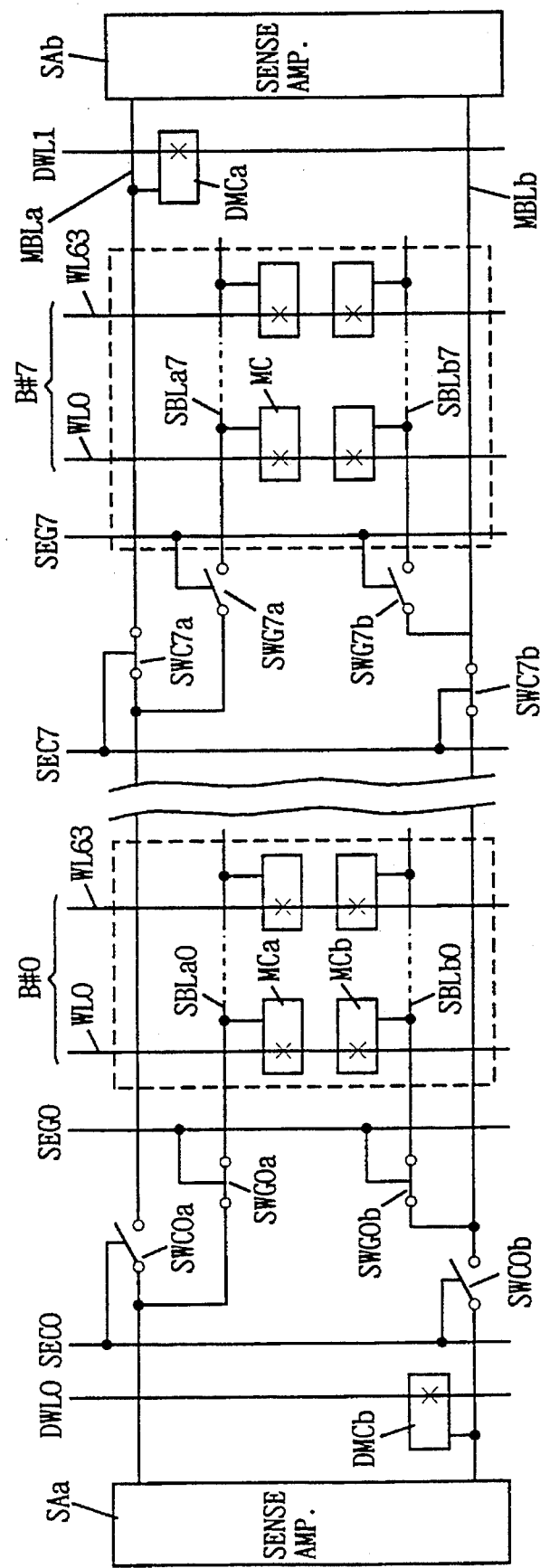
FIG. 62 shows a specific structure of an array portion in the semiconductor memory device shown in FIG. 61.
Figure 63:
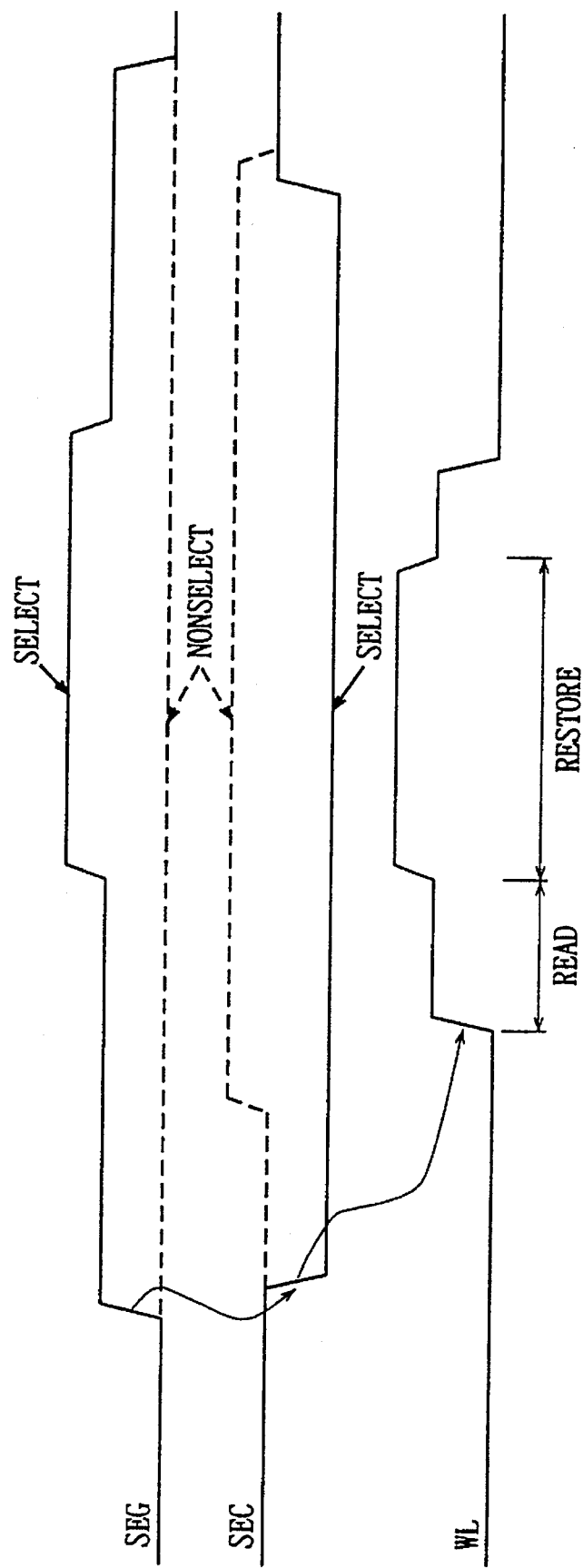
FIG. 63 is a signal waveform diagram showing operation of the semiconductor memory device shown in FIG. 62.
Figure 64:
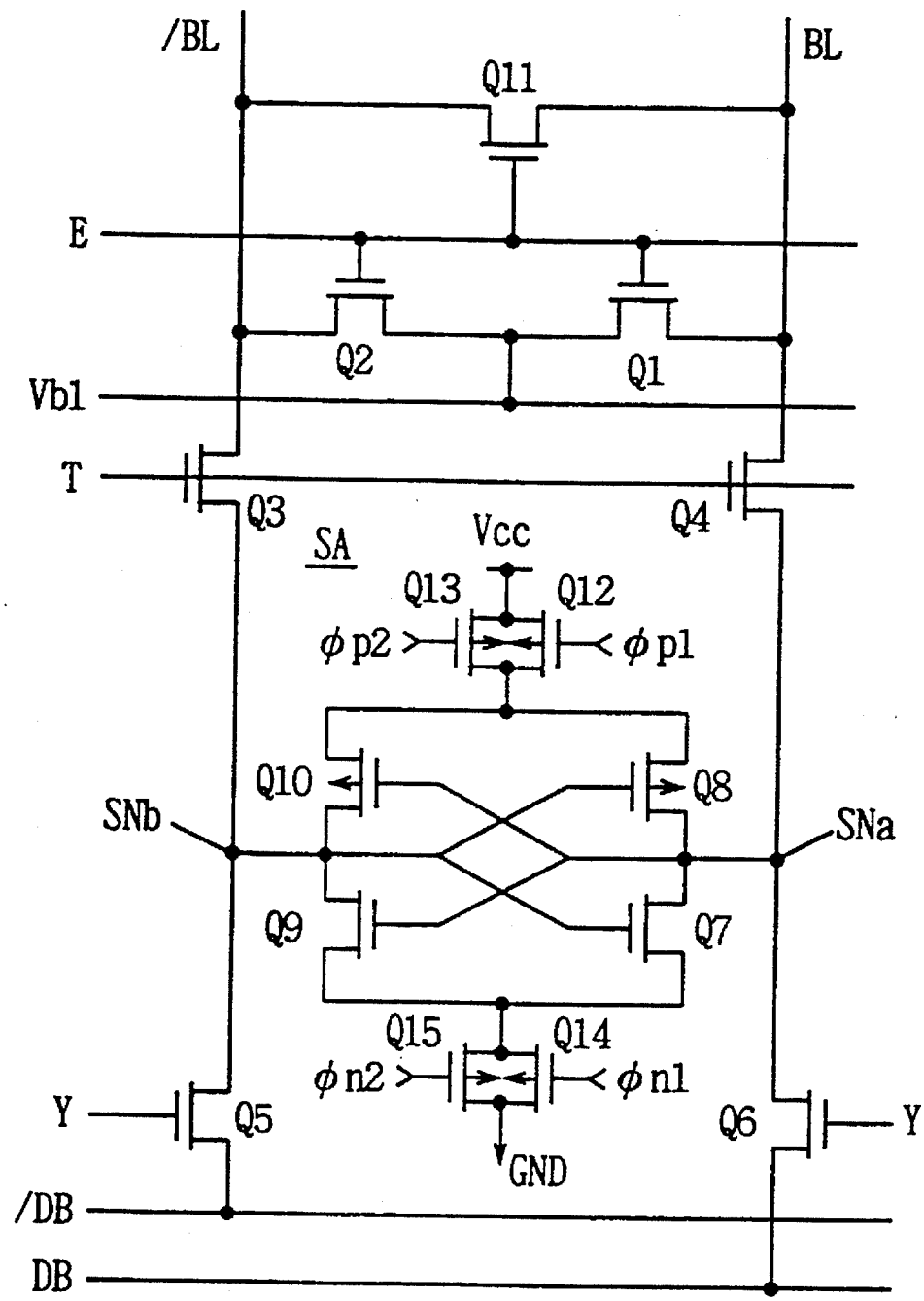
FIG. 64 shows a structure of a sense amplifier portion in the semiconductor memory device shown in FIG. 62.
Figure 65:
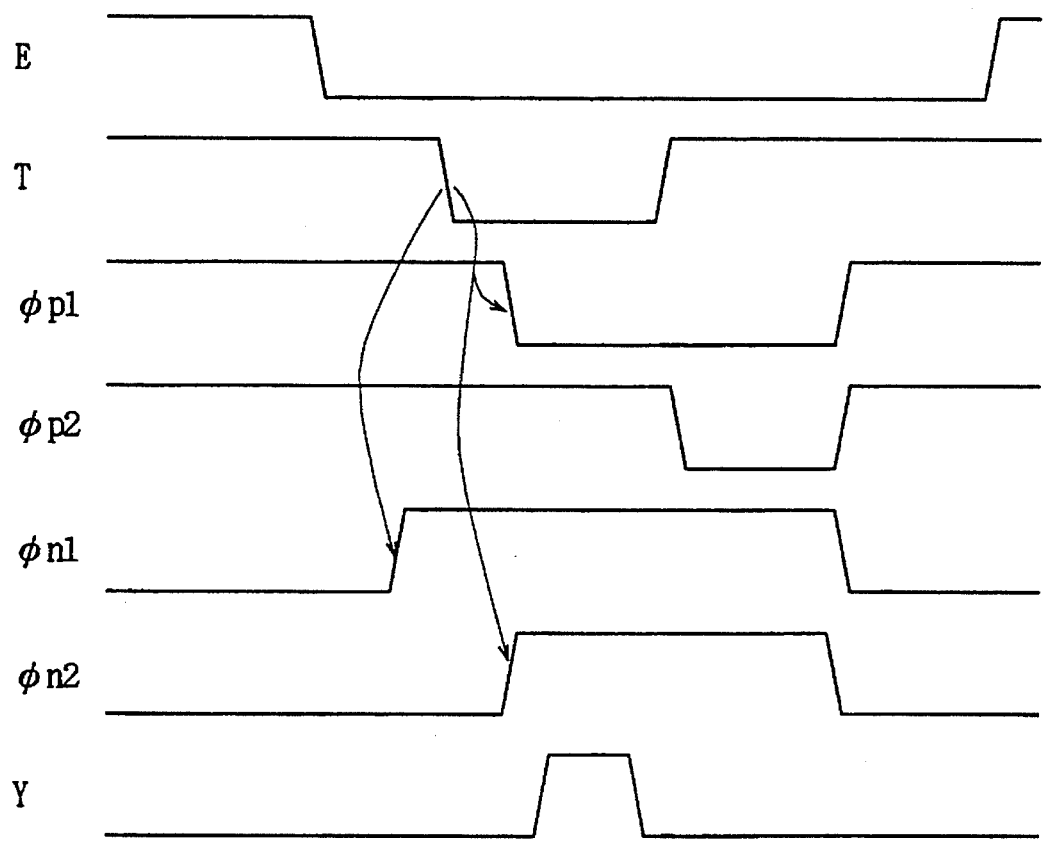
FIG. 65 is a signal waveform diagram showing operation of the sense amplifier portion shown in FIG. 64.
Figure 66:
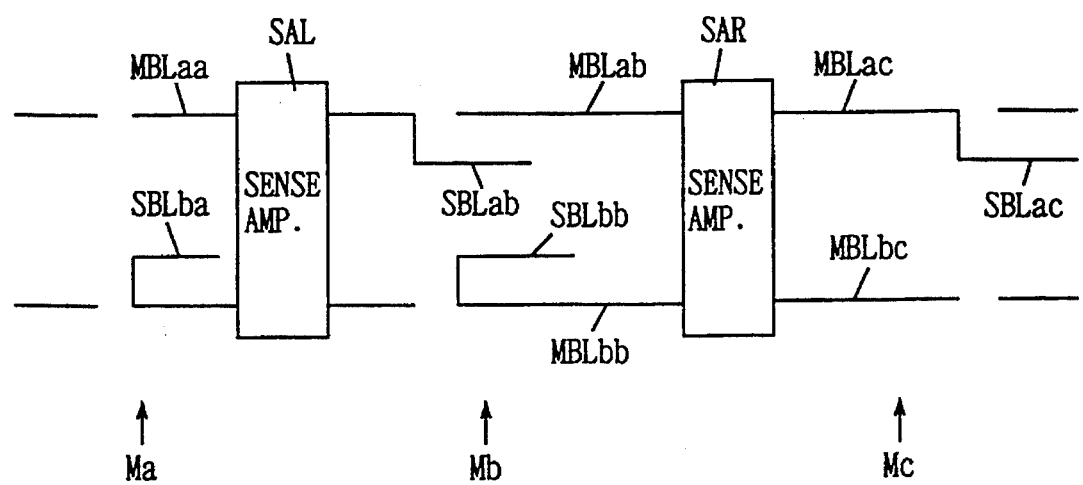
FIG. 66 specifically shows a connection mode of sub-bit lines and main bit lines attained when a word line is selected in the semiconductor memory device shown in FIG. 62.
Figure 67:
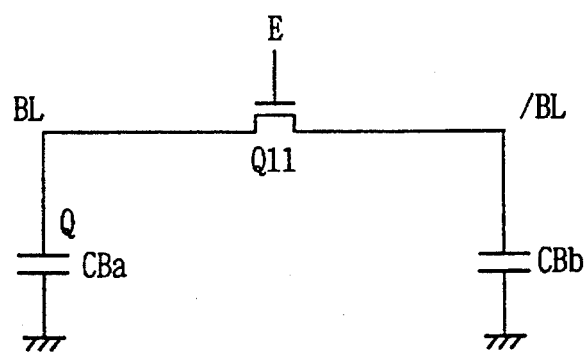
FIG. 67 illustrates a problem of the connection mode shown in FIG. 66.
Figure 68:
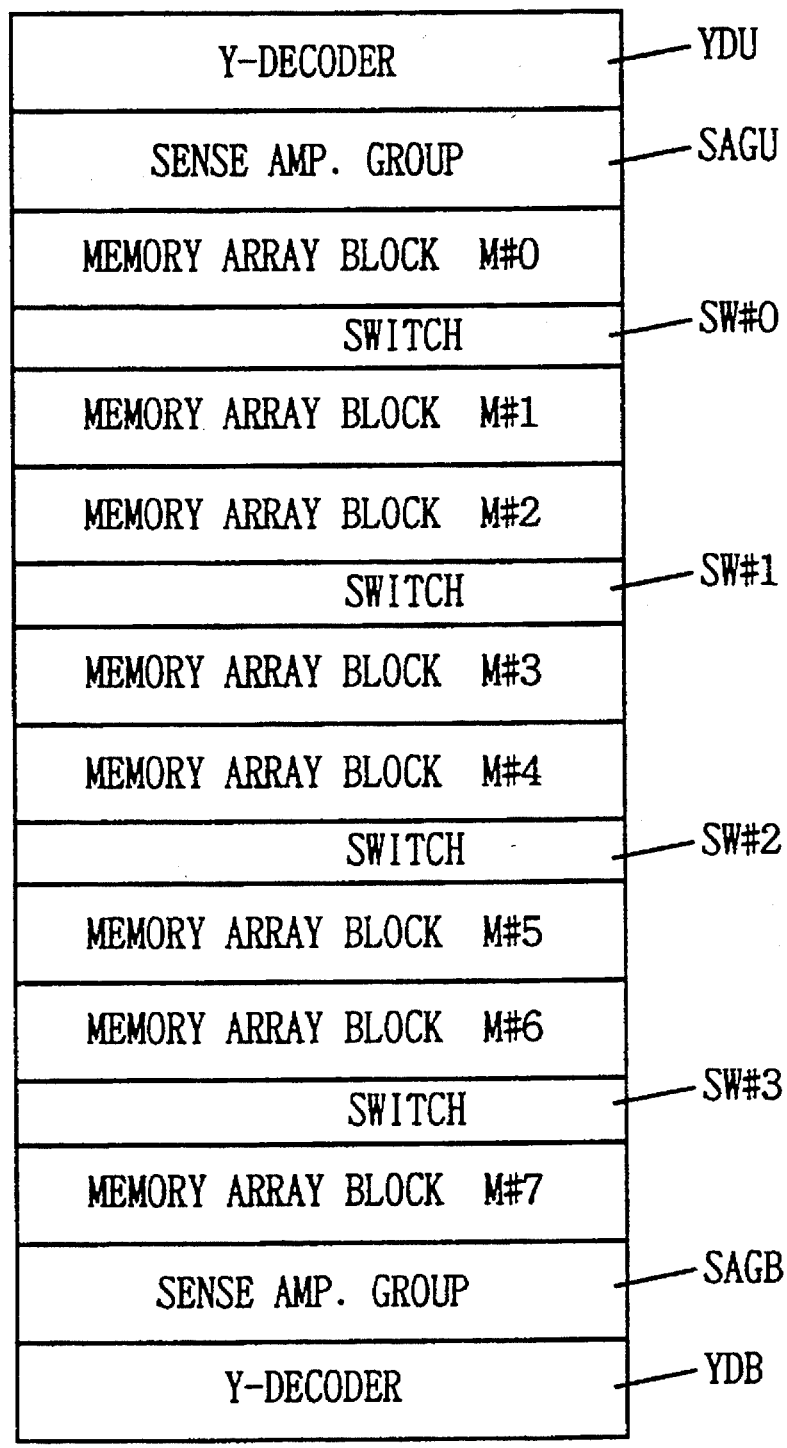
FIG. 68 shows another structure of the semiconductor memory device in the prior art.
Figure 70A:
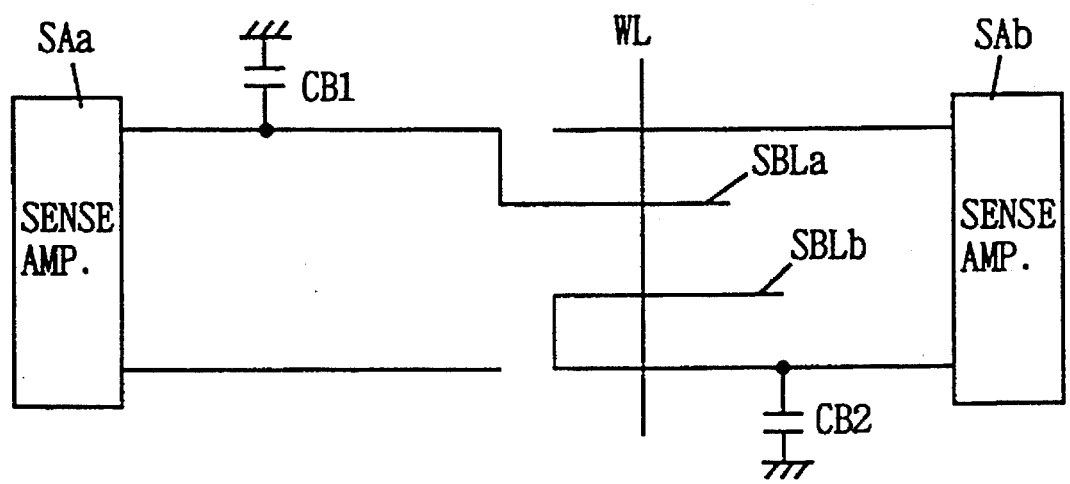
FIGS. 70A and 70B show a problem of a connection mode of the sub-bit lines and main bit lines shown in FIGS. 69A and 69B.
Figure 70B:
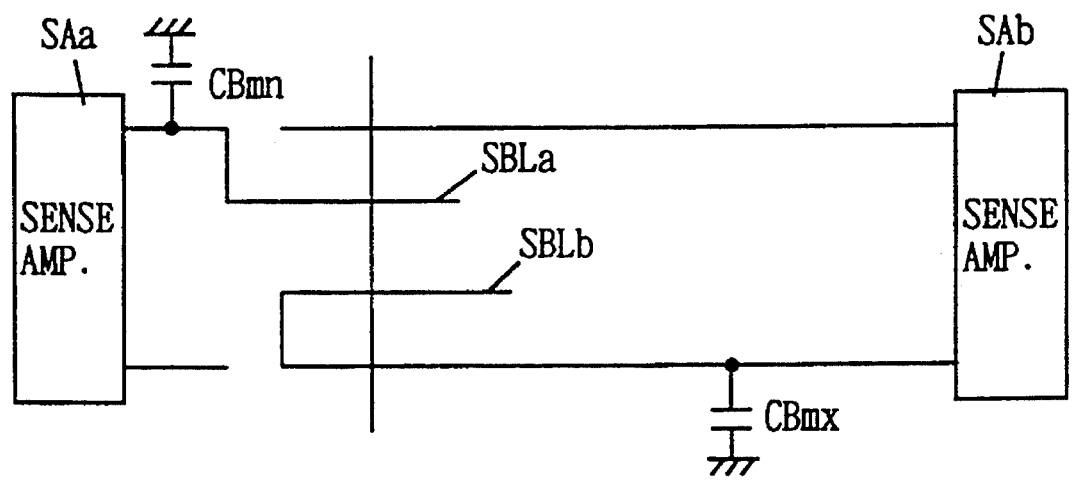
Figure 71:
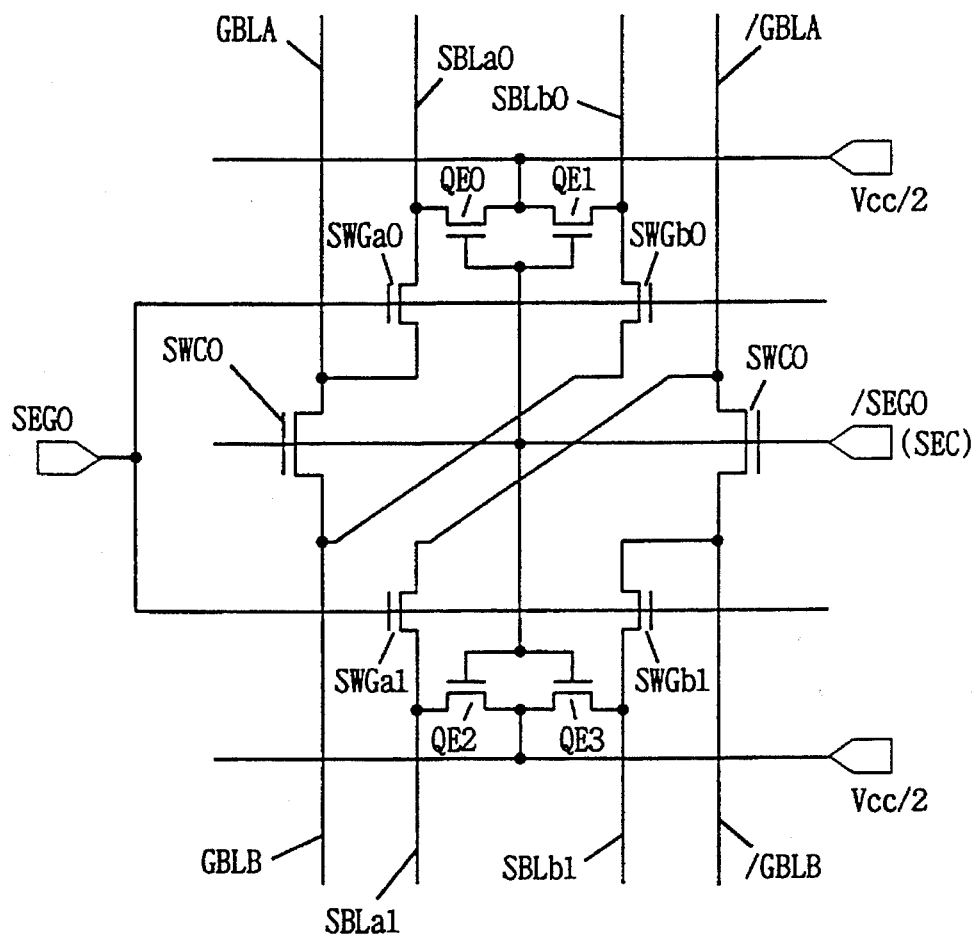
FIG. 71 shows a specific structure of a switch circuit portion of the semiconductor memory device shown in FIG. 69.
Figure 72:
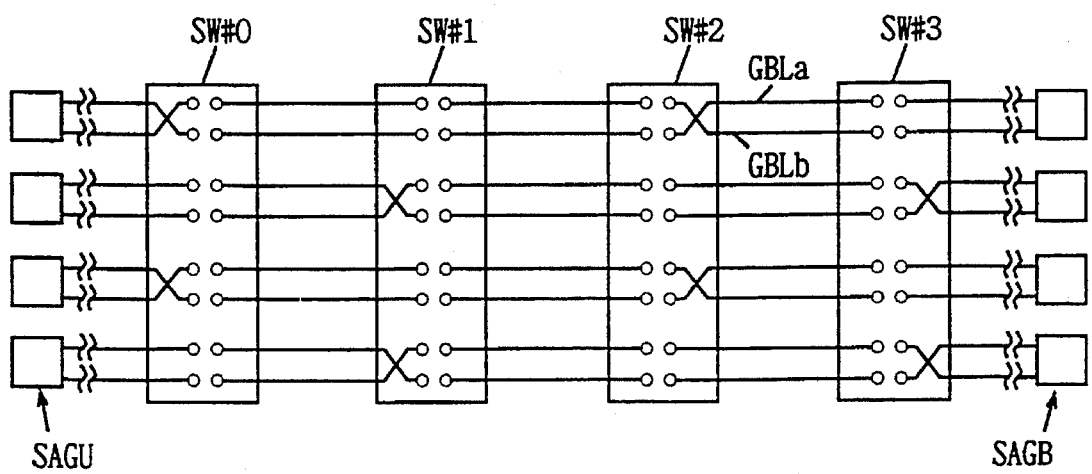
FIG. 72 shows a structure of the main bit lines of the semiconductor memory device shown in FIG. 68.

FIG. 60 shows a structure related to two columns included in one array block of the array portion shown in FIG. 59. FIG. 60 shows, as an example, the structure in which the array block is divided into four memory cell blocks.

FIG. 60 shows the structure of a portion of array block #1 shown in FIG. 59. Each array block which is not shown in FIG. 60 has the same structure and arrangement as those shown in FIG. 60. Description will be given in connection with the structure related to two pairs of main bit lines with reference to FIG. 60. For main bit line pair MBL11 and /MBL11, there are provided four sub-bit line pairs SBLP10, SBLP11, SBLP12 and SBLP13 corresponding to the cell blocks. For sub-bit line pairs SBLP10 and SBLP11, there are provided block select gates BSG10 and BSG11 which are turned on in response to block select signals $\phi B0$ and $\phi B1$, respectively. For sub-bit line pairs SBLP12 and SBLP13, there are provided block select gates BSG12 and BSG13 which are turned on in response to block select signals $\phi B2$ and $\phi B3$, respectively. A sense amplifier SA11 is provided for main bit line pair MBL11 and /MBL11. Sense nodes of sense amplifier SA11 are connected to an internal data bus IOP via an I/O gate IOG11 which is turned on in response to column select signal CSL0. Although the select gates are shown in FIG. 60 as mechanical switches, they are actually formed of transistor elements as already described in the above embodiments.

For main bit line pair MBL21 and /MBL21, there are provided sub-bit line pairs SBLP20, SBLP21, SBLP22 and SBLP23, and there is also provided a sense amplifier SA21. Sub-bit line pairs SBLP20 and SBLP21 are provided with block select gates BSG20 and BSG21 which are turned on in response to block select signals $\phi B0$ and $\phi B1$, respectively. Sub-bit line pairs SBLP22 and SBLP23 are provided with block select gates BSG22 and BSG23 which are turned on in response to block select signals $\phi B2$ and $\phi B3$, respectively. Sense nodes of sense amplifier SA21 are connected to internal data bus IOP via an I/O gate IOG21 which is turned on in response to column select signal CSL2. Block select gates BSG10–BSG23 connect the corresponding sub-bit lines to the corresponding main bit lines when turned on.

A block select signal transmission sub-bus 89A is adjacent and parallel to main bit line MBL11. Block select signal transmission sub-bus 89A includes signal lines 89Aa and 89Ab transmitting block select signals $\phi B2$ and $\phi B3$, respectively. Block select signals $\phi B2$ and $\phi B3$ on signal lines 89Aa and 89Ab are transmitted to control electrodes of block select gates BSG12 and BSG13, respectively. Column select signal transmission line CSL0 is disposed parallel to block select signal transistors 89Aa and 89Ab (and between them in FIG. 60). Column select signal transmission line CSL0 is connected to an I/O gate of a not shown (sense+I/O) block. Block select signal transmission sub-bus 89B is disposed between main bit lines /MBL11 and MBL21. Block select signal transmission sub-bus 89B includes a signal line 89Ba transmitting block select signal $\phi B0$ and a signal line 89Bb transmitting block select signal $\phi B1$. Block select signal $\phi B0$ on signal line 89Ba is applied to block select gates BSG10 and BSG20. Block select signal $\phi B1$ on signal line 89Bb is applied to control electrodes of block select gates BSG11 and BSG21.

Block select signal transmission sub-bus 89C is disposed parallel to main bit line /MBL21 and located at a position lower than the line /MBL21 in the figure. Block select signal transmission sub-bus 89C includes a signal line 89Ca transmitting block select signal φB2 and a signal line 89Cb transmitting block select signal φB3. Block select signal φB2 on signal line 89Ca is applied to block select gate BSG22. Block select signal φB3 on signal line 89Cb is applied to control electrodes of block select gate BSG23.

Column select signal transmission line CSL1 is disposed parallel to block select signal transmission sub-bus 89B, and column select signal transmission line CSL2 is disposed parallel to block select signal transmission sub-bus 89C. As shown in FIG. 60, the block select signal transmission lines which transmit the block select signal for selecting a half of the memory cell blocks are disposed at regions between the main bit lines, so that an area occupied by block select signal transmission sub-lines can be reduced, and thus these block select signal transmission lines can be disposed between the main bit lines without adversely affecting the pitch of main bit lines. Also, column select signal transmission lines CSL can be disposed parallel to these block select signal transmission sub-lines.

In the arrangement shown in FIG. 60, the block select signal transmission sub-lines alternately transmit the block select signals for the first half of memory cell blocks and the second half of memory cell blocks. Alternatively such a structure may be employed in which block select signal transmission sub-lines for selecting memory cell blocks at the odd positions and block select signal transmission sub-lines for selecting memory cell blocks at the even positions are alternately disposed in groups.

The arrangement of the block select signal transmission lines and column select signal transmission lines shown in FIG. 60 can be combined with any hierarchical bit line structure. Naturally, the above described arrangement can be similarly utilized together with the shared sense amplifier arrangement.

In the embodiments described above, the hierarchical bit lines has a double layer structure which includes a sub-bit line and a main bit line formed of different level interconnection layers. However, the hierarchical bit line structure may be formed of three of more level interconnection layers. The bit lines may be made of polycrystalline silicon or metal such as tungsten or aluminum.

The sub-bit lines are not provided with a sense amplifier. The sense amplifiers are provided only for the main bit lines. However, sense amplifiers and equalizing transistors may also be provided for the sub-bit lines, in which case effects similar to those of the above embodiments can be achieved.

The memory cell may have a structure other than that of 1-transistor/1-capacitor type.

The invention can be generally applied to the structure in which complementary signal transmission line pair transmitting mutually complementary signals forms the hierarchical structure.

According to one aspect of the invention, as described hereinbefore, it is possible to keep balance between capacitances of a bit line for receiving data from a memory cell and a reference bit line, and the sensing operation can be performed stably with a large noise margin in the semiconductor memory device having the hierarchical bit line structure.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a plurality of memory cells arranged in a matrix of rows and columns, said matrix being divided into a plurality of blocks of rows of memory cells;

a plurality of main bit lines arranged corresponding to said columns;

a plurality of sub-bit lines arranged corresponding to said plurality of blocks in each of said columns, each of said plurality of sub-bit lines being connected to memory cells on a corresponding column, said plurality of sub-bit lines being disposed such that adjacent two sub-bit lines in a row direction form a pair, and each said pair of sub-bit line including a first sub-bit line and a second sub-bit line;

block select gate means provided in each of said columns for selectively connecting said sub-bit lines to said main bit lines in response to a block select signal designating a block among said plurality of blocks, said block select gate means including gate means for connecting at least one of said sub-bit lines on a corresponding column to a first main bit and connecting at least another one of said sub-bit lines to a second main bit line in response to said block select signal, said first main bit line and said second main bit line forming a pair; and a plurality of sense amplifiers provided corresponding to each main bit line pair for corresponding main bit lines, for sensing and amplifying signals on the corresponding first and second main bit lines;

said block select gate means including gates disposed to make connection between said sub-bit lines and said main bit lines such that ways of said connection with respect to adjacent main bit line pairs are different from each other.

2. A semiconductor memory device, comprising:

a plurality of memory cells arranged in a matrix of rows and columns, said matrix being divided into a plurality of blocks of rows of memory cells;

a plurality of main bit lines arranged corresponding to said columns;

a plurality of sub-bit lines arranged corresponding to said plurality of blocks in each of said columns, each of said plurality of sub-bit lines being connected to memory cells on a corresponding column, said plurality of sub-bit lines being disposed such that adjacent two sub-bit lines in a row direction form a pair, and each said pair of sub-bit lines including a first sub-bit line and a second sub-bit line;

block select gate means provided in each of said columns for selectively connecting said sub-bit lines to said main bit lines in response to a block select signal designating a block among said plurality of blocks, said block select gate means including gate means for connecting at least one of said sub-bit lines on a corresponding column to a first main bit line and connecting at least another one of said sub-bit lines to a second main bit line in response to said block select signal, said first main bit line and said second main bit line forming a pair; and a plurality of sense amplifiers provided corresponding to each main bit line pair for sensing and amplifying signals on the corresponding first and second main bit lines;

said block select gate means including gate means for connecting a first main bit line of an adjacent main bit line pair to said second sub-bit line in the corresponding column, and connecting the second main bit line in the corresponding column to a first sub-bit line of said adjacent main bit line pair.

3. A semiconductor memory device comprising:

a plurality of memory cells arranged in a matrix of rows and columns, said matrix being divided into a plurality of blocks of memory cells with adjacent two of said plurality of blocks forming a pair in a row direction;

a plurality of main bit lines each arranged in a corresponding column;

a plurality of sub-bit lines arranged corresponding to said plurality of blocks in each of said columns, and each being connected to memory cells in a corresponding block, said sub-bit lines disposed in the adjacent two of said plurality of blocks in a common column forming a pair, and each pair of said sub-bit lines including first and second sub-bit lines;

a plurality of first gate means provided corresponding to said first main bit lines and each dividing a corresponding first main bit line into two portions;

block select gate means provided in each of said columns for selectively connecting said sub-bit lines to said main bit lines in response to a block select signal, said block select gate means including gate means for connecting at least one of said sub-bit lines on a corresponding column to a first main bit line and connecting at least one of said sub-bit lines to a second main bit line in response to said block select signal;

a plurality of sense amplifiers provided corresponding to each main bit line pair and opposed, with respect to said first gate means, of corresponding main bit lines, for sensing and amplifying signals on the corresponding first and second main bit lines; and second gate means for connecting said first and second main operation of said sense amplifiers, each said first gate means being turned off to divide each of said first main bit lines into two portions during operation of selecting a word line, while maintaining said second main bit line as a single continuous line.

4. The semiconductor memory device according to claim 3, wherein said first gate means is disposed at a position equally dividing said first main bit line into two portions.

5. The semiconductor memory device according to claim 3, further comprising a plurality of third gate means each provided at a corresponding second main bit line for dividing the corresponding second main bit line into two portions and switching said sense amplifiers to be connected to said second sub-bit lines during equalization of potentials of said first and second main bit lines.

6. A semiconductor memory device, comprising:

a plurality of memory cells arranged in a matrix of rows and columns, said matrix being divided into a plurality of blocks of rows of memory cells;

a plurality of main bit lines each arranged in a corresponding column;

a plurality of sub-bit lines arranged corresponding to said plurality of blocks of rows of memory cells in each of said columns, and each being connected to memory cells on a corresponding column;

block select gate means provided in each of said columns for selectively connecting said sub-bit lines to said main bit lines in response to a block select signal, said block select gate means including gate means for connecting at least one of said sub-bit lines on a corresponding column to a first main bit line and connecting at least one of said sub-bit lines to a second main bit line in response to said block select signal;

a plurality of sense amplifiers provided corresponding to each main bit line pair for sensing and amplifying signals on corresponding first and second main bit lines of a corresponding main bit line pair; and gate means for isolating both of said first and second main bit lines from the corresponding sense amplifiers during sensing operation by said sense amplifiers, after a row of memory cells in said matrix is selected.

7. A semiconductor memory device comprising:

a plurality of memory cells arranged in a matrix of rows and columns, said matrix being divided into a plurality of blocks of memory cell rows;

a plurality of main bit lines each arranged in a corresponding column;

a plurality of sub-bit lines arranged corresponding to said plurality of blocks in each of said columns and each being connected to memory cells in a corresponding block; and a plurality of gate means provided at respective sub-bit lines and responsive to a block select signal for connecting said respective sub-bit lines to corresponding main bit lines, wherein a manner of connecting the sub-bit lines to the corresponding main bit lines in one column is different from the manner of connecting the sub-bit lines to the corresponding main bit lines in at least an adjacent column.

8. The semiconductor memory device according to claim 7, wherein said plurality of gate means are disposed at remote ends of corresponding sub-bit lines in a common block.

9. The semiconductor memory device according to claim 7, wherein each said gate means includes a gate for connecting one sub-bit line in a respective block to a main bit line in an adjacent column.

10. The semiconductor memory device according to claim 7, wherein each of said sub-bit lines connects memory cells on every row.

11. The semiconductor memory device according to claim 7, wherein each of said sub-bit lines connects memory cells on alternate rows.

12. The semiconductor memory device according to claim 7, wherein said plurality of gate means are arranged such that gate means in a common block are located at remote ends of sub-bit lines in the common block and gate means in adjacent blocks of columns are located adjacent each other in alternate adjacent blocks.

13. The semiconductor memory device according to claim 7, wherein said plurality of main bit lines comprises a plurality of main bit line pairs.

14. The semiconductor memory device according to claim 13, wherein at least one of said plurality of main bit line pairs includes a crossing.

15. The semiconductor memory device according to claim 14, wherein said crossing is provided near a region where a gate means is provided.

16. The semiconductor memory device according to claim 14, wherein said crossing includes a first interconnection layer of the same level as the main bit lines for connecting one of the main bit lines of the pair, and a second interconnection layer of the same level as the sub-bit lines for connecting another main bit line of the pair.

17. The semiconductor memory device according to claim 13, wherein a pair of main bit lines includes a first main bit line and a second main bit line, and a pair of sub-bit lines includes a first sub-bit line and a second sub-bit line, and wherein said plurality of gate means includes a first gate having a one conduction node connected to said first sub-bit line, another conduction node connected to said second main bit line through an interconnection layer of a common level of said plurality of main bit lines, and a control gate receiving said block select signal, and a second gate having one conduction node connected to said second sub-bit line, another conduction node connected to said first main bit line through an interconnection layer of a common level as said plurality of sub-bit lines and a control gate receiving the block select signal.

18. The semiconductor memory device according to claim 17, wherein adjacent two main bit lines forms a pair, and said sense amplifier means are provided at opposite sides of each pair of the main bit lines.

19. A semiconductor memory device comprising:
a plurality of memory cells arranged in a matrix of rows and columns, said matrix being divided into a plurality of blocks of memory cell rows;
a plurality of main bit lines each arranged in a corresponding column;
a plurality of sub-bit lines arranged corresponding to said plurality of blocks in each of said columns and each being connected to memory cells in a corresponding column block; and
a plurality of gate means provided at respective sub-bit lines and responsive to a block select signal for connecting said respective sub-bit lines to said main bit lines, wherein an order of sub-line arrangement is different from an order of main bit line pair arrangement.

20. The semiconductor memory device according to claim 19, wherein said plurality of main bit lines comprises a plurality of main bit line pairs.

21. A semiconductor memory device comprising:
a plurality of memory cells arranged in a matrix of rows and columns, said matrix being divided into a plurality of blocks of memory cell rows;
a plurality of main bit lines each arranged in a corresponding column;
a plurality of sub-bit lines arranged corresponding to said plurality of blocks in each of said columns and each being connected to memory cells in a corresponding block; and
a plurality of gate means provided at respective sub-bit lines and responsive to a block select signal for connecting said respective sub-bit lines to corresponding main bit lines, wherein in each block there are at least two different manners of connecting the sub-bit lines to the corresponding main bit lines.

22. A semiconductor memory device comprising:
a plurality of memory cells arranged in a matrix of rows and columns, said matrix being divided into a plurality of blocks of memory cell rows;
a plurality of main bit lines each arranged in a corresponding column;
a plurality of sub-bit lines arranged corresponding to said plurality of blocks in each of said columns and each being connected to memory cells in a corresponding block;
a main block select signal transmission bus disposed along a direction of said row;
a plurality of sub block select signal transmission buses disposed parallel to said main bit lines for transmitting a block select signal received on said main block select signal transmission bus; and
a plurality of block select means provided corresponding to the respective sub-bit lines for connecting the corresponding sub-bit lines to corresponding main bit lines in response to said block select signal on the corresponding sub block select signal transmission buses.

23. The semiconductor memory device according to claim 22, wherein said main block select signal transmission bus is provided outside an area where said plurality of memory cells are arranged.

24. The semiconductor memory device according to claim 22, wherein a group of sub block select signal transmission buses for selecting each of said blocks is disposed between adjacent pairs of main bit lines, where adjacent two main bit lines form a pair.

25. The semiconductor memory device according to claim 24, wherein said group of sub block select signal transmission buses is shared between the columns corresponding to said adjacent pairs of main bit lines.

26. The semiconductor memory device according to claim 22, wherein plurality of word lines are further provided corresponding to said rows, and each of said plurality of word lines has word line shunt regions where no memory cell is provided, and wherein said plurality of sub block select signal transmission buses are provided in said word line shut regions.

27. The semiconductor memory device according to claim 22, wherein adjacent two main bit lines form a pair, and wherein a group of sub block select signal transmission buses for selecting a predetermined number of blocks is disposed between adjacent pairs of main bit lines.

28. The semiconductor memory device according to claim 27, wherein said group of sub block select signal transmission buses selects a half of said blocks of columns.

29. A semiconductor memory device comprising:
a plurality of memory cells arranged in a matrix of rows and columns, said matrix being divided into a plurality of blocks of memory cell rows;
a plurality of main bit lines each arranged in a corresponding column;
a plurality of sub-bit lines arranged corresponding to said plurality of blocks in each of said columns and each being connected to memory cells in a corresponding block;
a plurality of block select signal transmission buses disposed between and parallel to adjacent main bit lines for transmitting a block select signal; and
a plurality of block select means provided corresponding to the respective sub-bit lines for connecting the corresponding sub-bit lines to corresponding main bit lines in response to said block select signal on the corresponding block select signal transmission buses.

30. A semiconductor memory device comprising:
a plurality of memory cells arranged in a matrix of rows and columns, said matrix being divided into a plurality of blocks of memory cell rows;
a plurality of main bit lines each arranged in a corresponding column;
a plurality of sub-bit lines arranged corresponding to said plurality of blocks in each of said columns and each being connected to memory cells in a corresponding block, a sub-bit line arranged at ends of a corresponding column being shorter than other sub-bit lines in the corresponding column;
a plurality of gates provided corresponding to respective sub-bit lines for connecting corresponding sub-bit lines to corresponding main bit lines in response to a block select signal; and sense amplifier means provided corresponding to said plurality of main bit lines for sensing and amplifying signals on the corresponding main bit lines.

31. A semiconductor memory device comprising:

a plurality of memory cells arranged in a matrix of rows and columns, said matrix being divided into a plurality of blocks of memory cells;

a plurality of main bit lines each arranged in a corresponding column;

a plurality of sub-bit lines arranged corresponding to said plurality of blocks in each of said columns, and each being connected to memory cells in a corresponding block, column select signal generating means having a plurality of output nodes and provided commonly to said plurality of memory array blocks for generating a column select signal designating at least one of said columns in accordance with an address signal;

a plurality of column select signal transmission lines, each provided corresponding to a respective output node of said column select signal generating means and extending throughout said plurality of memory array blocks for transmitting a column select signal from the corresponding output node of said column select signal generating means; and column selecting means provided in each of said plurality of memory array blocks for selecting and connecting said main bit line corresponding to the designated column to an internal data line in response to said column select signal.

32. The semiconductor memory device according to claim 31, further comprising a block select signal transmission bus provided outside said plurality of blocks in a row extending direction and transmitting a block select signal for designating a block of columns, and a plurality of block select signal transmission sub lines in parallel with said plurality of columns select signal transmission lines.

* * * * *